United States Patent [19]
Mukai et al.

[11] Patent Number: 6,084,274
[45] Date of Patent: Jul. 4, 2000

[54] SEMICONDUCTOR MEMORY CELL AND ITS FABRICATION PROCESS

[75] Inventors: Mikio Mukai; Yutaka Hayashi; Yasutoshi Komatsu, all of Kanagawa, Japan

[73] Assignee: Sony Corporation, Japan

[21] Appl. No.: 08/936,761

[22] Filed: Sep. 24, 1997

[30] Foreign Application Priority Data

Sep. 27, 1996 [JP] Japan ................................. 8-277043

[51] Int. Cl.$^7$ ............................ H01L 29/76; H01L 29/94
[52] U.S. Cl. ..................... 257/390; 257/133; 257/134; 257/256; 257/272; 257/287
[58] Field of Search ................................. 257/133, 134, 257/256, 272, 287, 390

[56] References Cited

U.S. PATENT DOCUMENTS 3,934,159  1/1976  Nomiya et al. ........................ 307/304

*Primary Examiner*—Valencia Martin-Wallace
*Attorney, Agent, or Firm*—Rader, Fishman & Grauer; Ronald P. Kananen

[57] ABSTRACT

A semiconductor memory cell includes a read-out transistor of a first conductivity type which has source/drain regions constituted by a second conductive region and a third semiconducting region, a channel forming region constituted by a surface region of a second semiconducting region, and a conductive gate formed on a barrier layer; a switching transistor of a second conductivity type which has source/drain regions constituted by a first conductive region and the second semiconducting region, a channel forming region constituted by a surface region of a first semiconducting region, and a conductive gate formed on a barrier layer; and a current controlling junction-field-effect transistor of a first conductivity type which has gate regions constituted by a third conductive region and a portion of the second semiconducting region, a channel region constituted by a portion of the third semiconducting region, and one source/drain region extended from one end of the channel region, being constituted by a portion of the third semiconducting region, and another source/drain region extended from the other end of the channel region, being constituted by a portion of the third semiconducting region.

12 Claims, 36 Drawing Sheets

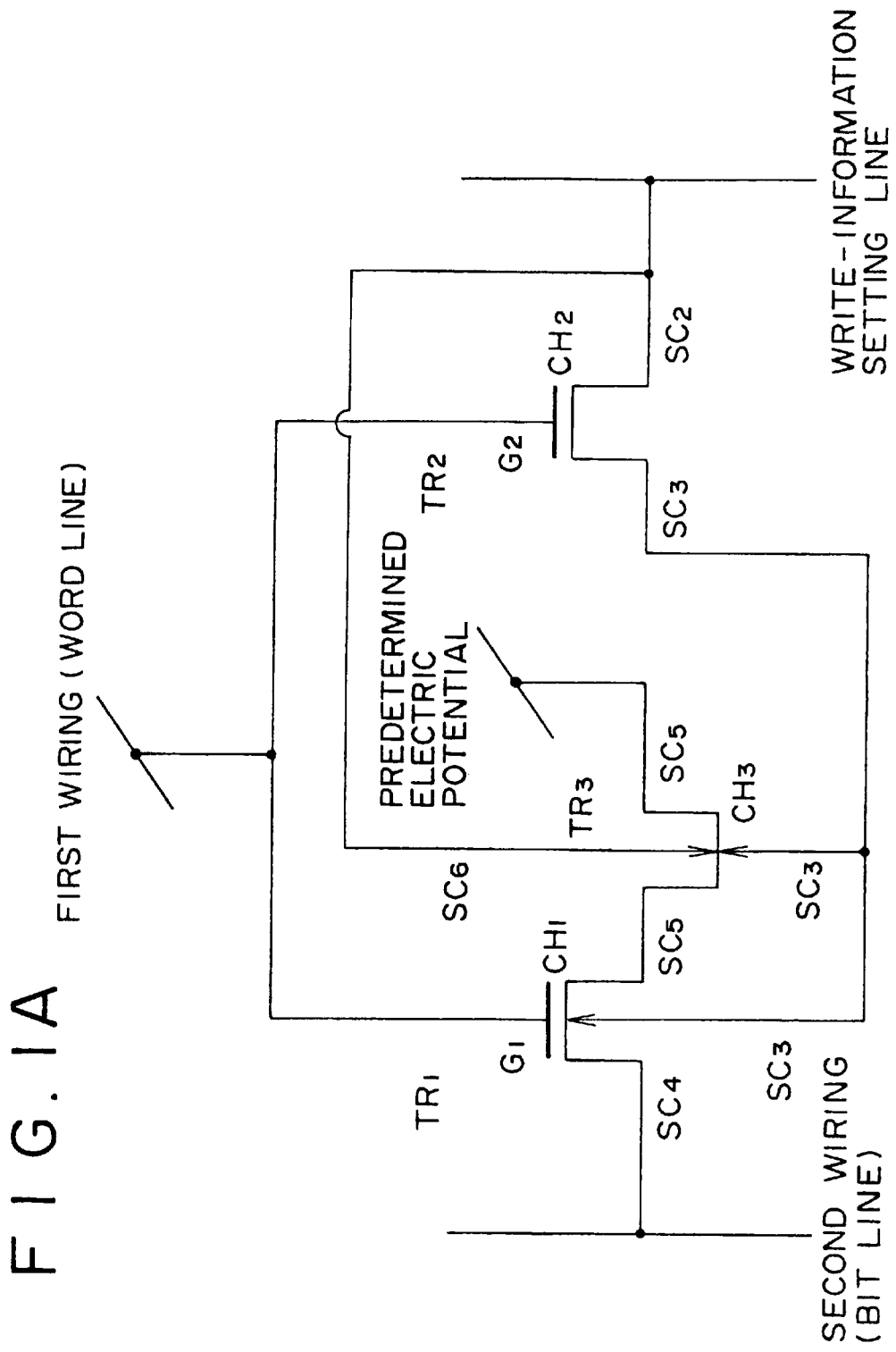

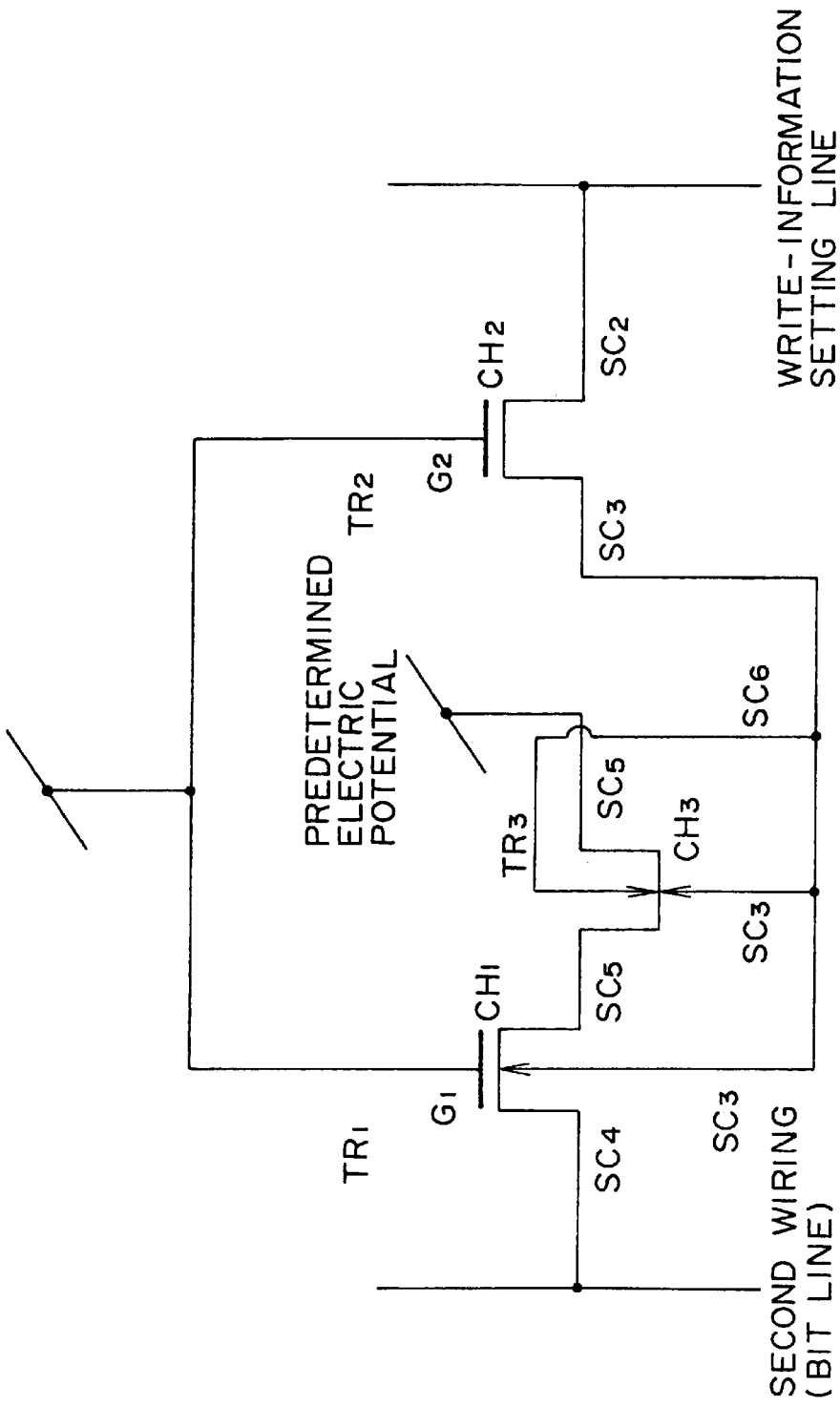

▨ SECOND WIRING (BIT LINE)

◺ WRITE-INFORMATION SETTING LINE

▧ G (WORD LINE)

INSULATING LAYER

F I G. 20
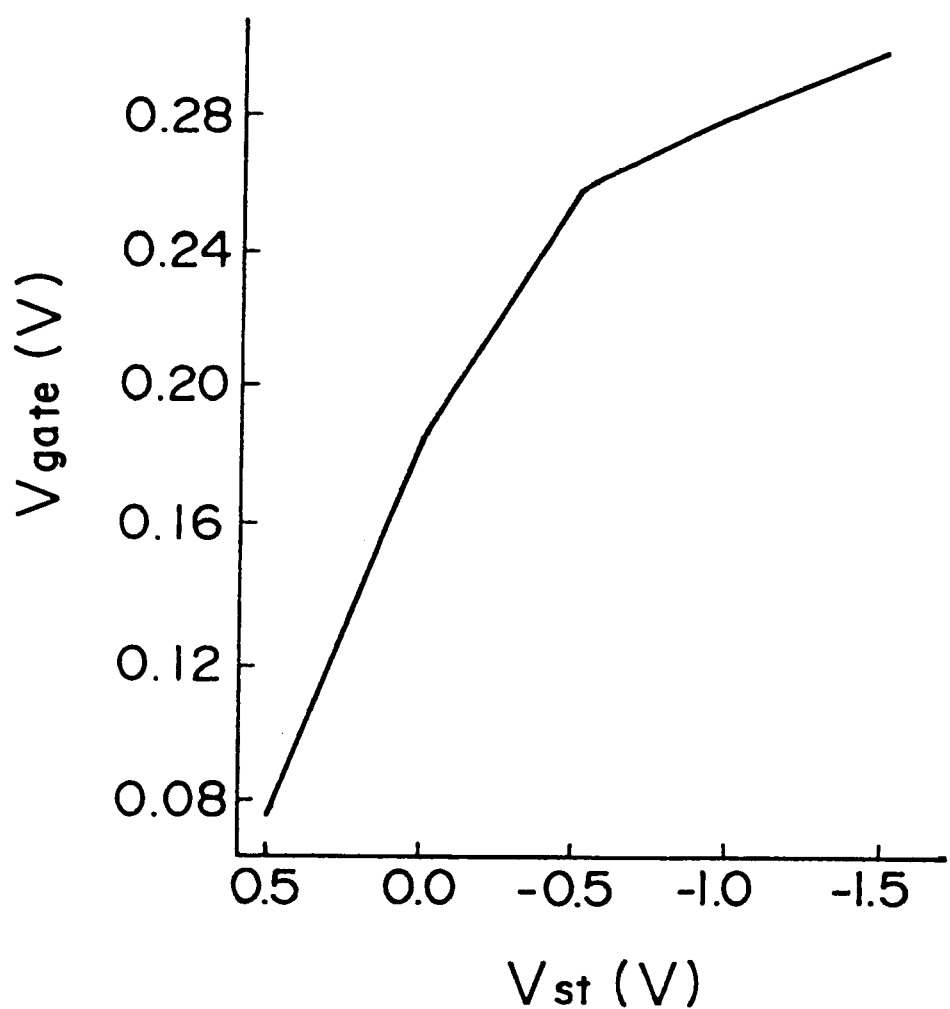

F I G. 21
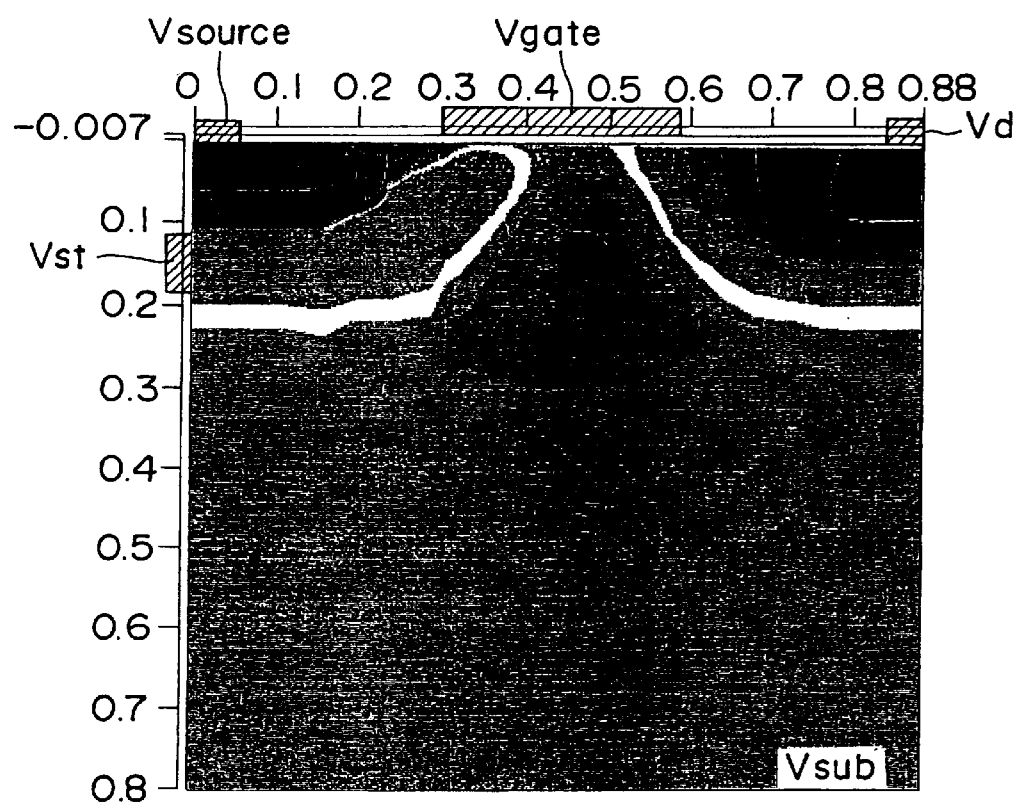

INFORMATION RETENTION TIME (SECONDS)

INFORMATION RETENTION TIME (SECONDS)

6,084,274

SEMICONDUCTOR MEMORY CELL AND ITS FABRICATION PROCESS

BACKGROUND OF THE INVENTION

The present invention relates to a semiconductor memory cell including multiple (more than two) transistors or multiple transistors physically merged into one unit, and to a process for fabricating the cell.

As a high density semiconductor memory cell, there has been made available a dynamic semiconductor memory cell known as a single-transistor semiconductor memory cell including one transistor and one capacitor like the one shown in FIG. 32. In such a semiconductor memory cell, the capacitance of the capacitor must be large enough so that electric charge stored in the capacitor is capable of generating a sufficiently large change in voltage on the bit line. As the planar dimensions of the semiconductor memory cell are reduced, however, the size of the capacitor created as parallel planar shapes must also be decreased. As a result, there is raised a problem that, when information stored in the semiconductor memory cell as electric charge stored in the capacitor thereof is read out, the read out information is buried in noise. There is also raised a serious problem that only a small change in voltage is generated on the bit line because the stray capacitance of the bit line increases each time a new generation of the semiconductor memory cell is introduced. As a means for solving the problems, there have been proposed a dynamic semiconductor memory cell having a trench capacitor cell structure like the one shown in FIG. 33 or a stacked capacitor cell structure. However, there are fabricating-technological limits on the depth of the trench (or the groove) and the height of the stack, giving rise to factors limiting the capacitance of the capacitor of the semiconductor memory cell. For this reason, a dynamic semiconductor memory cell having such structures has reached the limit of a range of dimensions under the low sub-micron rule, without introducing high cost new materials for the capacitor.

As for the transistor employed in the semiconductor memory cell, in the planar dimensions under the low sub-micron rule, there are encountered problems such as deterioration of the voltage withstanding characteristic and a punch-through problem. It is thus much feared that a current leak is generated even if the voltage is still within a prescribed range. As a result, when a semiconductor memory cell is made infinitesimal in size, it is difficult to have a semiconductor memory cell having the related art transistor structure normally operate.

In order to solve the limit problems described above, the applicant of the patent application of the present invention has proposed a semiconductor memory cell including two transistors or two transistors physically merged into one unit as is disclosed in Japanese Patent Application No. Hei 5-246264 (Japanese Patent Laid-open No. Hei 7-99251). The semiconductor memory cell shown in FIGS. 15A and 15B of Japanese Patent Laid-open No. Hei 7-99251 includes a first semiconducting region $SC_1$ of a first conductivity type in a surface region of a semiconductor substrate or on an insulating substrate, a first conductive region $SC_2$ formed in a surface region of the first semiconducting region $SC_1$ in contact with the first semiconducting region $SC_1$ to form a rectifying junction in conjunction with the first semiconducting region $SC_1$, a second semiconducting region $SC_3$ of a second conductivity type formed in a surface region of the first semiconducting region $SC_1$ separated away from the first conductive region $SC_2$, a second conductive region $SC_4$ formed in a surface region of the second semiconducting region $SC_3$ in contact with the second semiconducting region $SC_3$ to form a rectifying junction in conjunction with the second semiconducting region $SC_3$ and a conductive gate G provided on a barrier layer. The conductive gate G serves as bridges between the first semiconducting region $SC_1$ and the second conductive region $SC_4$ as well as between the first conductive region $SC_2$ and the second semiconducting region $SC_3$. The conductive gate G is connected to a first wiring for selecting a semiconductor memory cell and the first conductive region $SC_2$ is connected to a write-information setting line. The second conductive region $SC_4$ is connected to a second wiring for selecting a semiconductor memory cell.

The first semiconducting region $SC_1$ serving as a channel forming region $CH_2$, the first conductive region $SC_2$ serving as a source/drain region, the second semiconducting region $SC_3$ serving as another source/drain region, and the conductive gate G compose a switching transistor $TR_2$. On the other hand, the second semiconducting region $SC_3$ serving as a channel forming region $CH_1$, the first semiconducting region $SC_1$ serving as a source/drain region, the second conductive region $SC_4$ serving as another source/drain region, and the conductive gate G compose an information storing transistor $TR_1$.

In an operation to write information in this semiconductor memory cell, the switching transistor $TR_2$ is put in a turned-on state. As a result, the information is stored in the channel forming region $CH_1$ of the information storing transistor $TR_1$ as an electric potential or as electric charge. In an operation to read out information from the information storing transistor $TR_1$, on the other hand, a threshold value of the information storing transistor $TR_1$ seen from the conductive gate G varies dependently upon the electric potential or electric charge representing information stored on the channel forming region $CH_1$ of the information storing transistor $TR_1$. Thus, in an operation to read out information from the information storing transistor $TR_1$, by applying an appropriately selected electric potential to the conductive gate G, the storage state of the information can be judged from the magnitude of a channel current (including a zero magnitude). The information is read out by detecting the operating state of the information storing transistor $TR_1$.

To put it in detail, in an operation to read out information from the information storing transistor $TR_1$, the information storing transistor $TR_1$ is put in a turned-on or turned-off state, depending upon the information stored therein. Since the second conductive region $SC_4$ is connected to the second wiring as described above, a current may or may not flow to the information storing transistor $TR_1$, depending on whether the stored information is "0" or "1". In this way, information stored in the semiconductor memory cell can be read out by utilizing the information storing transistor $TR_1$.

In an operation to read out information from the information storing transistor $TR_1$, however, any control mechanism of the current flowing through the first semiconducting region $SC_1$ sandwiched between the regions $SC_2$ and $SC_3$ is not introduced. Thus, when sensing the information storing transistor $TR_1$ by using the conductive gate G, only a small margin of the current flowing through the first semiconducting region $SC_1$ and the second conductive region $SC_4$ is obtained, giving rise to a problem that the number of cells connected to a bit line is limited.

SUMMARY OF THE INVENTION

It is an object of the present invention to provide a semiconductor memory cell including multiple (more than two) transistors physically merged into one unit typically for ASIC applications wherein: the operations of the transistors are stable; a capacitor having a large capacity like the semiconductor memory cell of the conventional DRAM is not required; operations to read out and write in information can be carried out with a high degree of reliability; and dimensions can be made infinitesimal, and to provide a process of fabricating the semiconductor memory cell compatible with logic process.

To achieve the above object, according to a first aspect of the present invention, there is provided a semiconductor memory cell including a read-out transistor of a first conductivity type, a switching transistor of a second conductivity type, and a current controlling junction-field-effect transistor of the first conductivity type, the semiconductor memory cell including:

(a) a first semiconducting region of a first conductivity type;

(b) a first conductive region (hereinafter, any conductive region including a semiconducting region), formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a second conductive region formed in a surface region of the second semiconducting region in contact with the second semiconducting region to form a rectifying junction in conjunction with the second semiconducting region;

(e) a third semiconducting region formed in a surface region of the second semiconducting region separated away from the second conductive region in contact with the second semiconducting region to form a rectifying junction in conjunction with the second semiconducting region and extended to a surface region of the first semiconducting region; and (f) a third conductive region formed in a surface region of the third semiconducting region in contact with the third semiconducting region to form a rectifying junction in conjunction with the third semiconducting region, wherein:

(A-1) source/drain regions of the read-out transistor are constituted by the second conductive region and the third semiconducting region;

(A-2) a channel forming region of the read-out transistor is constituted by a surface region of the second semiconducting region sandwiched by the second conductive region and the third semiconducting region;

(A-3) a conductive gate of the read-out transistor is formed on a barrier layer provided on the surface region of the second semiconducting region sandwiched by the second conductive region and the third semiconducting region;

(B-1) source/drain regions of the switching transistor are constituted by the first conductive region and the second semiconducting region;

(B-2) a channel forming region of the switching transistor is constituted by a surface region of the first semiconducting region sandwiched by the first conductive region and the second semiconducting region;

(B-3) a conductive gate of the switching transistor is formed on a barrier layer provided on the surface region of the first semiconducting region sandwiched by the first conductive region and the second semiconducting region;

(C-1) gate regions of the current controlling junction-field-effect transistor are constituted by the third conductive region and a portion of the second semiconducting region facing the third conductive region;

(C-2) a channel forming region of the current controlling junction-field-effect transistor is constituted by a portion of the third semiconducting region sandwiched by the third conductive region and the second semiconducting region;

(C-3) one source/drain region of the current controlling junction-field-effect transistor is extended from one end of the channel forming region of the current controlling junction-field-effect transistor, being constituted by a portion of the third semiconducting region composing the source/drain region of the read-out transistor, and another source/drain region of the current controlling junction-field-effect transistor is extended from the other end of the channel forming region of the current controlling junction-field-effect transistor, being constituted by a portion of the third semiconducting region extended to a surface region of the first semiconducting region;

(D) the conductive gate of the read-out transistor and the conductive gate of the switching transistor are connected to a first wiring for selecting semiconductor memory cells;

(E) the first conductive region and the third conductive region are connected to a write-information setting line;

(F) the second conductive region is connected to a second wiring for selecting semiconductor memory cells; and (G) the other source/drain region of the current controlling junction-field-effect transistor is connected to a predetermined electric potential.

To achieve the above object, according to a second aspect of the present invention, there is provided a semiconductor memory cell including a read-out transistor of a first conductivity type, a switching transistor of a second conductivity type, and a current controlling junction-field-effect transistor of the first conductivity type, the semiconductor memory cell including:

(a) a first semiconducting region of a first conductivity type;

(b) a first conductive region formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a second conductive region formed in a surface region of the second semiconducting region in contact with the second semiconducting region to form a rectifying junction in conjunction with the second semiconducting region;

(e) a third semiconducting region of a first conductivity type formed in a surface region of the second semiconducting region separated away from the second conductive region in contact with the second semiconducting region to form a rectifying junction in conjunction with the second semiconducting region and extended to a surface region of the first semiconducting region; and (f) a third conductive region formed in a surface region of the third semiconducting region in contact with the third semiconducting region to form a rectifying junction in conjunction with the third semiconducting region, wherein:
- (A-1) source/drain regions of the read-out transistor are constituted by the second conductive region and the third semiconducting region;
- (A-2) a channel forming region of the read-out transistor is constituted by a surface region of the second semiconducting region sandwiched by the second conductive region and the third semiconducting region;
- (A-3) a conductive gate of the read-out transistor is formed on a barrier layer provided on the surface region of the second semiconducting region sandwiched by the second conductive region and the third semiconducting region;
- (B-1) source/drain regions of the switching transistor are constituted by the first conductive region and the second semiconducting region;
- (B-2) a channel forming region of the switching transistor is constituted by a surface region of the first semiconducting region sandwiched by the first conductive region and the second semiconducting region;
- (B-3) a conductive gate of the switching transistor is formed on a barrier layer provided on the surface region of the first semiconducting region sandwiched by the first conductive region and the second semiconducting region;
- (C-1) gate regions of the current controlling junction-field-effect transistor are constituted by the third conductive region and a portion of the second semiconducting region facing the third conductive region;
- (C-2) a channel region of the current controlling junction-field-effect transistor is constituted by a portion of the third semiconducting region sandwiched by the third conductive region and the second semiconducting region;
- (C-3) one source/drain region of the current controlling junction-field-effect transistor is extended from one end of the channel region of the current controlling junction-field-effect transistor, being constituted by a portion of the third semiconducting region composing the source/drain region of the read-out transistor, and another source/drain region of the current controlling junction-field-effect transistor is extended from the other end of the channel region of the current controlling junction-field-effect transistor, being constituted by a portion of the third semiconducting region extended to a surface region of the first semiconducting region;
- (D) the conductive gate of the read-out transistor and the conductive gate of the switching transistor are connected to a first wiring for selecting semiconductor memory cells;
- (E) the first conductive region is connected to a write-information setting line;
- (F) the third conductive region is connected or contacted to the second semiconducting region;
- (G) the second conductive region is connected a second wiring for selecting semiconductor memory cells; and
- (H) the other source/drain region of the current controlling junction-field-effect transistor is connected to a predetermined electric potential.

To achieve the above object, according to a third aspect of the present invention, there is provided a semiconductor memory cell including a read-out transistor of a first conductivity type, a switching transistor of a second conductivity type, and a current controlling junction-field-effect transistor of the first conductivity type, the semiconductor memory cell including:

(a) a first semiconducting region of a first conductivity type;

(b) a first conductive region formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a third semiconducting region of a first conductivity type formed in a surface region of the second semiconducting region separated away from the first conductive region in contact with the second semiconducting region to form a rectifying junction in conjunction with the second semiconducting region;

(e) a third conductive region formed in a surface region of the third semiconducting region in contact with the third semiconducting region to form a rectifying junction in conjunction with the third semiconducting region, and extended to a surface region of the second semiconducting region; and (f) a conductive gate shared by the first read-out transistor of the first conductivity type and the switching transistor of the second conductivity type and provided on a barrier layer, the conductive gate serving as bridges between the first semiconducting region and the third semiconducting region as well as between the first conductive region and the second semiconducting region, wherein:
- (A-1) source/drain regions of the read-out transistor are constituted by the third semiconducting region and a surface region of the first semiconducting region sandwiched by the first conductive region and the second semiconducting region;
- (A-2) a channel forming region of the read-out transistor is constituted by a surface region of the second semiconducting region sandwiched by the third semiconducting region and the surface region of the first semiconducting region which is sandwiched by the first conductive region and the second semiconducting region;
- (B-1) source/drain regions of the switching transistor are constituted by the first conductive region and the second semiconducting region;
- (B-2) a channel forming region of the switching transistor is constituted by the surface region of the first semiconducting region sandwiched by the first conductive region and the second semiconducting region and used as one of the source/drain regions of the read-out transistor;
- (C-1) gate regions of the current controlling junction-field-effect transistor are constituted by the third conductive region and a portion of the second semiconducting region facing the third conductive region;

(C-2) a channel region of the current controlling junction-field-effect transistor is constituted by a portion of the third semiconducting region sandwiched by the third conductive region and the second semiconducting region;

(C-3) one source/drain region of the current controlling junction-field-effect transistor is extended from one end of the channel region of the current controlling junction-field-effect transistor, being constituted by a portion of the third semiconducting region composing the source/drain region of the read-out transistor, and another source/drain region of the current controlling junction-field-effect transistor is extended from the other end of the channel region of the current controlling junction-field-effect transistor;

(D) the conductive gate of the read-out transistor and the conductive gate of the switching transistor are connected to a first wiring for selecting semiconductor memory cells;

(E) the first conductive region is connected to a write-information setting line; and (F) the other source/drain region of the current controlling junction-field-effect transistor is connected to a second wiring.

To achieve the above object, according to a fourth aspect of the present invention, there is provided a semiconductor memory cell including a read-out transistor of a first conductivity type, a switching transistor of a second conductivity type, and a current controlling junction-field-effect transistor of the first conductivity type, the semiconductor memory cell including:

(a) a first semiconducting region of a first conductivity type;

(b) a first conductive region formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a third semiconducting region of a first conductivity type formed in a surface region of the second semiconducting region separated away from the first conductive region in contact with the second semiconducting region to form a rectifying junction in conjunction with the second semiconducting region;

(e) a third conductive region formed in a surface region of the third semiconducting region in contact with the third semiconducting region to form a rectifying junction in conjunction with the third semiconducting region; and (f) a conductive gate shared by the first read-out transistor of the first conductivity type and the switching transistor of the second conductivity type and provided on a barrier layer, the conductive gate serving as bridges between the first semiconducting region and the third semiconducting region as well as between the first conductive region and the second semiconducting region, the conductive gate further extending over a part of the third semiconducting region on said barrier layer and bridging between the second semiconducting region and the third conductive region, wherein:

(A-1) source/drain regions of the read-out transistor are constituted by the third semiconducting region and a surface region of the first semiconducting region sandwiched by the first conductive region and the second semiconducting region;

(A-2) a channel forming region of the read-out transistor is constituted by a surface region of the second semiconducting region sandwiched by the third semiconducting region and the surface region of the first semiconducting region which is sandwiched by the first conductive region and the second semiconducting region;

(B-1) source/drain regions of the switching transistor are constituted by the first conductive region and the second semiconducting region;

(B-2) a channel forming region of the switching transistor is constituted by the surface region of the first semiconducting region sandwiched by the first conductive region and the second semiconducting region and used as one of the source/drain regions of the read-out transistor;

(C-1) gate regions of the current controlling junction-field-effect transistor are constituted by the third conductive region and a portion of the second semiconducting region facing the third conductive region;

(C-2) a channel region of the current controlling junction-field-effect transistor is constituted by a portion of the third semiconducting region sandwiched by the third conductive region and the second semiconducting region;

(C-3) one source/drain region of the current controlling junction-field-effect transistor is extended from one end of the channel region of the current controlling junction-field-effect transistor, being constituted by a portion of the third semiconducting region composing the source/drain region of the read-out transistor, and another source/drain region of the current controlling junction-field-effect transistor is extended from the other end of the channel region of the current controlling junction-field-effect transistor;

(D) the conductive gate of the read-out transistor and the conductive gate of the switching transistor are connected to a first wiring for selecting semiconductor memory cells;

(E) the first conductive region is connected to a write-information setting line; and (F) the other source/drain region of the current controlling junction-field-effect transistor is connected to a second wiring.

To achieve the above object, according to a fifth aspect of the present invention, there is provided a semiconductor memory cell including a read-out transistor of a first conductivity type, a switching transistor of a second conductivity type and a current controlling junction-field-effect transistor of a first conductivity type, the semiconductor memory cell including:

(a) a first semiconducting region of a first conductivity type;

(b) a first conductive region formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a second conductive region formed in a surface region of the second semiconducting region in contact with the second semiconducting region to form a rectifying junction in conjunction with the second semiconducting region; and (e) a conductive gate shared by the first read-out transistor of the first conductivity type and the switching transistor of the second conductivity type and provided on a barrier layer, the conductive gate serving as bridges between the first semiconducting region and the second conductive region as well as between the first conductive region and the second semiconducting region, wherein:

(A-1) source/drain regions of the read-out transistor are constituted by the second conductive region and a surface region of the first semiconducting region sandwiched by the first conductive region and the second semiconducting region;

(A-2) a channel forming region of the read-out transistor is constituted by a surface region of the second semiconducting region sandwiched by the second conductive region and the surface region of the first semiconducting region which is sandwiched by the first conductive region and the second semiconducting region;

(B-1) source/drain regions of the switching transistor are constituted by the first conductive region and the second semiconducting region;

(B-2) a channel region of the switching transistor is constituted by the surface region of the first semiconducting region sandwiched by the first conductive region and the second semiconducting region and used as one of the source/drain regions of the read-out transistor;

(C-1) gate regions of the current controlling junction-field-effect transistor are constituted by the first conductive region and a portion of the second semiconducting region facing the first conductive region;

(C-2) one source/drain region of the current controlling junction-field-effect transistor is constituted by the surface region of the first semiconducting region sandwiched by the first conductive region and the second semiconducting region and used as one of the source/drain regions of the read-out transistor as well as used as the channel region of the switching transistor;

(C-3) a channel region of the current controlling junction-field-effect transistor is constituted by a portion of the first semiconducting region beneath the source/drain region of the current controlling junction-field-effect transistor sandwiched by the first conductive region and the second semiconducting region;

(C-4) another source/drain region of the current controlling junction-field-effect transistor is constituted by a portion of the first semiconducting region beneath the channel region of the current controlling junction-field-effect transistor sandwiched by the first conductive region and the second semiconducting region;

(D) the conductive gate is connected to a first wiring for selecting semiconductor memory cells;

(E) the first conductive region is connected to a write-information setting line;

(F) the second conductive region is connected to a second wiring for selecting semiconductor memory cells; and (G) the other source/drain region of the current controlling junction-field-effect transistor is connected to a predetermined electric potential.

To achieve the above object, according to a sixth aspect of the present invention, there is provided a semiconductor memory cell described in the fourth aspect of the present invention, wherein (a) the conductive gate is connected to a first wiring for selecting semiconductor memory cells;

(b) the first conductive region is connected to a first predetermined electric potential;

(c) the second conductive region is connected to a second predetermined electric potential; and (d) the other source/drain region of the current controlling junction-field-effect transistor is connected to a second wiring for selecting semiconductor memory cells.

The current controlling junction-field-effect transistor (JFET) can be formed by optimizing:

(1) the distance between the mutually facing gate regions of the current controlling junction-field-effect transistor, that is, the thickness of the channel forming region; and (2) the concentrations of impurities in the mutually facing gate regions and the channel forming region of the current controlling junction-field-effect transistor.

It should be noted that if neither the distance between the mutually facing gate regions of the current controlling junction-field-effect transistors, that is, the thickness of the channel forming region, nor the concentrations of impurities in the mutually facing gate regions and the channel forming region of the current controlling junction-field-effect transistor are optimized, the depletion layer will not be widened, making it impossible to put the current controlling junction-field-effect transistor in a turned-on and turned-off state. These optimization need to be carried out by computer simulation or experiments.

In the case of the semiconductor memory cells according to the first to sixth aspects of the present invention, it is desirable to form a highly doped layer of a first conductivity type beneath the first semiconducting region in order to reduce the resistance. In addition, it is also desirable from the a-ray-countermeasure point of view to create the semiconductor memory cell in a well structure of a first conductivity type or on an insulating substance.

To achieve the above object, according to the present invention, there is provided a process of fabricating a semiconductor memory cell, the semiconductor memory cell, including a read-out transistor of a first conductivity type, a switching transistor of a second conductivity type and a current controlling junction-field-effect transistor of a first conductivity type, includes:

(a) a first semiconducting region of a first conductivity type;

(b) a first conductive region formed in a surface region of the first semiconducting region in contact with the first semiconducting region to form a rectifying junction in conjunction with the first semiconducting region;

(c) a second semiconducting region of a second conductivity type formed in a surface region of the first semiconducting region separated away from the first conductive region;

(d) a second conductive region formed in a surface region of the second semiconducting region in contact with the second semi conducting region to form a rectifying junction in conjunction with the second semiconducting region; and (e) a conductive gate shared by the first read-out transistor of the first conductivity type and the switching transistor of the second conductivity type and provided on a barrier layer, the conductive gate serving as bridges between the first semiconducting region and the second conductive region as well as between the first conductive region and the second semiconducting region, wherein:
- (A-1) source/drain regions of the read-out transistor are constituted by the second conductive region and a surface region of the first semiconducting region sandwiched by the first conductive region and the second semiconducting region;
- (A-2) a channel forming region of the read-out transistor is constituted by a surface region of the second semiconducting region sandwiched by the second conductive region and the surface region of the first semiconducting region which is sandwiched by the first conductive region and the second semiconducting region;
- (B-1) source/drain regions of the switching transistor are constituted by the first conductive region and the second semiconducting region;
- (B-2) a channel forming region of the switching transistor is constituted by the surface region of the first semiconducting region sandwiched by the first conductive region and the second semiconducting region and used as one of the source/drain regions of the read-out transistor;
- (C-1) gate regions of the current controlling junction-field-effect transistor are constituted by the first conductive region and a portion of the second semiconducting region facing the first conductive region;
- (C-2) one source/drain region of the current controlling junction-field-effect transistor is constituted by the surface region of the first semiconducting region sandwiched by the first conductive region and the second semiconducting region and used as one of the source/drain regions of the read-out transistor as well as used as the channel forming region of the switching transistor;
- (C-3) a channel forming region of the current controlling junction-field-effect transistor is constituted by a portion of the first semiconducting region beneath the source/drain region of the current controlling junction-field-effect transistor sandwiched by the first conductive region and the second semiconducting region; and
- (C-4) another source/drain region of the current controlling junction-field-effect transistor is constituted by a portion of the first semiconducting region beneath the channel forming region of the current controlling junction-field-effect transistor sandwiched by the first conductive region and the second semiconducting region, the method including:
- (i) a process of forming the barrier layer on the surface of the first semiconducting region and forming the conductive gate on the barrier layer; and
- (ii) a process of forming the first conductive region, the second semiconducting region and the second conductive region by using an ion-implantation technique in any arbitrary order by optimizing:
  the distance between the mutually facing gate regions of the current controlling junction-field-effect transistor; and
  concentrations of impurities in the mutually facing gate regions and the channel forming region of the current controlling junction-field-effect transistor.

The channel forming region (or the channel region) can be made of a material such as silicon or GaAs by using the known process. The conductive gates can each be made of a material such as a metal, silicide, polysilicon or silicon doped with an impurity or GaAs doped with an impurity at a high concentration by using the known process. The barrier layer can be made of a material such as $SiO_2$, $Si_3N_4$, $Al_2O_3$ or GaAlAs by using the known process. The conductive and semiconducting regions can each be made of silicon or poly-silicon doped with an impurity, silicide, a two-layer structure having a silicide layer and a semiconductor layer, or GaAs doped with an impurity at a high concentration by using the known process.

In the semiconductor memory cell of the present invention, the conductive gates of the read-out transistor and the switching transistor are connected to the first wiring for selecting semiconductor memory cells. Thus, only one first wiring for selecting semiconductor memory cells is sufficient, allowing the region of the chip to be decreased.

In the semiconductor memory cells according to the first to fourth aspects of the present invention, the second semiconducting region which serves as one of the source/drain region of the switching transistor is also used as the channel forming region of the read-out transistor. In an operation to write information, the switching transistor is put in a turned-on state and, as a result, the information is stored as an electric potential or electric charge in the channel forming region of the read-out transistor. In an operation to read out information from the read-out transistor, on the other hand, a threshold value of the read-out transistor seen from the conductive gate thereof varies in dependence upon the electric potential or electric charge representing information stored in the channel forming region of the read-out transistor. Thus, in an operation to read out information from the read-out transistor, by applying an appropriately selected electric potential to the conductive gate, the storage state of the information can be judged from the magnitude of a channel current (including a zero magnitude). The information is read out by detecting the operating state of the read-out transistor.

In the semiconductor memory cell according to the fifth aspect of the present invention, the second semiconducting region serving as one of the source/drain regions of the switching transistor is also used as the channel forming region of the read-out transistor. The first semiconducting region used as the channel forming region of the switching transistor and the one of source/drain regions of the read-out transistor is connected to the second wiring for selecting semiconductor memory cells. By appropriately selecting an electric potential applied to the second wiring for selecting semiconductor memory cells, the threshold value of the read-out transistor seen from the conductive gate thereof in an operation to read information can be varied. As a result, by appropriately selecting an electric potential applied to the first wiring for selecting semiconductor memory cells, the turned-on and turned-off states of the read-out transistor and the switching transistor can be controlled. In an operation to write information, if the electric potential applied to the first wiring is set at a value that is capable of putting the switching transistor in a sufficiently turned-on state, electric charge is stored in a capacitor created between the first semiconducting region and the second semiconducting region of the switching transistor in dependence on the electric potential applied to the second wiring. As a result, the information is stored in the channel forming region of the read-out transistor, that is, the second semiconducting region as a difference in electric potential from the first semiconducting region or electric charge. In an operation to read out information, on the other hand, the electric potential of the first semiconducting region becomes a read electric potential and, in the read-out transistor, the information stored in the channel forming region as an electric potential or electric charge is converted into a difference in electric potential or electric charge between the second semiconducting region serving as the channel forming region and the second conductive region serving as the other source/drain region thereof. The threshold value of the read-out transistor seen from the conductive gate varies in dependence upon the electric charge, that is, the information. Thus, by applying an appropriately selected electric potential to the conductive gate, the turning-on and turning-off operation of the read-out transistor can be controlled. In this way, an operation to read out information is carried out by detecting the operating state of the read-out transistor.

On the top of that, the semiconductor memory cell of the present invention also includes the current controlling field-effect-junction transistor of a first conductivity type in addition to the read-out transistor of a first conductivity type and the switching transistor of a second conductivity type. In an operation to read out information, the turning-on and turning-off operation of the current controlling field-effect-junction transistor is also controlled. Thus, the current controlling field-effect-junction transistor substantially increases the margin of a current flowing through the first semiconducting region and the second conductive region. As a result, the information retention of the semiconductor memory cell can be lengthened.

The semiconductor memory cell of the present invention is used for storing information as a quantity such as an electric potential, a difference in electric potential or electric charge. Without regard to which quantity is used, the quantity attenuates with the lapse of time so that refresh operations are required as is the case with the operation of a DRAM.

In a semiconductor memory cell of the present invention, the operation of a read-out transistor employed therein is determined in dependence upon information stored in a channel forming region of the read-out transistor as an electric potential or electric charge. Information read out as a current of the read-out transistor within a refresh time does not depend on the magnitude of the capacity of a capacitor thereof (such as the capacity of the electrode gate and an additional capacity or the like) even if such additional capacitors are taken into consideration. As a result, the problem of the capacitor capacity encountered in the related art semiconductor memory cell can be solved and it is no longer necessary to provide a capacitor having a large capacity like the semiconductor memory cell of the related art DRAM. In addition, the maximum region of the semiconductor memory cell is equal to the region of only two transistors or even smaller that it.

On the top of that, by turning on and off a current controlling junction-field-effect transistor provided in the semiconductor memory cell in an operation to read out information, an extremely big margin of a current flowing through a first semiconducting region and a second conductive region can be obtained, allowing the information retention time of the semiconductor memory cell to be lengthened.

The processes of fabricating the semiconductor memory cells according to the fourth and fifth aspects of the present invention are compatible with MOS logic processes. As a result, a semiconductor memory cell can be implemented in an region about equal to that of one transistor. In addition, a DRAM function can be embedded in the MOS logic by merely adding nothing but a simple process. On the top of that, a semiconductor memory cell can be implemented in a region about equal to that of one transistor by using the known technology for fabricating a semiconductor memory cell without the need to adopt the SOI technology.

BRIEF DESCRIPTION OF THE DRAWINGS

These and other objects of the invention will be seen by reference to the description, taken in connection with the accompanying drawings, in which:

FIG. 1A is a diagram showing the principle of a first embodiment of a semiconductor memory cell according to the present invention;

FIG. 1B is a diagram showing the principle of a modified embodiment of the first embodiment of the semiconductor memory cell according to the present invention;

FIG. 20 is a diagram showing a curve representing a relation between the electric potential $V_{gate}$ and the electric potential $V_{st}$ to give a read-out current $I_{sub}$ of $1 \times 10^{-5}$ A under a dose-amount condition D3 and the bias condition of the case B1 obtained as a result of the computer simulation;

FIG. 21 is a diagram showing a result of an analysis of an actual cross-sectional structure obtained from the computer simulation;

DETAILED DESCRIPTION OF THE PREFERRED EMBODIMENTS

Hereinafter, preferred embodiments of the present invention will be described with reference to the accompanying drawings.

Embodiment 1

Figure 2A:
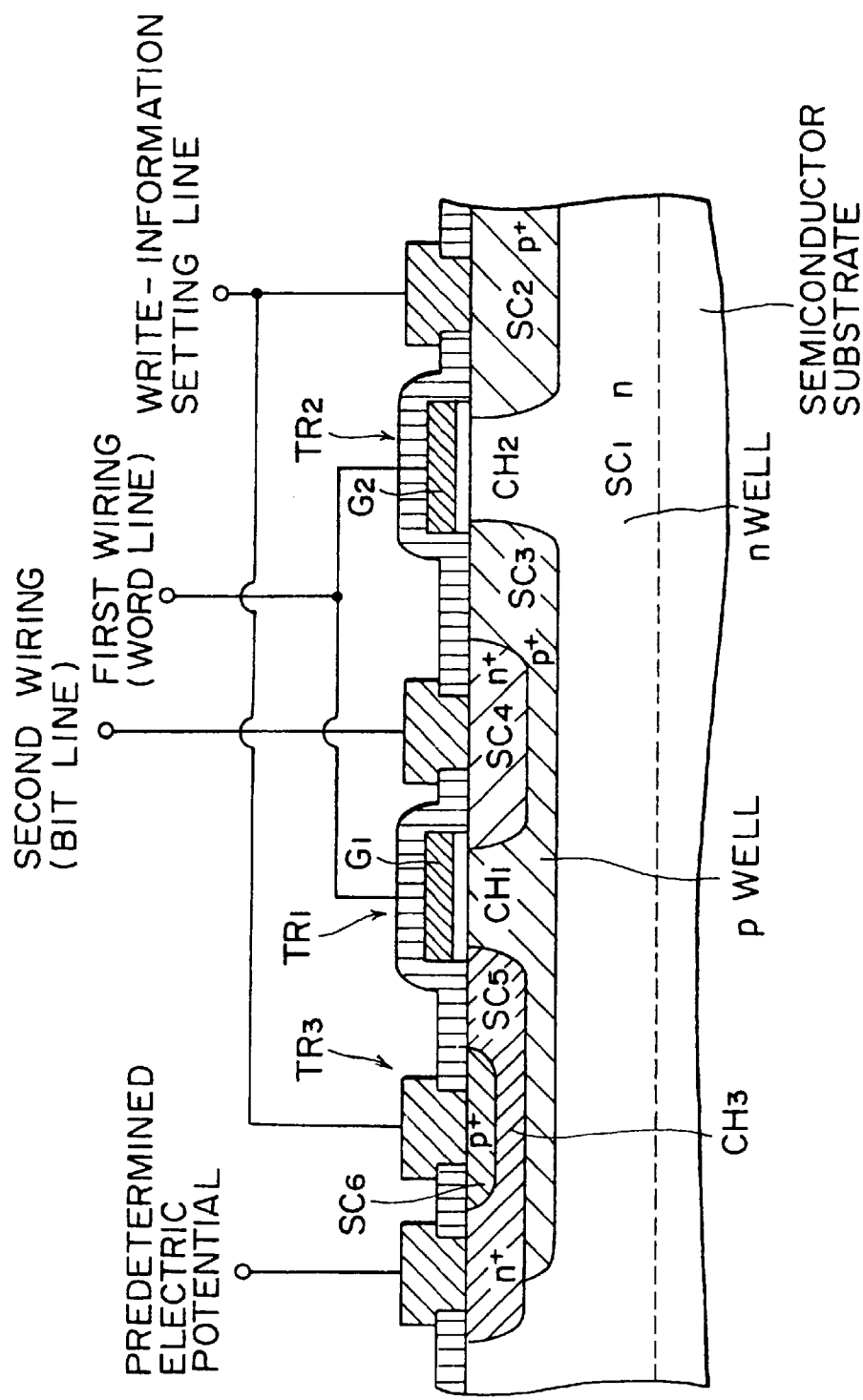
FIG. 2A is a diagram typically showing a partial cross section of the semiconductor memory cell according to the first embodiment of the present invention.

A first embodiment concerns a semiconductor memory cell according to the first aspect of the present invention. FIG. 1A is a diagram showing the principle of the semiconductor memory cell and FIG. 2A is a diagram typically showing a partial cross section of the semiconductor memory cell. As shown in the figures, the semiconductor memory cell of the first embodiment, having a read-out transistor $TR_1$ of a first conductivity type (typically an n-type), a switching transistor $TR_2$ of a second conductivity type (typically a p-type), and a current controlling junction-field-effect transistor $TR_3$ of a first conductivity type (typically the n-type), includes:

(a) a first semiconducting region $SC_1$ of a first conductivity type (typically the n-type);

(b) a first conductive region $SC_2$ formed in a surface region of the first semiconducting region $SC_1$ and made of either a material of a second conductivity type (typically a p$^+$ type) opposite to the first conductivity type or a material such as silicide or a metal in contact with the first semiconducting region $SC_1$ to form a rectifying junction in conjunction with the first semiconducting region $SC_1$;

(c) a second semiconducting region $SC_3$ of a second conductivity type (typically the p$^+$ type) formed in a surface region of the first semiconducting region $SC_1$ separated away from the first conductive region $SC_2$;

(d) a second conductive region $SC_4$ formed in a surface region of the second semiconducting region $SC_3$ and made of either a material of a first conductivity type (typically an n$^+$-type) or a material such as silicide or a metal in contact with the second semiconducting region $SC_3$ to form a rectifying junction in conjunction with the second semiconducting region $SC_3$;

(e) a third semiconducting region $SC_5$ formed in a surface region of the second semiconducting region $SC_3$ separated away from the second conductive region $SC_4$ in contact with the second semiconducting region $SC_3$ to form a rectifying junction in conjunction with the second semiconducting region $SC_3$ and extended to a surface region of the first semiconducting region $SC_1$; and (f) a third conductive region $SC_6$ formed in a surface region of the third semiconducting region $SC_5$ and made of either a material of a second conductivity type (typically the p$^+$-type) or a material such as silicide or a metal in contact with the third semiconducting region $SC_5$ to form a rectifying junction in conjunction with the third semiconducting region $SC_5$.

The read-out transistor $TR_1$ is realized by:
(A-1) source/drain regions constituted by the second conductive region $SC_4$ and the third semiconducting region $SC_5$;
(A-2) a channel forming region $CH_1$ constituted by a surface region of the second semiconducting region $SC_3$ sandwiched by the second conductive region $SC_4$ and the third semiconducting region $SC_5$; and
(A-3) a conductive gate $G_1$ formed on a barrier layer, typically a gate-oxide film, formed on the surface region of the second semiconducting region $SC_3$ sandwiched by the second conductive region $SC_4$ and the third semiconducting region $SC_5$.

On the other hand, the switching transistor $TR_2$ is realized by:
(B-1) source/drain regions constituted by the first conductive region $SC_2$ and the second semiconducting region $SC_3$;
(B-2) a channel forming region $CH_2$ constituted by a surface region of the first semiconducting region $SC_1$ sandwiched by the first conductive region $SC_2$ and the second semiconducting region $SC_3$; and
(B-3) a conductive gate $G_2$ formed on a barrier layer, typically a gate-oxide film, formed on the surface region of the first semiconducting region $SC_1$ sandwiched by the first conductive region $SC_2$ and the second semiconducting region $SC_3$.

Finally, the current controlling junction-field-effect transistor $TR_3$ is realized by:

(C-1) gate regions constituted by the third conductive region $SC_6$ and a portion of the second semiconducting region $SC_3$ facing the third conductive region $SC_6$;

(C-2) a channel forming region $CH_3$ constituted by a portion of the third semiconducting region $SC_5$ sandwiched by the third conductive region $SC_6$ and the second semiconducting region $SC_3$; and (C-3) one source/drain region extended from one end of the channel forming region $CH_3$ of the current controlling junction-field-effect transistor $TR_3$, being constituted by a portion of the third semiconducting region $SC_5$ composing the source/drain region of the read-out transistor $TR_1$, and another source/drain region extended from the other end of the channel forming region $CH_3$ of the current controlling junction-field-effect transistor $TR_3$, being constituted by a portion of the third semiconducting region $SC_5$ extended to a surface region of the first semiconducting region $SC_1$.

It should be noted that the current controlling junction-field-effect transistor $TR_3$ is created by optimizing:

(1) the distance between the mutually facing gate regions, that is, the thickness of the channel forming region $CH_3$ thereof; and (2) the concentrations of impurities on the mutually facing gate regions and the channel forming region $CH_3$ thereof.

The first semiconducting region $SC_1$ is formed in a surface region of a semiconducting substrate, on an insulating layer (an insulator) provided on a semiconducting substrate, in the structure of a well of a first conductivity type (typically an n-type well) provided on a semiconducting substrate, or on an insulating substrate.

The conductive gate $G_1$ of the read-out transistor $TR_1$, also referred to as the first conductive gate $G_1$, and the conductive gate $G_2$ of the switching transistor $TR_2$, also referred to as the second conductive gate $G_2$, are connected to a first wiring (typically a word line) for selecting semiconductor memory cells. The first conductive region $SC_2$ and the third conductive region $SC_6$ are connected to a write-information setting line. The second conductive region $SC_4$ is connected to a second wiring (typically a bit line) for selecting semiconductor memory cells. The other source/drain region of the current controlling junction-field-effect transistor $TR_3$ is connected to a predetermined electric potential.

Since the semiconductor memory cell of the first embodiment can be fabricated by using the known fabrication process for MOS transistors, detailed explanation of the fabrication process thereof is omitted.

Embodiment 2

A second embodiment concerns a semiconductor memory cell according to the second aspect of the present invention. The semiconductor memory cell of the second embodiment is different from that of the first embodiment in that the latter includes functionally and physically three transistors while the former functionally includes three transistors which are physically merged into one transistor area.

Figure 3A:
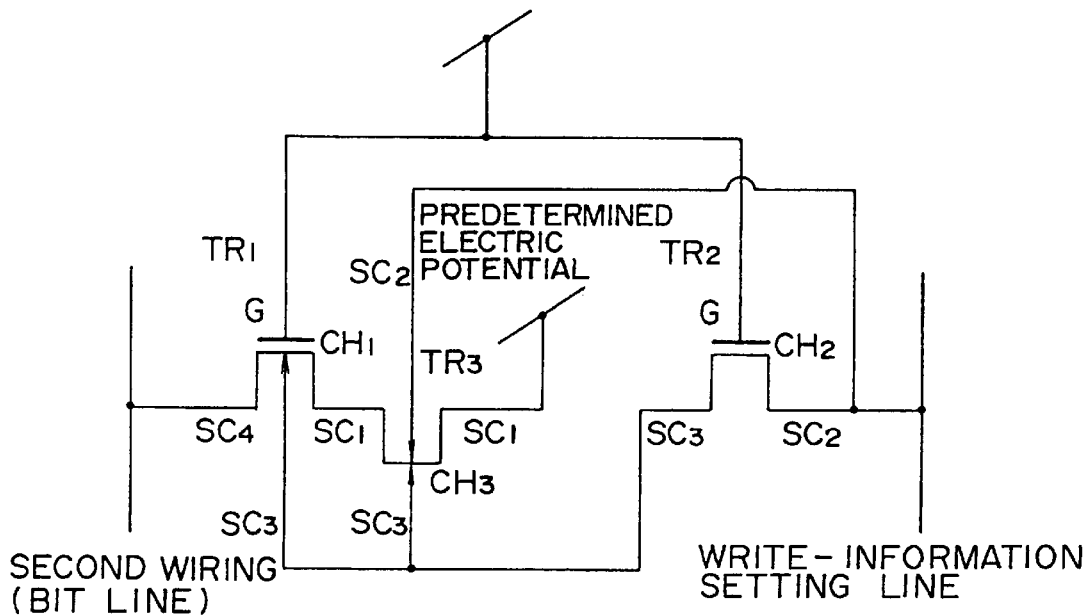
FIG. 3A is a diagram showing the principle of a second embodiment of a semiconductor memory cell according to the present invention.
Figure 3B:
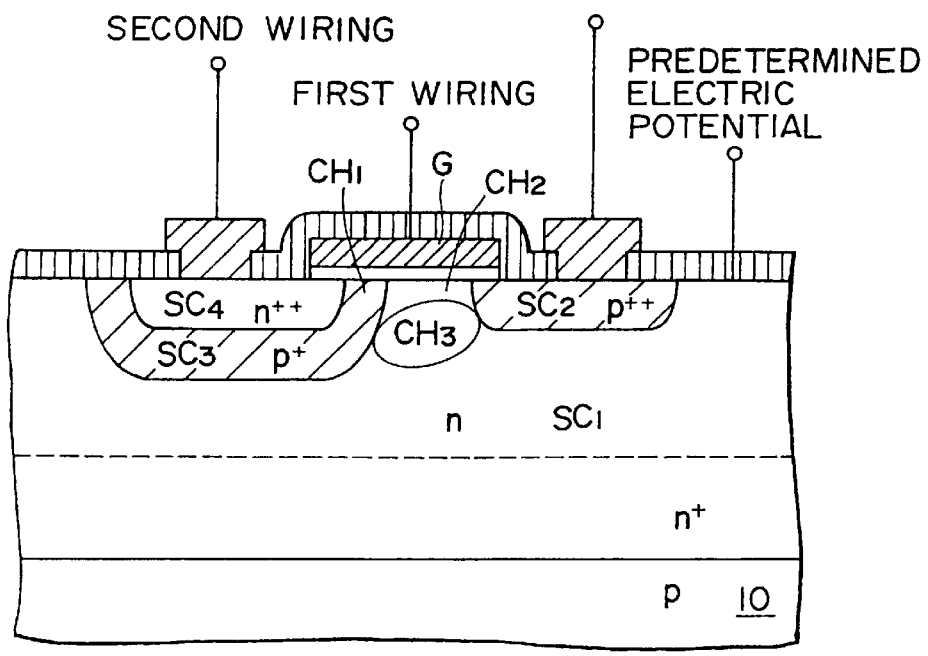
FIG. 3B is a diagram typically showing a partial cross section of the semiconductor memory cell according to the second embodiment of the present invention.

FIG. 3A is a diagram showing the principle of the semiconductor memory cell of the second embodiment and FIG. 3B is a diagram typically showing a partial cross section of the semiconductor memory cell. As shown in the figures, the semiconductor memory cell of the second embodiment, having a read-out transistor $TR_1$ of a first conductivity type (typically an n-type), a switching transistor $TR_2$ of a second conductivity type (typically a p-type), and a current controlling junction-field-effect transistor $TR_3$ of a first conductivity type (typically, the n-type), includes:

(a) a first semiconducting region $SC_1$ of a first conductivity type (typically the n-type);

(b) a first conductive region $SC_2$ formed in a surface region of the first semiconducting region $SC_1$ and made of either a material of a second conductivity type (typically a p-type) opposite to the first conductivity type or a material such as silicide or a metal in contact with the first semiconducting region $SC_1$ to form a rectifying junction in conjunction with the first semiconducting region $SC_1$;

(c) a second semiconducting region $SC_3$ of a second conductivity type (typically a $p^+$-type) formed in a surface region of the first semiconducting region $SC_1$ separated away from the first conductive region $SC_2$;

(d) a second conductive region $SC_4$ formed in a surface region of the second semiconducting region $SC_3$ and made of either a material of a first conductivity type (typically an $n^{++}$-type) or a material such as silicide or a metal in contact with the second semiconducting region $SC_3$ to form a rectifying junction in conjunction with the second semiconducting region $SC_3$; and (e) a conductive gate $G$ shared by the first read-out transistor $TR_1$ of the first conductivity type and the switching transistor $TR_2$ of the second conductivity type and provided on a barrier layer, the conductive gate $G$ serving as bridges between the first semiconducting region $SC_1$ and the second conductive region $SC_4$ as well as between the first conductive region $SC_2$ and the second semiconducting region $SC_3$.

The read-out transistor $TR_1$ is realized by:

(A-1) source/drain regions constituted by the second conductive region $SC_4$ and a surface region of the first semiconducting region $SC_1$ sandwiched by the first conductive region $SC_2$ and the second semiconducting region $SC_3$; and (A-2) a channel forming region $CH_1$ constituted by a surface region of the second semiconducting region $SC_3$ sandwiched by the second conductive region $SC_4$ and the surface region of the first semiconducting region $SC_1$ which is sandwiched by the first conductive region $SC_2$ and the second semiconducting region $SC_3$.

On the other hand, the switching transistor $TR_2$ is realized by:

(B-1) source/drain regions constituted by the first conductive region $SC_2$ and the second semiconducting region $SC_3$;

(B-2) a channel forming region $CH_2$ constituted by the surface region of the first semiconducting region $SC_1$ sandwiched by the first conductive region $SC_2$ and the second semiconducting region $SC_3$ and used as one of the source/drain regions of the read-out transistor $TR_1$.

Finally, the current controlling junction-field-effect transistor $TR_3$ is realized by:

(C-1) gate regions constituted by the first conductive region $SC_2$ and a portion of the second semiconducting region $SC_3$ facing the first conductive region $SC_2$;

(C-2) one source/drain region constituted by the surface region of the first semiconducting region $SC_1$ sandwiched by the first conductive region $SC_2$ and the second semiconducting region $SC_3$ and used as one of the source/drain regions of the read-out transistor $TR_1$ as well as used as the channel forming region $CH_2$ of the switching transistor TR2;

(C-3) a channel forming region $CH_3$ constituted by a portion of the first semiconducting region $SC_1$ beneath the source/drain region (C-2) of the current controlling junction-field-effect transistor $TR_3$ sandwiched by the first conductive region $SC_2$ and the second semiconducting region $SC_3$; and (C-4) another source/drain region constituted by a portion of the first semiconducting region $SC_1$ beneath the channel forming region $CH_3$ of the current controlling junction-field-effect transistor $TR_3$ sandwiched by the first conductive region $SC_2$ and the second semiconducting region $SC_3$.

It should be noted that the current controlling junction-field-effect transistor $TR_3$ is created by optimizing:

(1) the distance between the mutually facing gate regions, that is, the thickness of the channel forming region $CH_3$ thereof; and (2) the concentrations of impurities on the mutually facing gate regions and the channel forming region $CH_3$ thereof.

The first semiconducting region $SC_1$ is formed in a surface region of a semiconducting substrate, on an insulating layer (an insulator) provided on a semiconducting substrate, in the structure of a well of a first conductivity type (typically an n-type well) on a semiconducting substrate, or on an insulating substrate.

The conductive gate G shared by the first read-out transistor $TR_1$ of the first conductivity type and the switching transistor $TR_2$ of the second conductivity type is connected to a first wiring (typically a word line) for selecting semiconductor memory cells. The first conductive region $SC_2$ is connected to a write-information setting line and the second conductive region $SC_4$ is connected a second wiring (typically a bit line) for selecting semiconductor memory cells. The other source/drain region of the current controlling junction-field-effect transistor $TR_3$ is connected to a predetermined electric potential. In actuality, this other source/drain region is connected to a shared well or to the substrate.

Hereinafter, there will be described operations of the semiconductor memory cells of the first and second embodiments. It should be noted that the principle of operation of the semiconductor memory cell of the first embodiment is substantially the same as that of the second embodiment.

In a write operation, the electric potentials at a variety of portions of the semiconductor memory cell are given as follows:

First wiring (typically a word line) for selecting semiconductor memory cells: $V_W$ Write-information setting line:
When writing "0": $V_0$
When writing "1": $V_1$ In a read operation, the electric potentials at a variety of portions of the semiconductor memory cell are given as follows:

First wiring (typically a word line) for selecting semiconductor memory cells: $V_R$ In a read operation, the electric potential of the second wiring (typically a bit line) connected to the second conductive region $SC_4$ for selecting semiconductor memory cells is given as follows:

Second wiring for selecting semiconductor memory cells: $V_2$

It should be noted that a predetermined electric potential including an electric potential of 0 V is applied to the first semiconducting region $SC_1$.

In a read operation, threshold values of the read-out transistor $TR_1$ seen from the conductive gate are given as follows:

When reading out "0": $V_{TH\_10}$
When reading out "1": $V_{TH\_11}$

The electric potential of the channel forming region $CH_1$ in an operation to read out "0" is different from that in an operation to read out "1". Affected by this difference, the threshold value of the read-out transistor $TR_1$ seen from the conductive gate in an operation to read out "0" differs from that in an operation to read out "1". Unlike the conventional DRAM, however, a capacitor with a large capacity required by the conventional DRAM is not used in the semiconductor memory cell provided by the present invention.

A relation among electric potentials in the read-out transistor $TR_1$ is set as follows:

$$|V_{TH\_11}|>|V_R|>|V_{TH\_10}|$$

When the ON/OFF current ratio of the current controlling junction-field-effect transistor $TR_3$ is large enough, then the information can be read out without error even if $|V_R| \geq |V_{TH\_11}|$.

Operation to Write Information

In an operation to write in "0" by setting the electric potential of the write-information setting line at $V_0$ or to write in "1" by setting the electric potential of the write-information setting line set at $V_1$, the electric potential $V_W$ of the first wiring is set at a negative value ($V_W<0$). Thus, the electric potential $V_W$ of the conductive gate $G_2$ of the switching transistor $TR_2$ is also set at a negative value ($V_W<0$) as well. As a result, the switching transistor $TR_2$ is put in a turned-on state. Therefore, the electric potential of the channel forming region $CH_1$ of the read-out transistor $TR_1$ is $V_0$ when information "0" is written in, or $V_1$ when information "1" is written in. It should be noted that, when information "1" is written in, the electric potential of the channel forming region $CH_1$ is $V_W-V_{TH2}$ for $|V_W|<|V_1+V_{TH2}|$.

After the information has been written, the semiconductor memory cell gets in an information retention state before the information is read out. In this state, electric potentials of a variety of portions in the transistors are at such values that the read-out transistor $TR_1$ and the switching transistor $TR_2$ will not get in a conductive state. In order to prevent the read-out transistor $TR_1$ and the switching transistor $TR_2$ from getting in a conductive state, typically, the electric potential of the first wiring is set at 0 and the electric potential of the write-information setting line is set at $V_1$.

In an operation to write information, the electric potential $V_W$ of the conductive gate $G_1$ of the read-out transistor $TR_1$ is also set at a negative value ($V_W<0$). As a result, the read-out transistor $TR_1$ is in a turned-off state. In this state, the electric potential of the channel forming region $CH_1$ of the read-out transistor $TR_1$ is $V_0$ when information "0" is written, or $V_1$ or $V_W-V_{TH2}$ when information "1" is written. In spite of the fact that this state changes with the lapse of time due to leakage currents, this state is nonetheless maintained within an allowable range till an operation to read out the information is carried out. Examples of the leakage currents are a current flowing between the channel forming region $CH_1$ and the first semiconducting region $SC_1$ of the read-out transistor $TR_1$ and an off-state current of the switch transistor $TR_2$. It should be noted that the so-called refresh operation is carried out before the electric potential of the channel forming region $CH_1$ of the read-out transistor $TR_1$ changes with the lapse of time from its original value by a difference which is large enough to cause an error in an operation to read out the information.

Operation to Read Out Information

In an operation to read out information "0" or "1", the electric potential $V_R$ of the first wiring is positive ($V_R > 0$). Thus, the electric potential $V_R$ of the conductive gate $G_2$ of the switching transistor $TR_2$ is also positive ($V_R > 0$). As a result, the switching transistor $TR_2$ is in a turned-off state.

The electric potential $V_R$ of the conductive gate $G_1$ of the read-out transistor $TR_1$ is positive ($V_R > 0$) as well. The threshold value of the read-out transistor $TR_1$ seen from the conductive gate $G_1$ is $V_{TH\_10}$ or $V_{TH\_11}$ for stored information of "0" or "1" respectively. The threshold values of the read-out transistor $TR_1$ depend upon the state of the electric potential of the channel forming region $CH_1$. These electric potential and threshold values satisfy the following relation:

$$|V_{TH\_11}| > |V_R| > |V_{TH\_10}|$$

Thus, when the stored information is "0", the read-out transistor $TR_1$ is in a turned-on state. When the stored information is "1", on the other hand, the read-out transistor $TR_1$ is in a turned-off state.

When the ON/OFF current ratio of the current controlling junction-field-effect transistor TR3 is large enough, then the information can be read out without error even if $|V_R| \geq |V_{TH\_11}|$.

The read-out transistor $TR_1$ is controlled by the current controlling junction-field-effect transistor $TR_3$ based on the bias conditions of the gate regions of the current controlling junction-field-effect transistor $TR_3$ which are constituted by the third conductive region $SC_6$ and a portion of the second semiconducting region $SC_3$ facing the third conductive region $SC_6$ in the case of a semiconductor memory cell of the first embodiment, or implemented by the first conductive region $SC_2$ and a portion of the second semiconducting region $SC_3$ facing the first conductive region $SC_2$ in the case of a semiconductor memory cell of the second embodiment. That is to say, when the stored information is "0", the current controlling junction-field-effect transistor $TR_3$ is put in a turned-on state. When the stored information is "1", on the other hand, the current controlling junction-field-effect transistor $TR_3$ is put in a turned-off state.

In this way, the read-out transistor $TR_1$ can be put in a turned-on state or a turned-off state with a high degree of reliability in dependence upon the stored information. Since the second conductive region $SC_4$ is connected to the second wiring, a current flows or does not flow to the read-out transistor $TR_1$, depending upon whether the stored information is "0" or "1". As a result, the stored information can be read out as an operating state of the read-out transistor $TR_1$.

The operating states of the read-out transistor $TR_1$, the switching transistor $TR_2$ and the current controlling junction-field-effect transistor $TR_3$ described above are summarized in Table 1. It should be noted that the values of electric potentials shown in Table 1 are no more than typical values which can be any values as long as the conditions described above are satisfied.

TABLE 1

Unit : Volt

| Write operation | | Write in "0" | | Write in "1" |
| --- | --- | --- | --- | --- |
| Electric potential of the first wiring | $V_W$ | −3.0 | $V_W$ | −3.0 |
| Electric potential of the write-information setting line | $V_0$ | 0 | $V_1$ | −2.0 |
| Electric potential of the gate | $V_W$ | −3.0 | $V_W$ | −3.0 |
| State of $TR_2$ | | ON | | ON |
| Electric potential of the channel forming region | $V_0$ | 0 | $V_1$ | −2.0 |
| State of $TR_1$ | | OFF | | OFF |
| State of $TR_3$ | | OFF | | OFF |

| Read operation | | Read out "0" | | Read out "1" |
| --- | --- | --- | --- | --- |
| Electric potential of the first wiring | $V_R$ | 1.0 | $V_R$ | 1.0 |
| Electric potential of the gate | $V_R$ | 1.0 | $V_R$ | 1.0 |
| State of $TR_2$ | | OFF | | OFF |
| Electric potential of the channel forming region | $V_0$ | 0 | $V_1$ | −2.0 |
| Threshold voltage of $TR_1$ seen from the gate | $V_{TH1\_0}$ | 0.5 | $V_{TH1\_1}$ | 1.1 |
| State of $TR_1$ | | ON | | OFF |
| Electric potential of the second wiring | | 0.5 | | 0.5 |
| State of TR3 | | ON | | OFF |

A method of fabricating the semiconductor memory cell according to the second embodiment as shown in FIG. 3B will be described with reference to FIGS. 4A and 4B through FIGS. 6A and 6B, diagrams each typically showing a partial cross section of elements including a semiconducting substrate.

Step 10

Figure 4A:
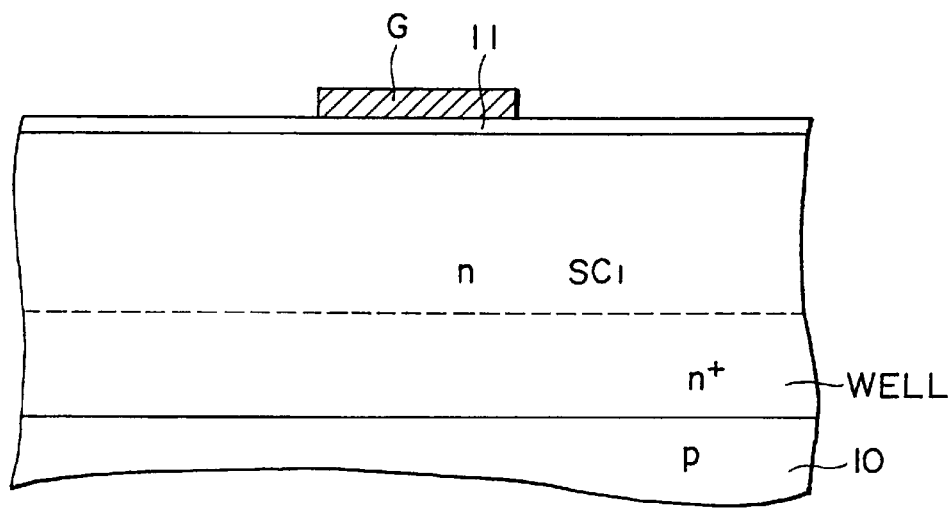
FIGS. 4A and 4B are diagrams each typically showing a partial cross section of a semiconducting substrate or the like used for explaining a process of fabricating the semiconductor memory cell of the second embodiment shown in FIG. 3B.

First of all, by using a generally known process, element isolating regions (not shown in the figure), an n-type well, an n-type first semiconducting region $SC_1$, and a gate-oxide film 11 used as a barrier layer are stacked one after another on a p-type silicon semiconducting substrate 10. Then, a conductive gate G made of typically polycrystalline silicon doped with an impurity or having a polycide structure is formed on the gate-oxide film 11. As a result, a structure shown in FIG. 4A is obtained. It should be noted that the concentration of an impurity doped in the n-type first semiconducting region $SC_1$ is $1.0 \times 10^{17}/cm^3$ and the length of the conductive gate is 0.28 micrometers.

Step 20

Figure 4B:
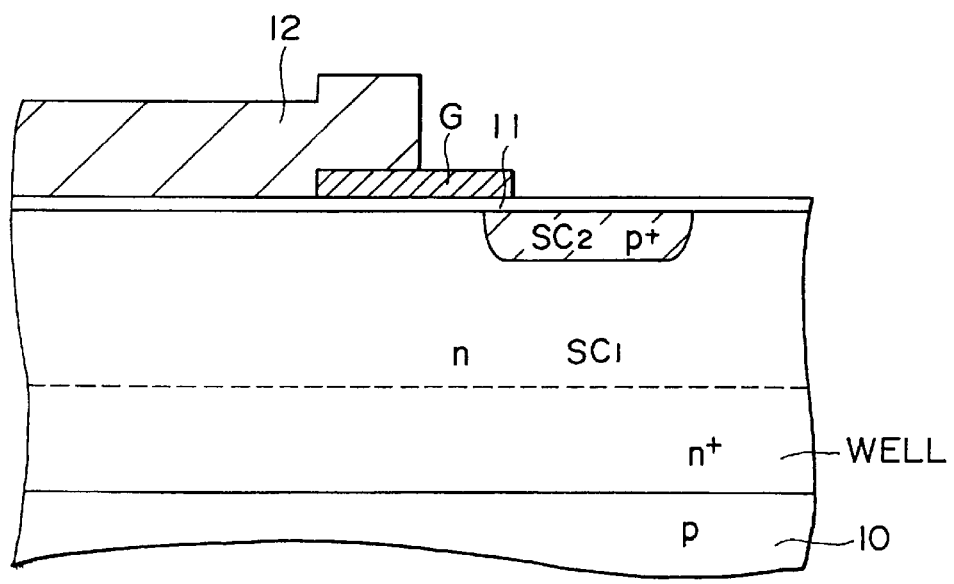

Subsequently, an ion-implantation mask 12 made of a resist material is formed. Then, ions of an impurity of a second conductivity type (typically a p-type) are implanted to form a first conductive region $SC_2$ in a surface region of the first semiconducting region $SC_1$ in contact with the first semiconducting region $SC_1$ to form a rectifying junction in conjunction with the first semiconducting region $SC_1$. As a result, a structure shown in FIG. 4B is obtained. Conditions of the ion implantation are listed as follows.

Ion type: $BF_2$
Acceleration energy: 20 keV
Dose: $1 \times 10^{13}/cm^2$
Ion-incidence angle: 7 degrees
In addition, ion-incidence angle is measured from a vertical line to wafer surface. This applies to all the cases.

Step 30

Figure 5A:
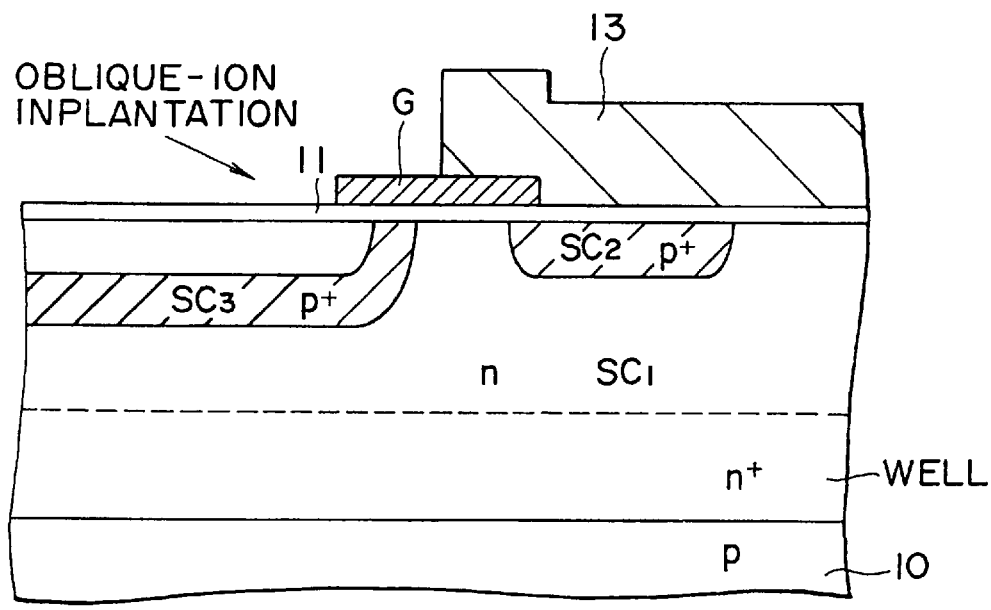
FIGS. 5A and 5B are diagrams each typically showing a partial cross section of a semiconducting substrate or the like used for explaining a continuation of the process of fabricating the semiconductor memory cell of the second embodiment shown in FIGS. 4A and 4B.

Thereafter, the ion-implantation mask 12 is removed and an ion-implantation mask 13 made of a resist material is formed. Then, ions of an impurity of a second conductivity type (typically a p-type) are implanted in an oblique direction to form a second semiconducting region $SC_3$ of a second conductivity type in a surface region of the first semiconducting region $SC_1$ separated away from the first conductive region $SC_2$. By implanting ions using an oblique-ion-implantation technique, the second semiconducting region $SC_3$ is also formed in a region beneath the conductive gate G as shown in FIG. 5A. It should be noted that the implantation of ions is done twice at different ion-incidence angles. In particular, by setting the ion-incidence angle in the first ion implantation at 60 degrees, the concentration of the impurity of the second semiconducting region $SC_3$ beneath the conductive gate G can be controlled with a high degree of accuracy. Conditions of the ion implantation are listed as follows:

First ion implantation
  Ion type: Boron
  Acceleration energy: 10 keV
  Dose: $3.4 \times 10^{13}/cm^2$
  Ion-incidence angle: 60 degrees
Second ion implantation
  Ion type: Boron
  Acceleration energy: 30 keV
  Dose: $2.1 \times 10^{13}/cm^2$
  Ion-incidence angle: 10 degrees

Step 40

Figure 5B:
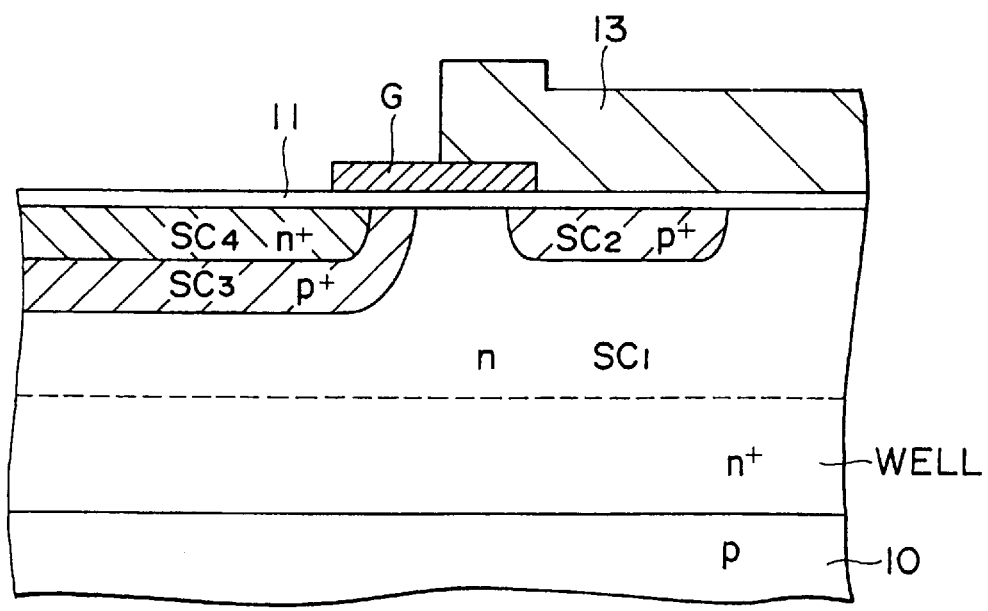

Then, ions of an impurity of a first conductivity type (typically an n-type) are implanted to form a second conductive region $SC_4$ in a surface region of the second semiconducting region $SC_3$ in contact with the second semiconducting region $SC_3$ to form a rectifying junction in conjunction with the second semiconducting region $SC_3$. As a result, a structure shown in FIG. 5B is obtained. Conditions of the ion implantation are listed as follows.

Ion type: Arsenic
Acceleration energy: 25 keV
Dose: $1 \times 10^{13}/cm^2$
Ion-incidence angle: 7 degrees

Step 50

Subsequently, the ion-implantation mask 13 is removed and an $SiO_2$ layer is formed by CVD over the entire uppermost surface. Then, the $SiO_2$ layer is etched back, leaving side walls 14 on both the side walls of the conductive layer G.

Step 60

Figure 6A:
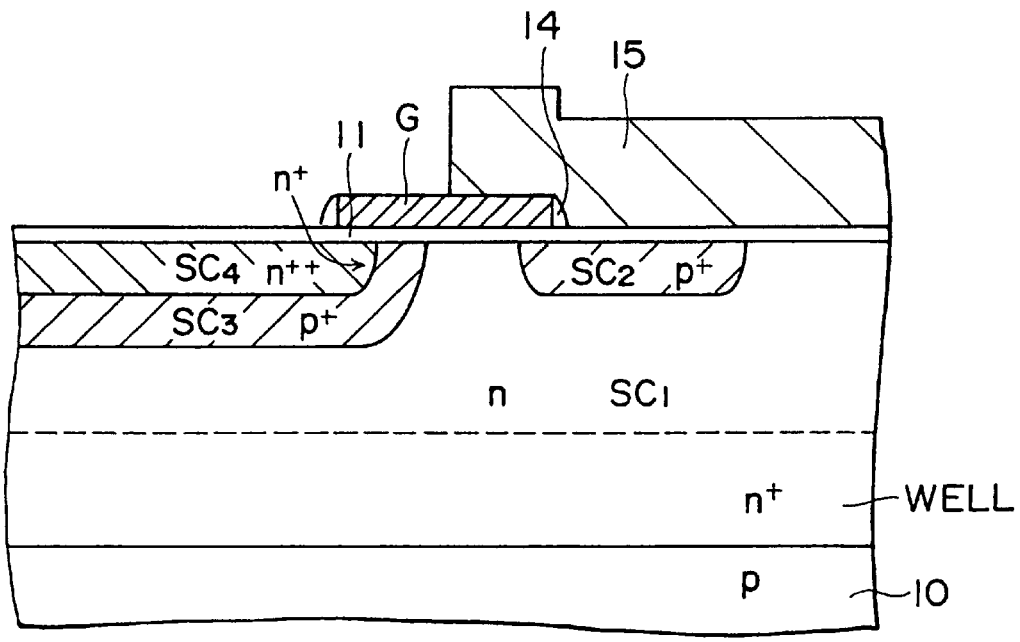
FIGS. 6A and 6B are diagrams each typically showing a partial cross section of a semiconducting substrate or the like used for explaining a further continuation of the process of fabricating the semiconductor memory cell of the second embodiment shown in FIGS. 5A and 5B.

Subsequently, an ion-implantation mask 15 made of a resist material is formed. Then, ions of an impurity of a first conductivity type (typically a n-type) are implanted to increase the concentration of the impurity of the second conductive region $SC_4$ to a value in the range $10^{19}$ to $10^{20}/cm^3$. In this way, the resistance of the second conductive region $SC_4$ can be reduced. As a result, a structure shown in FIG. 6A is obtained. Conditions of the ion implantation are listed as follows.

Ion type: Arsenic
Acceleration energy: 30 keV
Dose: $5 \times 10^{15}/cm^2$
Ion-incidence angle: 7 degrees

Step 70

Figure 6B:
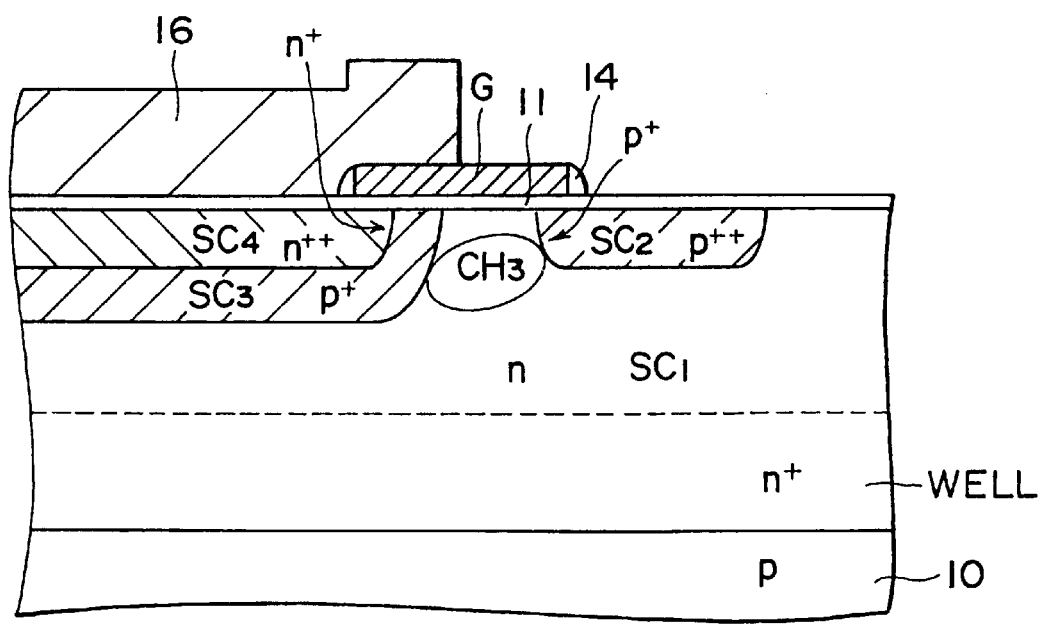

Thereafter, the ion-implantation mask 15 is removed and an ion-implantation mask 16 made of a resist material is created. Then, ions of impurities of a second conductivity type (typically a p-type) are implanted to increase the concentration of the impurity of the second semiconducting region $SC_3$ to a value in the range $10^{19}$ to $10^2/cm^3$. In this way, the resistance of the second semiconducting region $SC_3$ can be reduced. As a result, a structure shown in FIG. 6B is obtained. Conditions of the ion implantation are listed as follows.

Ion type: $BF_2$
Acceleration energy: 30 keV
Dose: $3 \times 10^{15}/cm^2$
Ion-incidence angle: 7 degrees

Step 80

Thereafter, the semiconductor memory cell is completed by using the known process of fabricating a MOS transistor.

With ions implanted under the ion-implantation conditions described above, concentrations of impurities shown in Table 2 given below are obtained in the gate regions (that is, the first conductive region $SC_2$ and the second semiconducting region $SC_3$) and the channel forming region $CH_3$ of the current controlling junction-field-effect transistor $TR_3$.

TABLE 2

| |
|---|
| First conductive region $SC_2$: $2.1 \times 10^{19}/cm^3$ |
| Second semiconducting region $SC_3$: $1.5 \times 10^{18}/cm^3$ |
| Channel forming region: $5.0 \times 10^{17}/cm^3$ |

The thickness of the channel forming region $CH_3$ of the current controlling junction-field-effect transistor $TR_3$ is 0.1 micrometers.

It should be noted that the processes of fabricating the semiconductor memory cell are not limited to what is described above. For example, Step 20 can be eliminated. In addition, the order of Steps 30, 40 and 50 can be changed arbitrarily to any sequence. On the top of that, the conductive gate and the element isolating regions can be formed after Step 70. After all, the ion-implantation conditions are no more than examples and can thus be modified appropriately.

Embodiment 3

Figure 7A:
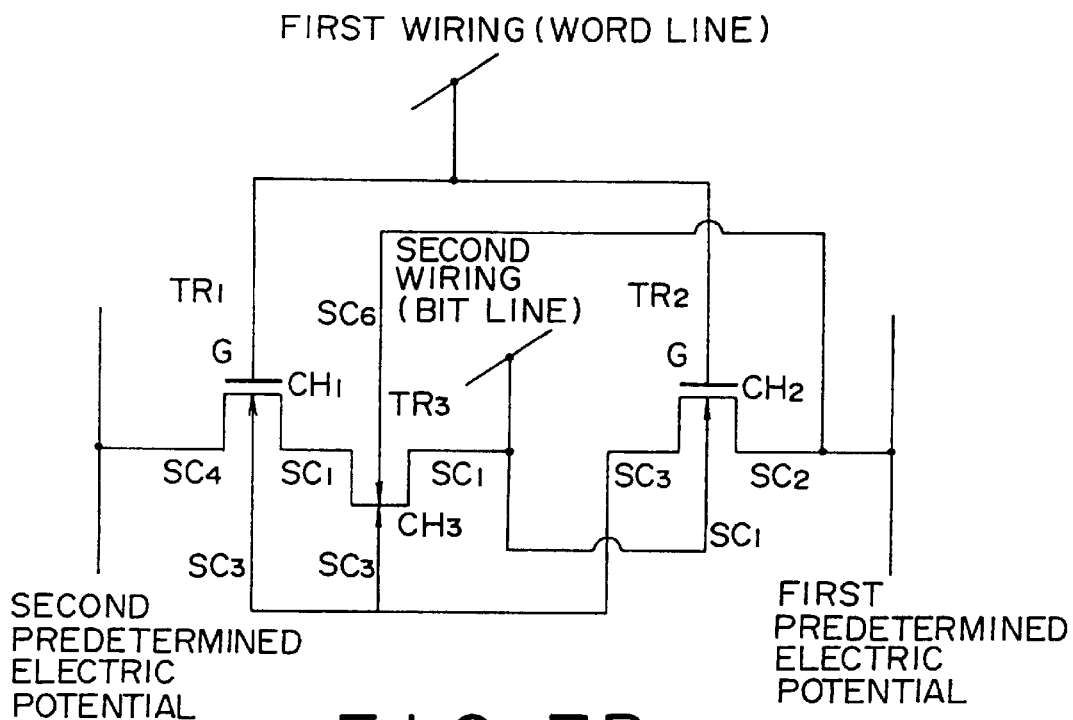
FIG. 7A is a diagram showing the principle of a third embodiment of a semiconductor memory cell according to the present invention.
Figure 7B:
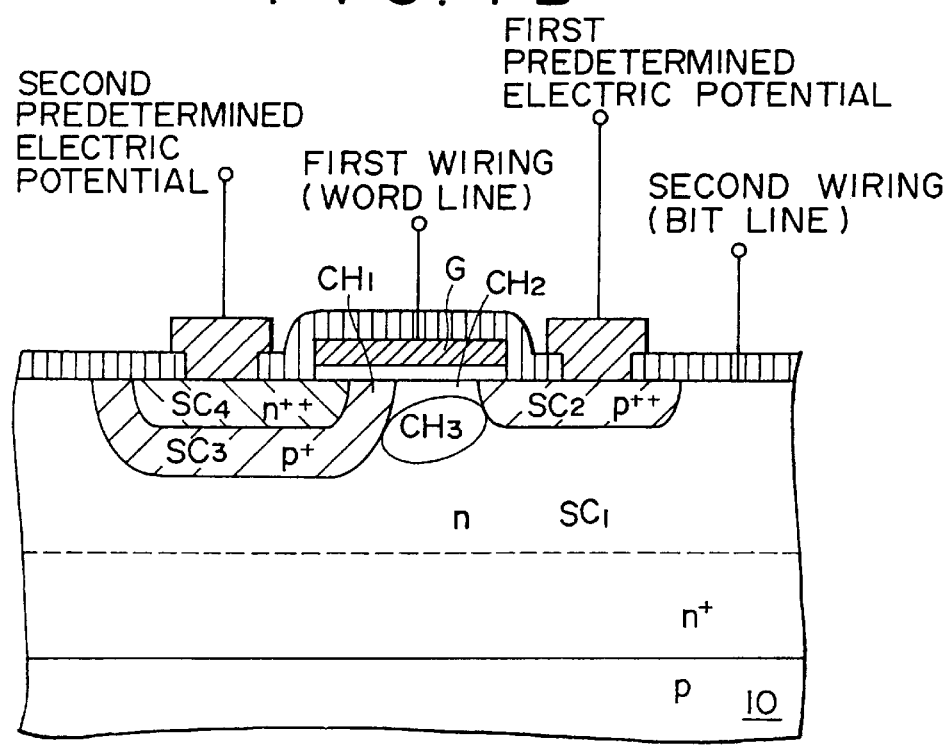
FIG. 7B is a diagram typically showing a partial cross section of the semiconductor memory cell according to the third embodiment of the present invention.

A third embodiment concerns a semiconductor memory cell according to the third aspect of the present invention. It should be noted that the physical structure of the semiconductor memory cell of the third embodiment itself is the same as that of the second embodiment. FIG. 7A is a diagram showing the principle of the semiconductor memory cell of the third embodiment and FIG. 7B is a diagram typically showing a partial cross section of the semiconductor memory cell. As shown in the figures, the semiconductor memory cell of the third embodiment is different from that of the second embodiment in that, in the case of the former, (a) the conductive gate G is connected to the first wiring for selecting semiconductor memory cells (typically a word line), (b) the first conductive region $SC_2$ is connected to a first predetermined electric potential;

(c) the second conductive region $SC_4$ is connected to a second predetermined electric potential, and (d) the other source/drain region of the current controlling junction-field-effect transistor $TR_3$ is connected to the second wiring for selecting semiconductor memory cells (typically a bit line).

Since the semiconductor memory cell of the third embodiment can be fabricated using the same fabricating process as that of the semiconductor memory cell of the second embodiment, detailed description of the fabricating process is omitted.

The first predetermined electric potential $V_3$ applied to the first conductive region $SC_2$ is set at zero or a negative value ($V_3<=0$). On the other hand, the second predetermined electric potential $V_4$ applied to the second conductive region $SC_4$ is set at zero or a positive value ($V_4>=0$).

In a write operation, the electric potentials at a variety of portions of the semiconductor memory cell are given as follows:

First wiring (typically a word line) for selecting semiconductor memory cells: $V_W$ Second wiring (typically a bit line) for selecting semiconductor memory cells:

When writing "0": $V_0$

When writing "1": $V_1$

In a write operation, threshold values of the switching transistor $TR_2$ seen from the conductive gate G:

When writing "0": $V_{TH2W\_0}$

When writing "1": $V_{TH2W\_1}$

In a read operation, the electric potentials at a variety of portions of the semiconductor memory cell are given as follows:

First wiring (typically a word line) for selecting semiconductor memory cells: $V_R$ In a read operation, threshold values of the read-out transistor $TR_1$ seen from the conductive gate G are given as follows:

When reading out "0": $V_{TH1R\_0}$

When reading out "1": $V_{TH1R\_1}$

In operations to write in "0" or "1" and to read out "0" or "1", in general, the electric potential of the channel forming region $CH_1$ is different from that of the channel forming region $CH_2$. Affected by this difference, the threshold values of the read-out transistor $TR_1$ and the switching transistor $TR_2$ seen from the conductive gate G in an operation to read out or write in "0" differ from those in an operation to read out or write in "1". Unlike the conventional DRAM, however, a capacitor with a large capacity required by the conventional DRAM is not employed in the semiconductor memory cell of the present invention.

In order to make the explanation simple, a relation among electric potentials in the switching transistor $TR_2$ is set as follows:

$|V_W|>$the greater value of $|V_{TH2W\_1}|$ and $|V_{TH2W\_0}|$

On the other hand, a relation among electric potentials in the read-out transistor $TR_1$ is set as follows:

$|V_{TH1R\_0}|>|V_R|>|V_{TH1R\_1}|$

When the ON/OFF current ratio of the current controlling junction-field-effect transistor $TR_3$ is large enough, then the information can be read out without error even if $|V_R|\geq|V_{TH\_11}|$.

Operation to Write Information

In an operation to write in "0" by setting with the electric potential of the second wiring at $V_0$ or to write in "1" by setting the electric potential of the second wiring set at $V_1$, the electric potential $V_W$ of the first wiring is set at a negative value ($V_W<0$). Thus, the electric potential $V_W$ of the conductive gate G of the switching transistor $TR_2$ is also set at a negative value ($V_W<0$) as well. As described above, the electric potential $V_W$ satisfies the following relation:

$|V_W|>$the greater value of $|V_{TH2W\_1}|$ and $|V_{TH2W\_0}|$

As a result, in a write operation, the switching transistor $TR_2$ is put in a turned-on state. Therefore, the electric potential of the channel forming region $CH_1$ of the read-out transistor $TR_1$ is $V_3$ when information "0" is written, and $V_3$ when information "1" is written.

In an operation to write information, the electric potential $V_W$ of the conductive gate G of the read-out transistor $TR_1$ is negative ($V_W<0$). As a result, the read-out transistor $TR_1$ is put in a turned-off state. In this way, the electric potential of the channel forming region $CH_1$ of the read-out transistor $TR_1$ is $V_3$ when information "0" or "1" is written. In the information retention state, however, the switching transistor $TR_2$ is in a turned-off state. Therefore, if the absolute value of the electric potential $V_5$ of the second wiring is set at a value equal to or smaller than the absolute value of $V_0$ or $V_1$ ($|V_5|<=|V_0|$ or $|V_1|$), the electric potential of the channel forming region $CH_1$ is $\gamma\{V_3-(V_0-V_5)\}$ or $\gamma\{V_3-(V_1-V_5)\}$ for stored information of "0" or "1" respectively where $\gamma$ is a ratio of the capacitance between the first semiconducting region $SC_1$ and the second semiconducting region $SC_3$ to the total capacitance between other regions (including the first semiconducting region $SC_1$) and the semiconducting region $SC_3$. In spite of the fact that this state changes with the lapse of time due to leakage currents, this state is nonetheless maintained within an allowable range until an operation to read out the information is carried out. Examples of the leakage currents are a current flowing between the channel forming region $CH_1$ and the first semiconducting region $SC_1$ of the read-out transistor $TR_1$ and an off-state current of the switch transistor $TR_2$.

After the information has been written, the semiconductor memory cell gets in an information retention state before the information is read out. In this state, electric potentials of a variety of portions in the transistors are at such values that the read-out transistor $TR_1$ and the switching transistor $TR_2$ will not get in a conductive state. In order to prevent the read-out transistor $TR_1$ and the switching transistor $TR_2$ from getting in a conductive state, typically, the electric potential of the first wiring is set at 0 and the electric potential of the second wiring is set at $V_5$. It should be noted that the so-called refresh operation is carried out before the electric potential of the channel forming region $CH_1$ of the read-out transistor $TR_1$ changes with the lapse of time from its original value by a difference which is large enough to cause an error in an operation to read out the information.

Operation to Read Out Information

In an operation to read out information "0" or "1", the electric potential $V_R$ of the first wiring is positive ($V_R>0$) and the electric potential $V_6$ of the second wiring satisfies the relation $|V_6|<=V_0$ with reading out "0" or $|V_6|<=V_1$ when reading out "1". Thus, the electric potential $V_R$ of the conductive gate G of the switching transistor $TR_2$ is also positive ($V_R>0$). As a result, the switching transistor $TR_2$ is in a turned-off state.

The electric potential $V_R$ of the conductive gate G of the read-out transistor $TR_1$ is positive ($V_R>0$) as well. The threshold value of the read-out transistor $TR_1$ seen from the conductive gate G is $V_{TH1R\_0}$ or $V_{TH1R\_1}$ which correspond to $\gamma\{V_3-(V_0-V_5)\}$ or $\gamma\{V_3-(V_1-V_5)\}$ for stored information of "0" or "1" respectively, the electric potential between the second semiconducting region $SC_3$ and the second conductive region $SC_4$. The threshold values of the read-out transistor $TR_1$ depend upon the state of the electric potential of the channel forming region $CH_1$. The electric potential and the threshold values satisfy the following relation:

$$|V_{TH1R\_0}|>|V_R|>|V_{TH1R\_1}|$$

Thus, when the stored information is "0", the read-out transistor $TR_1$ is in a turned-on state. When the stored information is "1", on the other hand, the read-out transistor $TR_1$ is in a turned-off state.

When the ON/OFF current ratio of the current controlling junction-field-effect transistor $TR_3$ is large enough, then the information can be read out without error even if $|V_R|\geq|V_{TH\_11}|$.

The read-out transistor $TR_1$ is controlled by the current controlling junction-field-effect transistor $TR_3$ based on the bias conditions of the gate regions of the current controlling junction-field-effect transistor $TR_3$ which are constituted by the first conductive region $SC_2$ and the second semiconducting region $SC_3$. That is to say, when the stored information is "0", the current controlling junction-field-effect transistor $TR_3$ is put in a turned-on state. When the stored information is "1", on the other hand, the current controlling junction-field-effect transistor $TR_3$ is put in a turned-off state.

In this way, the read-out transistor $TR_1$ is put in a turned-on state or a turned-off state in dependence upon the stored information (with a high degree of reliability). Since the second conductive region $SC_4$ is connected to the second predetermined electric potential, a current flows or does not flow to the read-out transistor $TR_1$, depending upon whether the stored information is "0" or "1". As a result, the stored information can be read out as an operating state of the read-out transistor $TR_1$.

The operating states of the read-out transistor $TR_1$, the switching transistor $TR_2$ and the current controlling junction-field-effect transistor $TR_3$ described above are summarized in Table 3. It should be noted that the values of electric potentials shown in Table 1 are no more than typical values which can be any values as long as the conditions described above are satisfied.

TABLE 3

Unit : volt

| Write operation | Write in "0" | | Write in "1" | |
| --- | --- | --- | --- | --- |
| Electric potential of the first wiring | $V_W$ | -2.0 | $V_W$ | -2.0 |
| Electric potential of the second wiring | $V_0$ | -2.0 | $V_1$ | 0 |
| First predetermined electric potential | | $V_2$ | | $V_2$ |
| Electric potential of the gate | $V_W$ | -2.0 | $V_W$ | -2.0 |
| Threshold | $V_{TH2W\_0}$ | -1.2 | $V_{TH2W\_1}$ | -0.5 |

TABLE 3-continued

Unit : volt

| voltage of $TR_2$ seen from the gate | | |
| --- | --- | --- |
| State of $TR_2$ | ON | ON |
| Electric potential of the channel forming region of $TR_1$ | A typical first predetermined electric potential of 0 | A typical first predetermined electric potential of 0 |
| State of $TR_1$ | OFF | OFF |
| State of $TR_3$ | OFF | OFF |
| Read operation | Read out "0" | Read out "1" |
| Electric potential of the first wiring | $V_R$ 1.0 | $V_R$ 1.0 |
| Electric potential of the gate | $V_R$ 1.0 | $V_R$ 1.0 |
| State of $TR_2$ | OFF | OFF |
| Electric potential of the channel forming region of $TR_1$ | | |
| Threshold voltage of $TR_1$ seen from the gate | $V_{TH1R\_0}$ 0.5 | $V_{TH1R\_1}$ 1.1 |
| State of $TR_1$ | OFF | ON |
| Electric potential of the second wiring | 0.5 | 0.5 |
| Second predetermined electric potential | 0.25 | 0.25 |
| State of $TR_3$ | OFF | ON |

Embodiment 4

A fourth embodiment is obtained by making some changes to the structures of the semiconductor memory cells of the second and third embodiments according to the second and third aspect respectively of the present invention. It should be noted that there is basically no difference in physical structure itself between the semiconductor memory cells of the second, third and fourth embodiments. The semiconductor memory cell of the fourth embodiment is different from those of the second and third embodiments in that power supplies and electric potentials to which regions are connected to are different from the previous ones.

Figure 8:
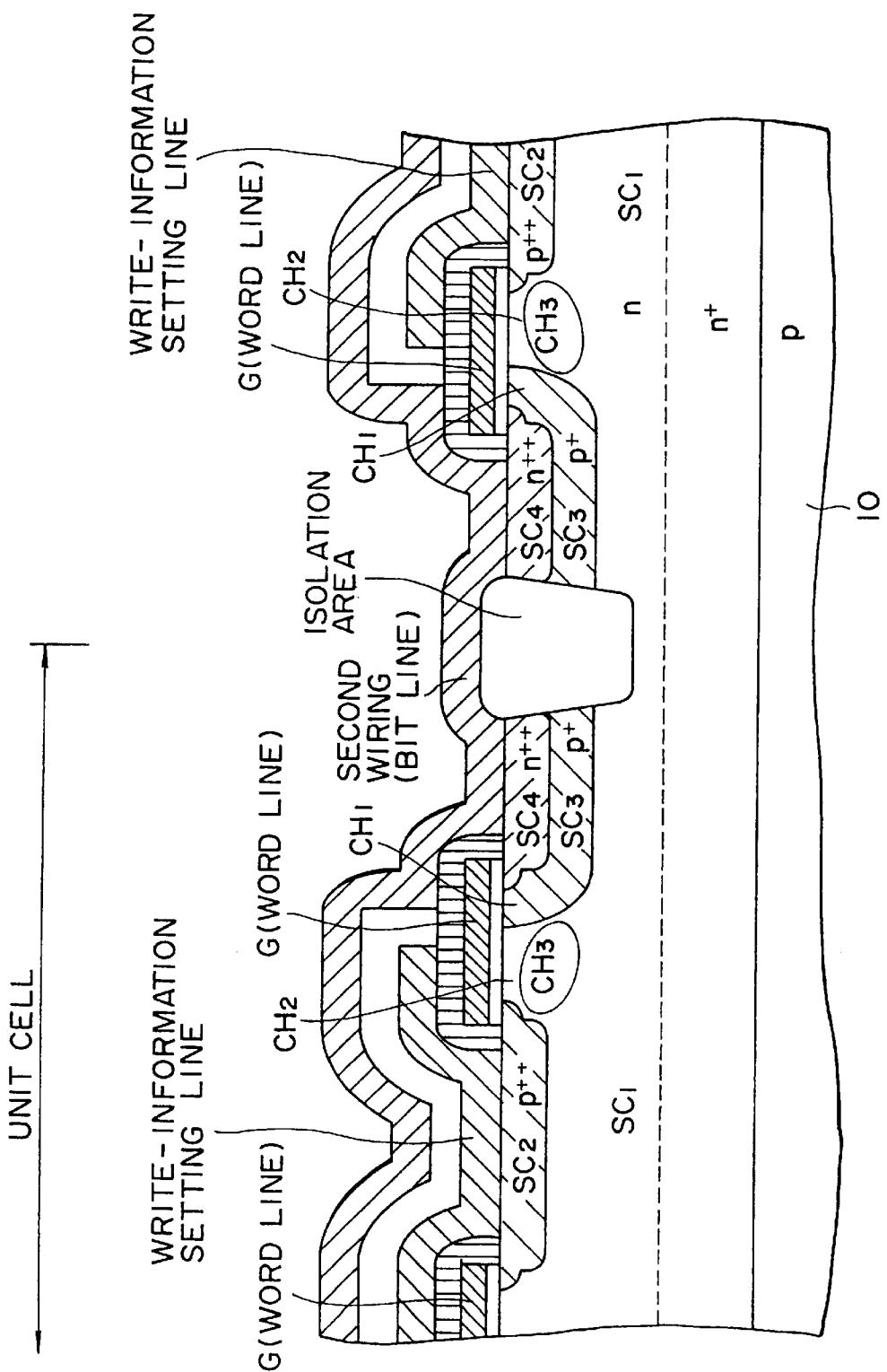
FIG. 8 is a diagram showing a partial cross section of a structural model isolating semiconductor memory cells from each other by an element isolating region having a trench structure.
Figure 9A:
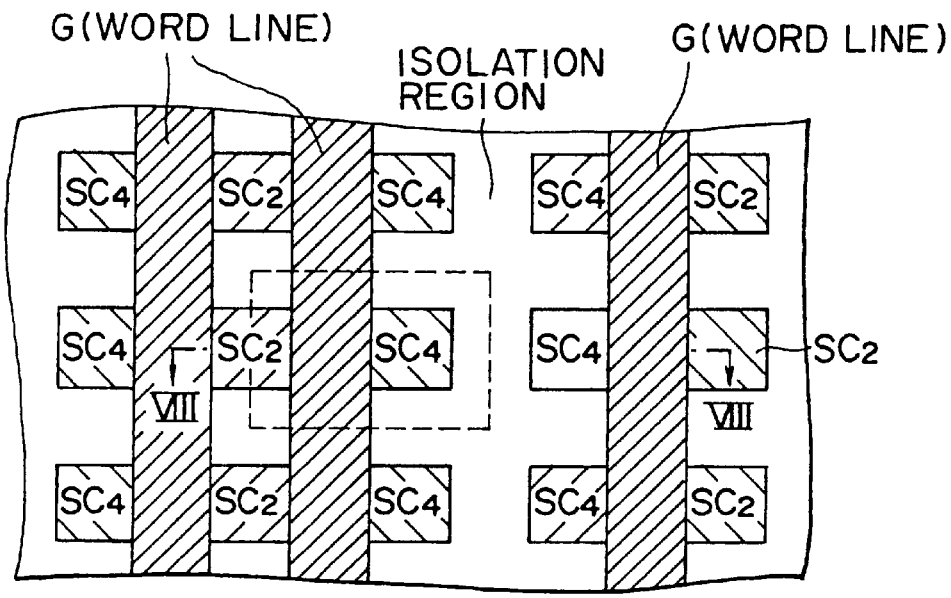
FIGS. 9A and 9B are diagrams each showing a partial cross section of a layout model of regions composing a structure isolating semiconductor memory cells from each other by an element isolating region having a trench structure.
Figure 9B:
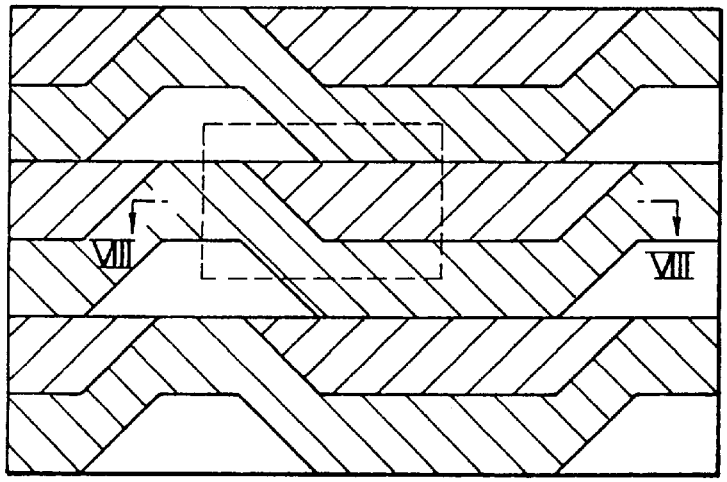

FIG. 8 is a diagram typically showing a partial cross section of a structure wherein two adjacent semiconductor memory cells are isolated from each other by an element isolating region having a trench structure. FIG. 9A is a diagram typically showing a layout of the element isolating region, a first wiring (typically a word line), a second conductive region $SC_4$ and a first conductive region $SC_2$ and FIG. 9B is a diagram typically showing a layout of a second wiring (a bit line) and a write-information setting line. FIG. 8 typically shows a cross section taken on lines VIII—VIII shown in FIGS. 9A and 9B. It is obvious from FIG. 8 and FIGS. 9A, 9B that, in the semiconductor memory cell having such a configuration, the size of the unit cell is at least $2F\times3F=6F^2$ or $3F\times3F=9F^2$ to include a margin where notation F is a feature size.

Figure 10A:
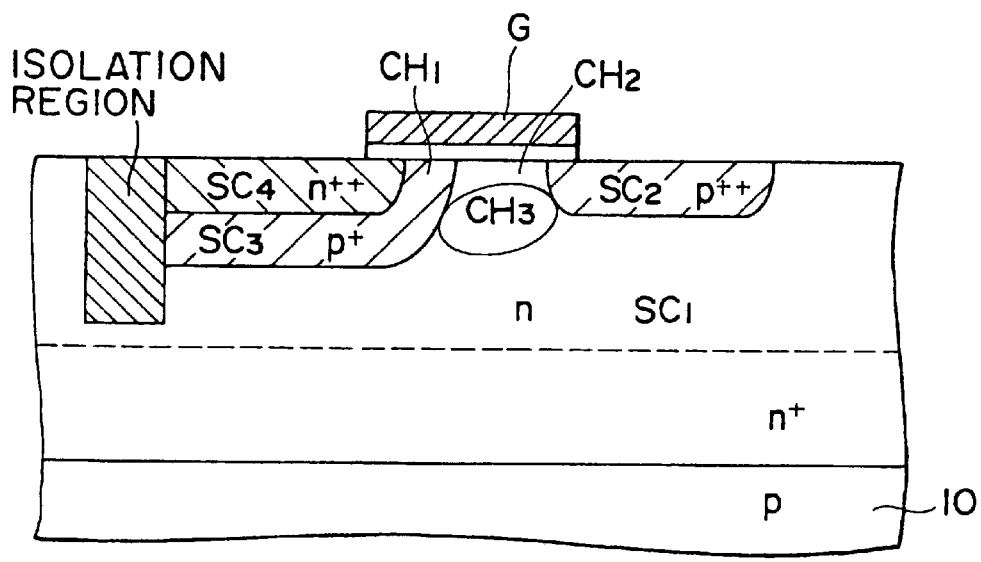
FIGS. 10A and 10B are diagrams each typically showing a partial cross section of the semiconductor memory cell according to the second or third aspect of the present invention.
Figure 10B:
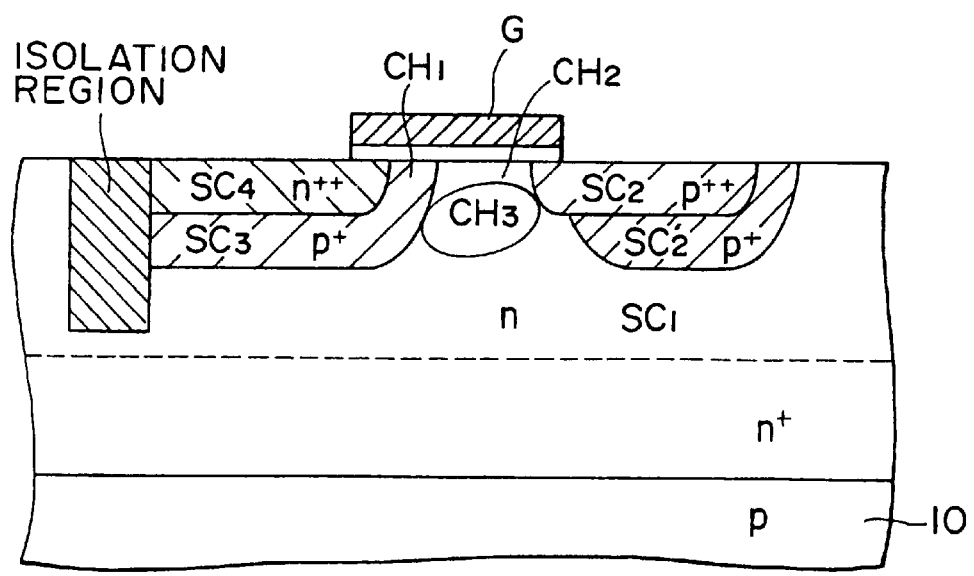

Semiconductor memory cells with structures shown in FIGS. 10A, 10B are examples in which the element isolating region has a trench structure. The semiconductor memory cell with the structure shown in FIG. 10B is different from that shown in FIG. 10A in that, in the case of the former, when a second semiconducting region $SC_3$ of a second conductivity type (a p$^+$-type) is formed, a portion (an region $SC'_2$ of the P$^+$-type) of a first conductive region $SC_2$ is formed at the same time in a region where the first conductive region $SC_2$ is to be formed. It should be noted that the second semiconducting region $SC_3$ and the portion (the region $SC'_2$ of the P⁺-type) of the first conductive region $SC_2$ can be formed by the oblique-ion-implantation process.

Figure 11A:
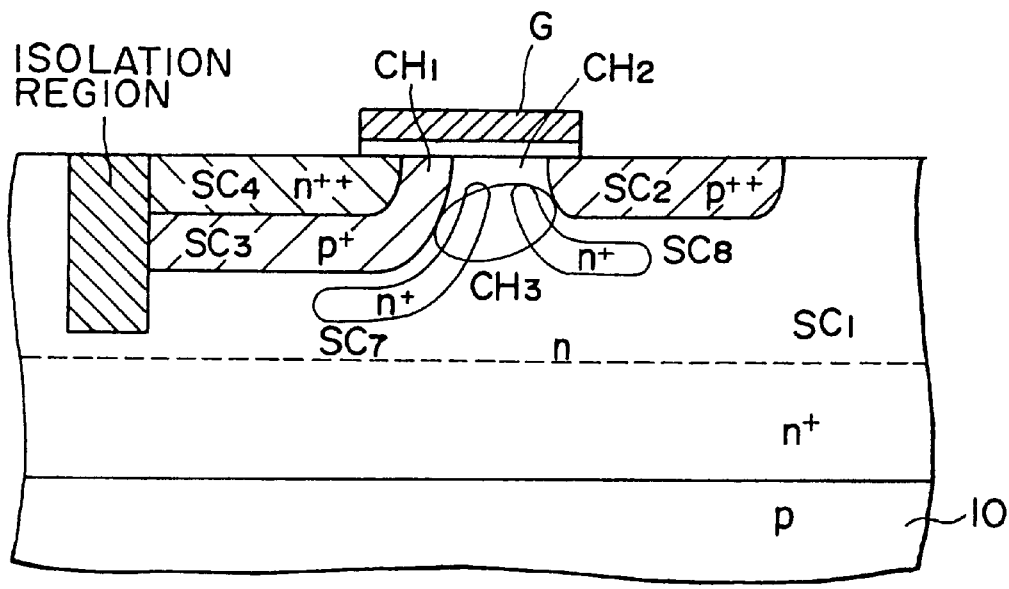
FIGS. 11A and 11B are diagrams each showing a partial cross section of a model of the semiconductor memory cell according to the second or third embodiment of the present invention.
Figure 11B:
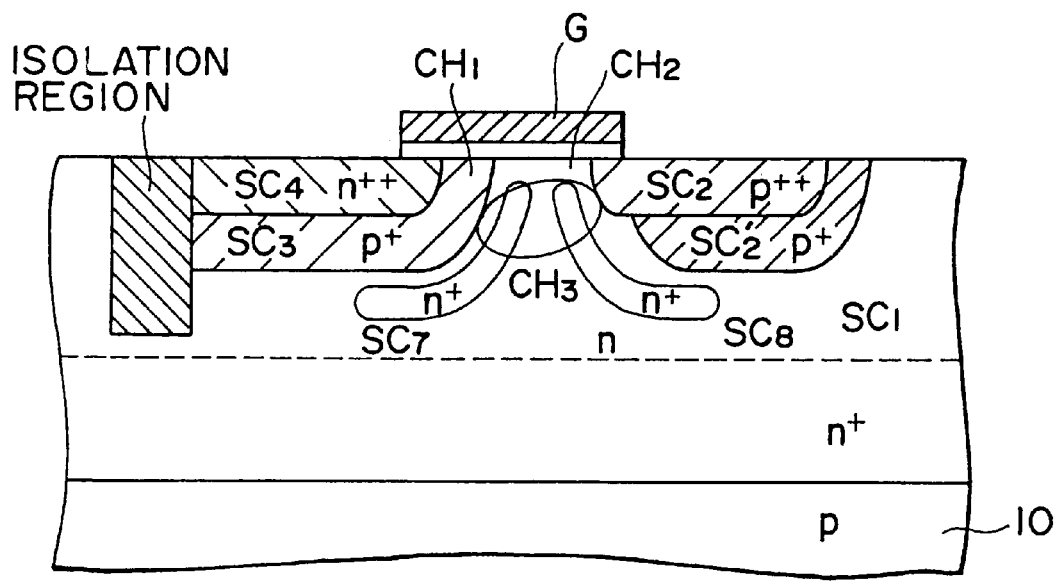

In semiconductor memory cells shown in FIGS. 11A, 11B, the element isolating regions each have a trench structure as well. Ions of an impurity of a first conductivity type (typically an n-type) are implanted to the channel forming region $CH_3$ of the current controlling junction-field-effect transistor $TR_3$ by using the oblique-ion-implantation process in order to form regions $SC_7$ and $SC_8$ of a first conductivity type. In this way, the concentration of the impurity in the channel forming region $CH_3$ can be controlled, making the operation of the current controlling junction-field-effect transistor $TR_3$ as a JFET stable. The semiconductor memory cell shown in FIG. 11A is different from that shown in FIG. 11B as the semiconductor memory cell shown in FIG. 10A is different from that shown in FIG. 10B as described above.

Figure 12A:
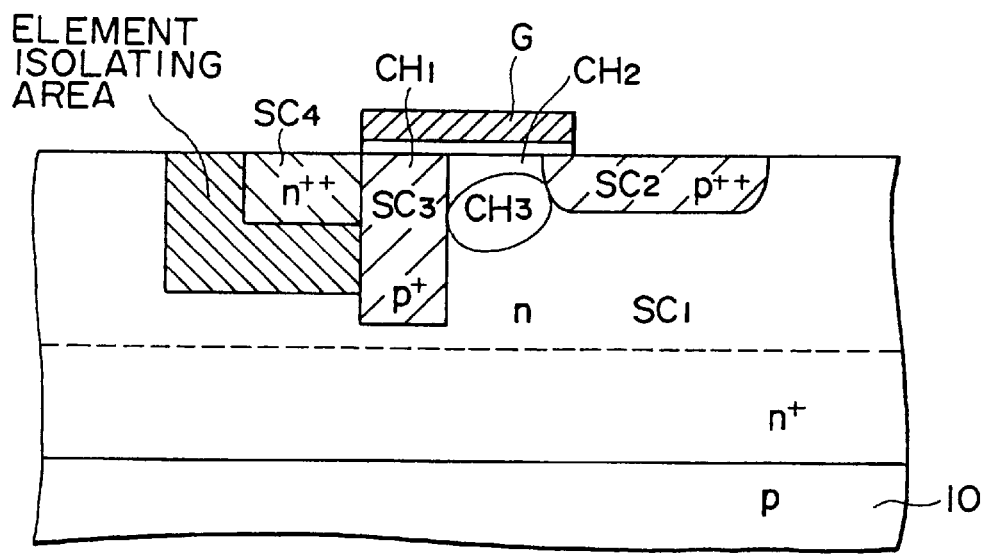
FIG. 12A is a diagram typically showing a partial cross section of the semiconductor memory cell according to the second or third embodiment of the present invention.

In the semiconductor memory cells shown in FIGS. 3A and 3B to FIGS. 11A and 11B, the second conductive region $SC_4$ is provided in a surface region of the second semiconducting region $SC_3$. In a semiconductor memory cell with a structure shown in FIG. 12A, on the other hand, the second conductive region $SC_4$ is provided at a location adjacent to and in contact with the second semiconducting region $SC_3$. Also in the semiconductor memory cell with a structure shown in FIG. 12A, the element isolating region has a trench structure as well. It should be noted that the element isolating region is extended to a region beneath the second conductive region $SC_4$, isolating the second conductive region $SC_4$ from the first semiconducting region $SC_1$ from each other. The element isolating region extended to a region beneath the second conductive region $SC_4$ can be formed by using typically the SIMOX technology. As an alternative, a groove is formed by etching on a region of the semiconducting substrate where an element isolating region including a region for forming the second conductive region $SC_4$ is supposed to be formed. Then, after the groove is filled up with an insulating material such as $SiO_2$, the insulating material is removed from a portion at which the second conductive region $SC_4$ is to be formed. It should be noted that, in this case, the portion at which the second conductive region $SC_4$ is to be formed is then filled up with a material such as amorphous silicon or polycrystalline silicon. As an alternative, a silicon layer is then formed by using the solid-phase growth method in the portion at which the second conductive region $SC_4$ is to be formed.

Figure 12B:
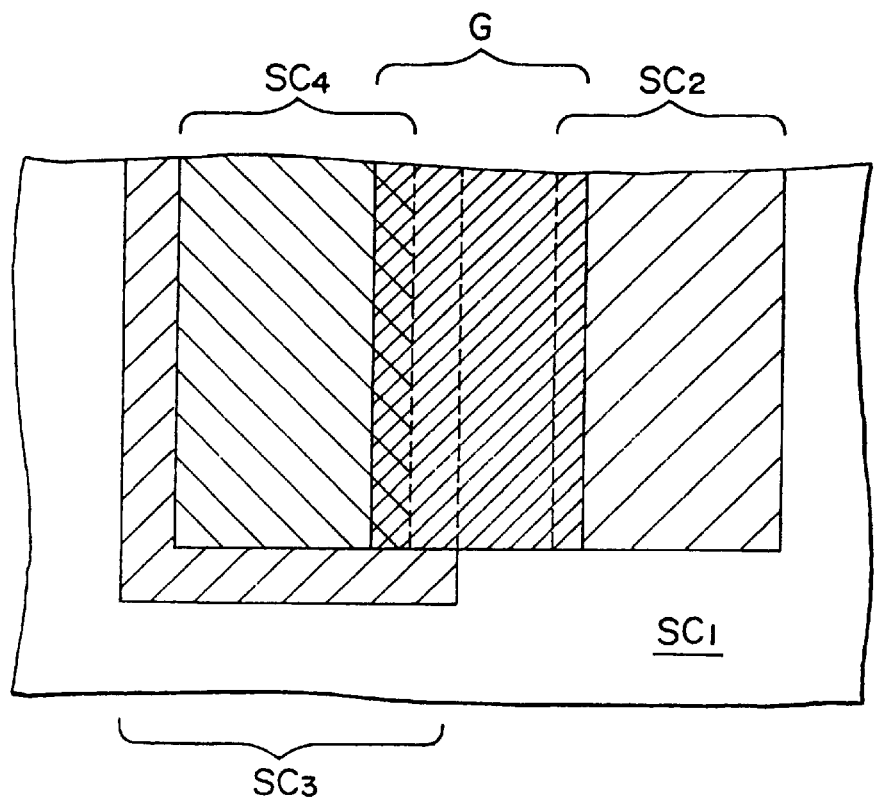
FIG. 12B is a diagram typically showing a layout of the semiconductor memory cell according to the second or third embodiment of the present invention.
Figure 13A:
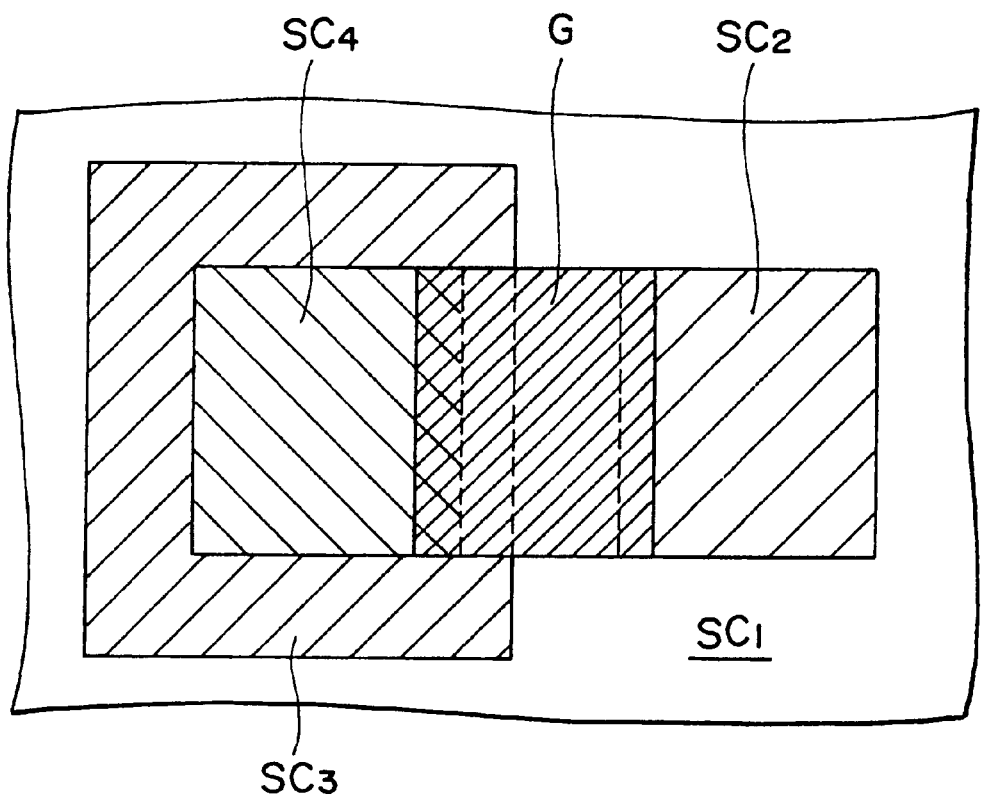
FIGS. 13A and 13B are diagrams each typically showing a layout of the semiconductor memory cell according to the second or third embodiment of the present invention.
Figure 13B:
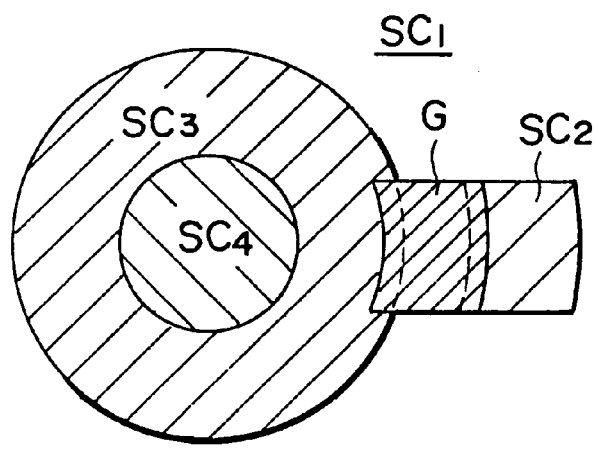

FIG. 12B and FIGS. 13A, 13B show typical layouts of the semiconductor memory cells shown in FIGS. 3B and 7B. In the semiconductor memory cell shown in FIG. 12B, the first conductive region $SC_2$, the second semiconducting region $SC_3$, the second conductive region $SC_4$ and the conductive gate G have parallel banded-structure shapes. In the case of the semiconductor memory cell shown in FIG. 13A, on the other hand, the rectangular second semiconducting region $SC_3$ encloses the rectangular second conductive region $SC_4$ and is also formed at the bottom of the rectangular second conductive region $SC_4$. Likewise, in the case of the semiconductor memory cell shown in FIG. 13B, the circular second semiconducting region $SC_3$ encloses the circular second conductive region $SC_4$ and is also formed at the bottom of the circular second conductive region $SC_4$. In this way, by providing the second semiconducting region $SC_3$ around the second conductive region $SC_4$, the amount of information stored in the second semiconducting region $SC_3$ can be increased, allowing the information retention time to be increased. It should be noted that the first conductive region $SC_2$, the second semiconducting region $SC_3$, the second conductive region $SC_4$ and the conductive gate G of each of the semiconductor memory cells shown in FIGS. 10A to 12A can be laid out essentially in the same way as the semiconductor memory cells shown in FIG. 12B and FIGS. 13A, 13B.

Figure 14A:
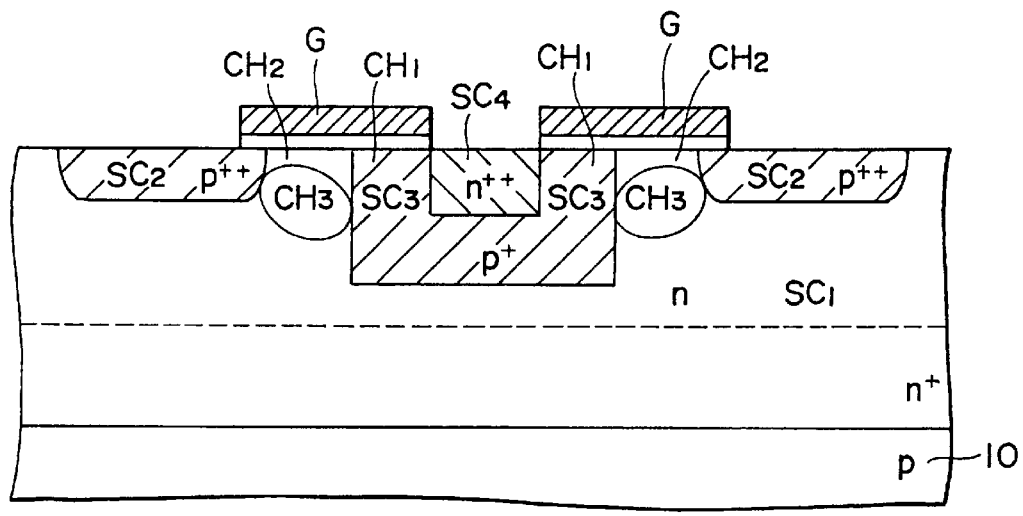
FIGS. 14A and 14B are diagrams each typically showing a partial cross section of the semiconductor memory cell according to the second or third embodiment of the present invention.
Figure 14B:
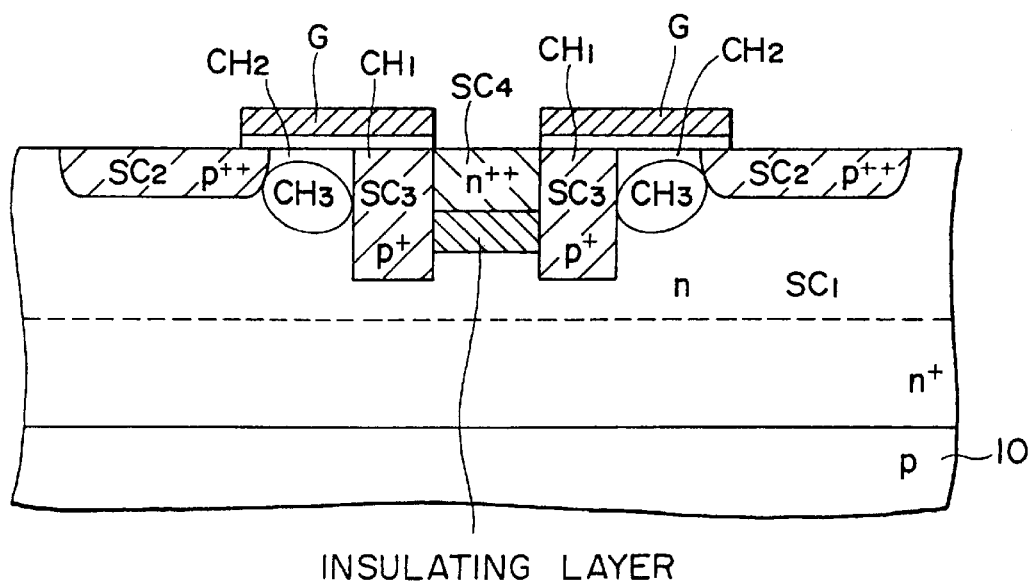
Figure 15A:
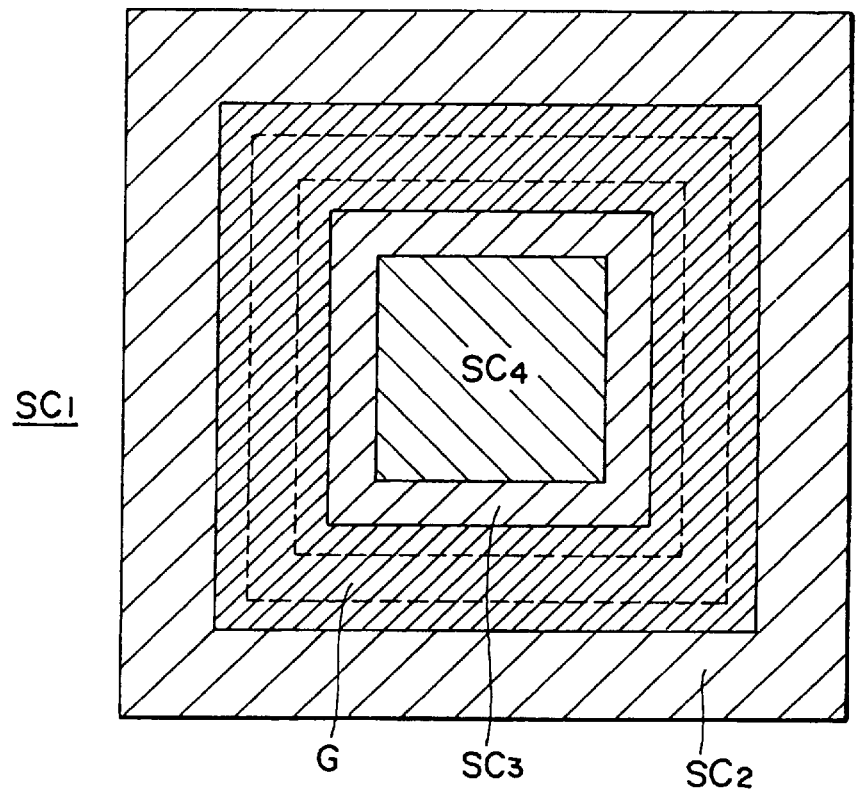
FIGS. 15A and 15B are diagrams each typically showing a layout of the semiconductor memory cell according to the second or third embodiment of the present invention.
Figure 15B:
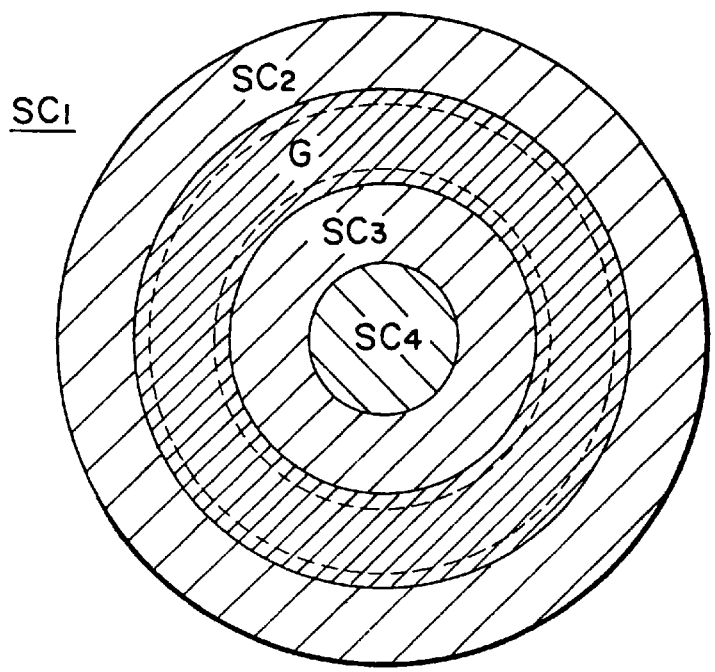
Figure 16A:
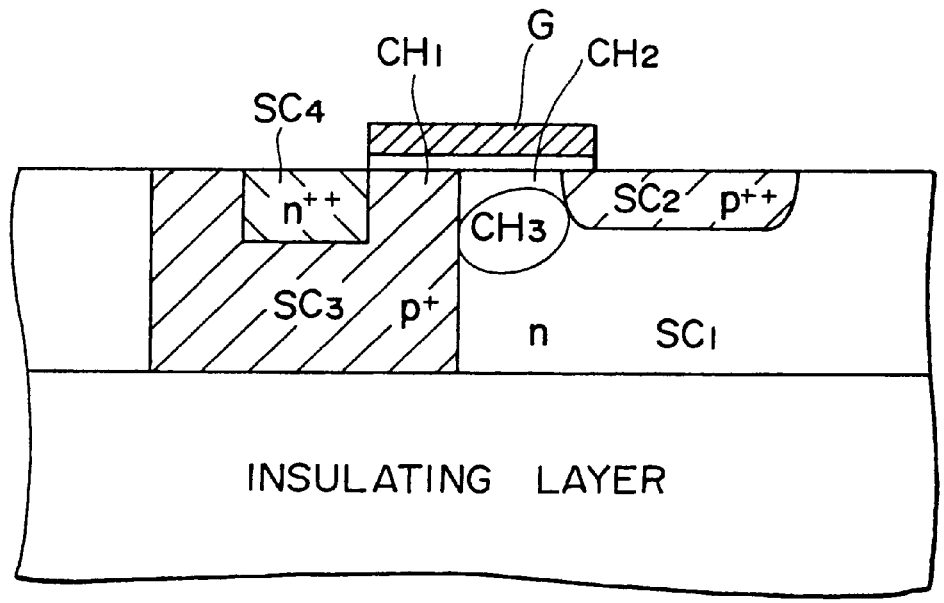
FIGS. 16A and 16B are diagrams each typically showing a partial cross section of the semiconductor memory cell according to the second or third embodiment of the present invention.
Figure 16B:
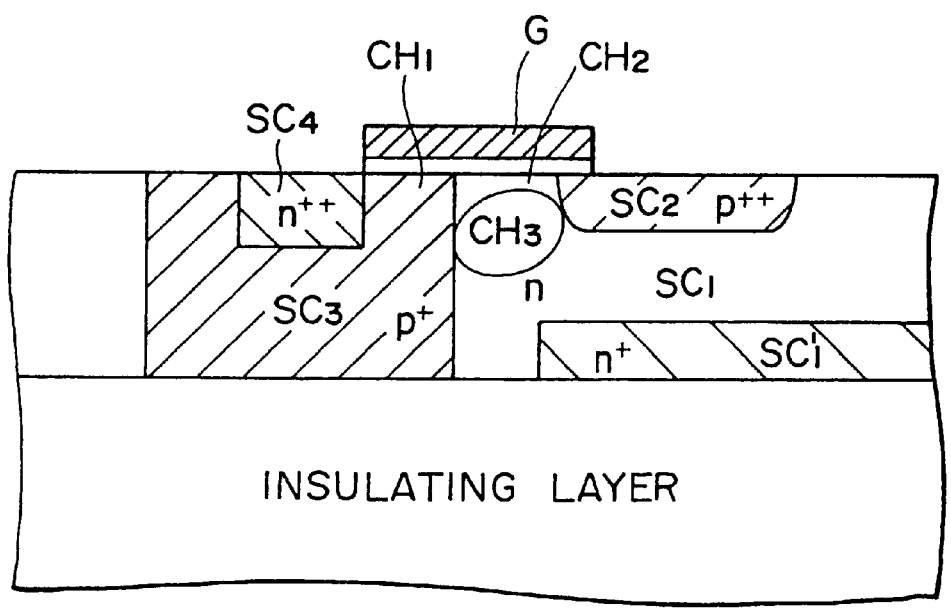
Figure 17A:
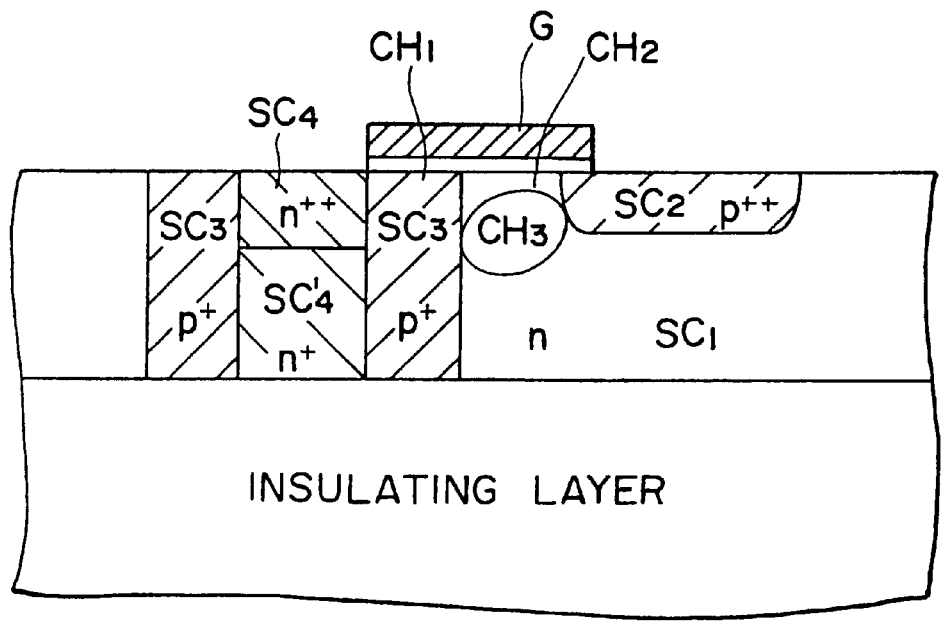
FIGS. 17A and 17B are diagrams each typically showing a partial cross section of the semiconductor memory cell according to the second or third embodiment of the present invention.
Figure 17B:
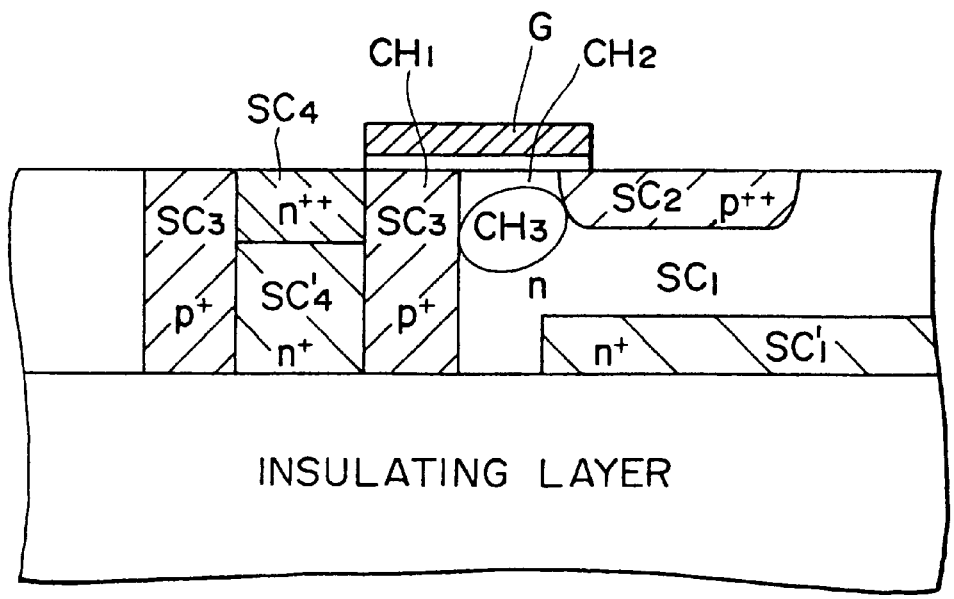

In semiconductor memory cells with structures shown in FIGS. 14A and 14B, the first conductive region $SC_2$, the second semiconducting region $SC_3$ and the conductive gate G are laid out to form concentric circles with the second conductive region $SC_4$ placed at the center thereof. It should be noted that the insulating layer of the semiconductor memory cell shown in FIG. 14B can be formed by using typically the SIMOX technology. The insulating layer isolates the second conductive region $SC_4$ and the first semiconducting region $SC_1$ from each other. Layouts of the semiconductor memory cells with structures shown in FIGS. 14A and 14B are typically shown in FIGS. 15A and 15B respectively. In the semiconductor memory cell shown in FIG. 15A, the first conductive region $SC_2$, the second semiconducting region $SC_3$, the second conductive region $SC_4$ and the conductive gate G each have a rectangular planar shape. In the semiconductor memory cell shown in FIG. 15B, on the other hand, the first conductive region $SC_2$, the second semiconducting region $SC_3$, the second conductive region $SC_4$ and the conductive gate G each has a circular planar shape. In this way, by providing the second semiconducting region $SC_3$ around the second conductive region $SC_4$, the amount of information stored in the second semiconducting region $SC_3$ can be increased, allowing the information retention time to be increased.

Figure 18A:
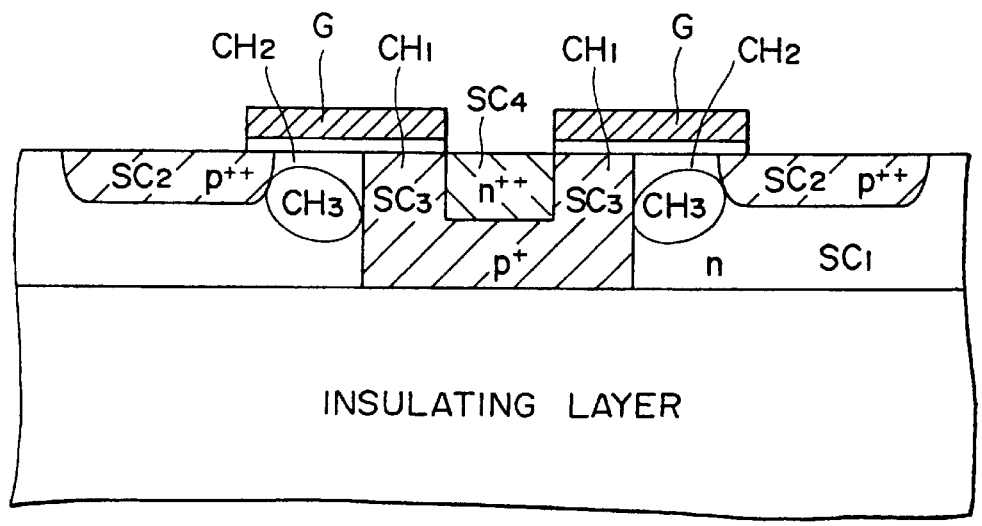
FIGS. 18A and 18B are diagrams each typically showing a partial cross section of the semiconductor memory cell according to the second or third embodiment of the present invention.
Figure 18B:
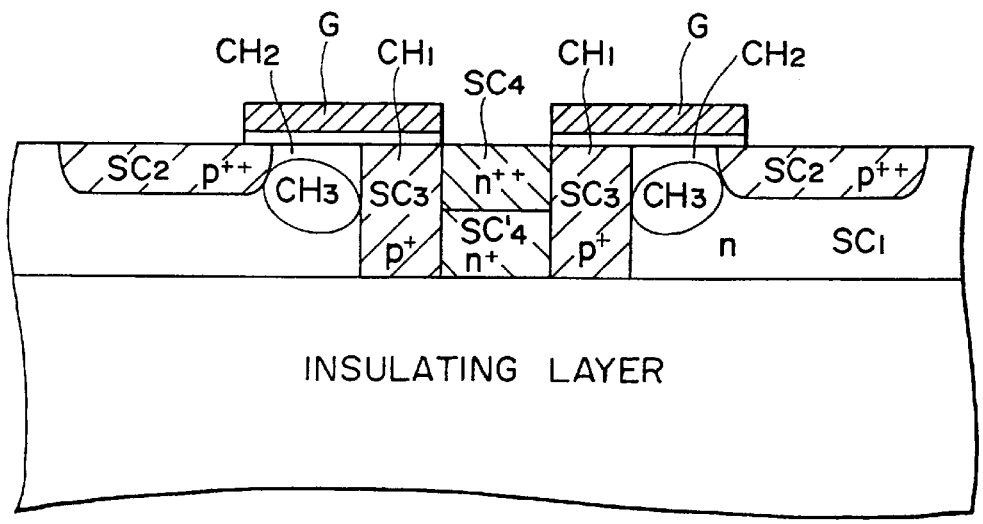

Semiconductor memory cells shown in FIGS. 16A to 18B are formed on an insulating layer (or an insulator). A semiconductor layer for forming each of the semiconductor memory cells can be formed on the insulating layer by using the SIMOX technology, a substrate lamination SOI technology or a solid-phase epitaxial side-growth technology on an element isolating region having a LOCOS structure. On the insulating layer, an amorphous silicon layer, a polycrystalline silicon layer and a monolithic crystalline layer can be formed. It should be noted, however, that the material for forming the semiconductor memory cells shown in FIGS. 16A to 18B does not have to be a material of the silicon group. The structures of the semiconductor memory cells shown in FIGS. 16A, 16B and FIGS. 17A, 17B are substantially the same as those of the semiconductor memory cells shown in FIGS. 3B and 7B. It should be noted that in the semiconductor memory cells shown in FIGS. 16B and 17B, at the lower portion of the first semiconducting region $SC_1$, a highly doped layer $SC'_1$ of the first conductivity type is formed in order to reduce the resistance thereof. The semiconductor memory cells shown in FIGS. 17A and 17B each have a structure wherein the second semiconducting region $SC_3$ encloses the second conductive region $SC_4$ along the entire circumference thereof. On the other hand, the structures of the semiconductor memory cells shown in FIGS. 18A and 18B are substantially the same as those of the semiconductor memory cells shown in FIGS. 14A and 14B respectively.

Embodiment 5

In a fifth embodiment, the operation to read information from the semiconductor memory cell according to the second aspect of the present invention shown in FIG. 11A is examined by computer simulation. Computer simulation has been carried out to simulate a standard ASIC process wherein a second semiconducting region $SC_3$ of the second conductivity type (p-type) is formed by an oblique-ion-implantation technique and, then, the concentration of an impurity in the channel forming region $CH_3$ of the current controlling junction-field-effect transistor (JFET) $TR_3$ of the first conductivity type (n-type) is controlled by executing the oblique-ion-implantation technique on an impurity of the first conductivity type (n-type).

Conditions of the ion implantation using the oblique-ion-implantation technique for forming a second semiconducting region $SC_3$ of the second conductivity type (p-type) which corresponds to Step 30 described earlier are listed below. It should be noted that the implantation of ions is done twice at different ion-incidence angles.

First ion implantation
  Ion type: Boron
  Acceleration energy: 10 keV
  Dose: $3.4 \times 10^{13}/cm^2$
  Ion-incidence angle: 60 degrees
Second ion implantation
  Ion type: Boron
  Acceleration energy: 30 keV
  Dose: $2.1 \times 10^{13}/cm^2$
  Ion-incidence angle: 10 degrees In addition, ions of an impurity of the first conductivity type (n-type) are implanted by using the oblique-ion-implantation technique between Step 30 and Step 40 described earlier in order to control the concentration of an impurity in the channel forming region $CH_3$ of the current controlling junction-field-effect transistor $TR_3$ of the first conductivity type (n-type).

Conditions of the ion implantation for forming an region $SC_8$ of a first conductivity type from the side of the first conductive region $SC_2$ are listed as follows:
  Ion type: Phosphor
  Acceleration energy: 200 keV
  Dose: $1.0 \times 10^{13}/cm^2$
  Ion-incidence angle: 60 degrees
Conditions of the ion implantation for forming an region $SC_7$ of a first conductivity type from the side of the second semiconducting region $SC_3$ are listed as follows:
  Ion type: Phosphor
  Acceleration energy: 170 keV
  Dose: Described below
  Ion-incidence angle: 60 degrees Doses expressed in terms of $/cm^2$ of the ion implantation for forming an region $SC_7$ of a first conductivity type from the side of the second semiconducting region $SC_3$ are given in Table 4 below. Table 4 also shows concentrations of impurities expressed in terms of $/cm^3$ in the channel forming region $CH_3$ and the gate regions of the resulting current controlling junction-field-effect transistor $TR_3$ on columns denoted by [Impurity concentration $CH_3$] and [Impurity concentration $SC_3$] respectively. It should be noted that the gate regions are constituted by the first conductive region $SC_2$ and a portion of the second semiconducting region $SC_3$ that faces the first conductive region $SC_2$ as described earlier. It is also worth noting that the condition of a dose D3 shown in the table is that the ratio of the impurity concentration $SC_3$ to the impurity concentration $CH_3$ is 1.0, allowing the dose D3 to be used as a reference.

TABLE 4

| Case | Dose | Impurity concentration $CH_3$ | Impurity concentration $SC_3$ | Ratio |
|---|---|---|---|---|
| D1 | $1.0 \times 10^{13}$ | $5.2 \times 10^{17}$ | $1.5 \times 10^{18}$ | 2.9 |
| D2 | $2.0 \times 10^{13}$ | $8.6 \times 10^{17}$ | $1.3 \times 10^{18}$ | 1.5 |
| D3 | $3.0 \times 10^{13}$ | $1.2 \times 10^{18}$ | $1.2 \times 10^{18}$ | 1.0 |

Relations between an electric potential $V_{gate}$ of the conductive gate G and an electric potential $V_{st}$ of the second semiconducting region $SC_3$, relations between the electric potential $V_{st}$ and the information retention time as well as relations among the read-out current $I_{sub}$, the electric potential $V_{st}$ and the electric potential $V_{gate}$ of a semiconductor memory cell with a structure described above made under the conditions of ion implantation shown in Table 4 have been found by carrying out computer simulation under bias conditions shown in Table 5 given below. It should be noted that notations $V_d$, $V_{sub}$ and $V_{source}$ shown in Table 5 denote the electric potential of the write-information setting line, a predetermined electric potential and the electric potential of the second wiring respectively.

TABLE 5

| Case | $V_d$ | $V_{sub}$ | $V_{source}$ |
|---|---|---|---|
| B1 | −1.5 V | 0.5 V | 0 V |
| B2 | −1.5 V | 0.0 V | 0 V |
| B3 | 0.0 V | 0.5 V | 0 V |

Figure 19A:
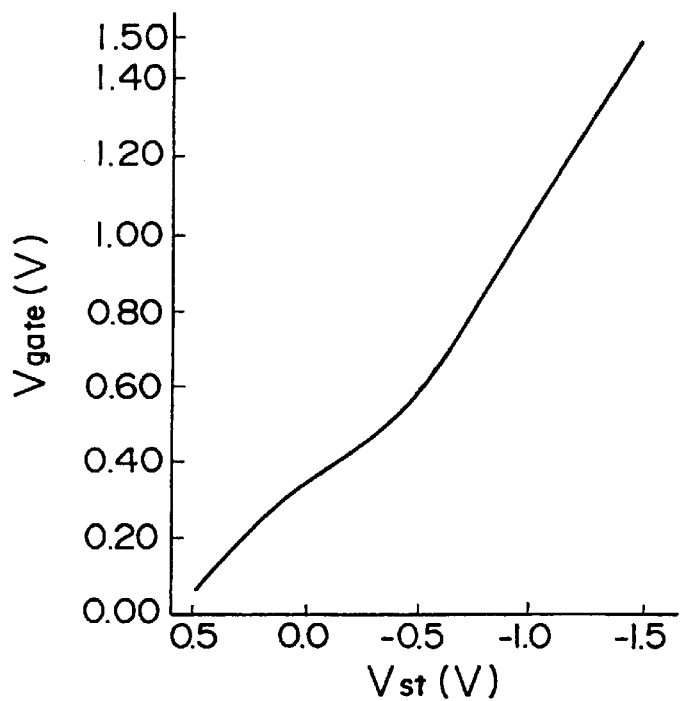
FIG. 19A is a diagram showing a curve representing a relation between the electric potential $V_{gate}$ of the conductive gate G and the electric potential $V_{st}$ of the second semiconducting region $SC_3$ to give a read-out current $I_{sub}$ of $1 \times 10^{-7}$ A under a dose condition D1 shown in Table 4 and the bias condition of a case B1 shown in Table 5 obtained as a result of computer simulation provided by the fifth embodiment.
Figure 19B:
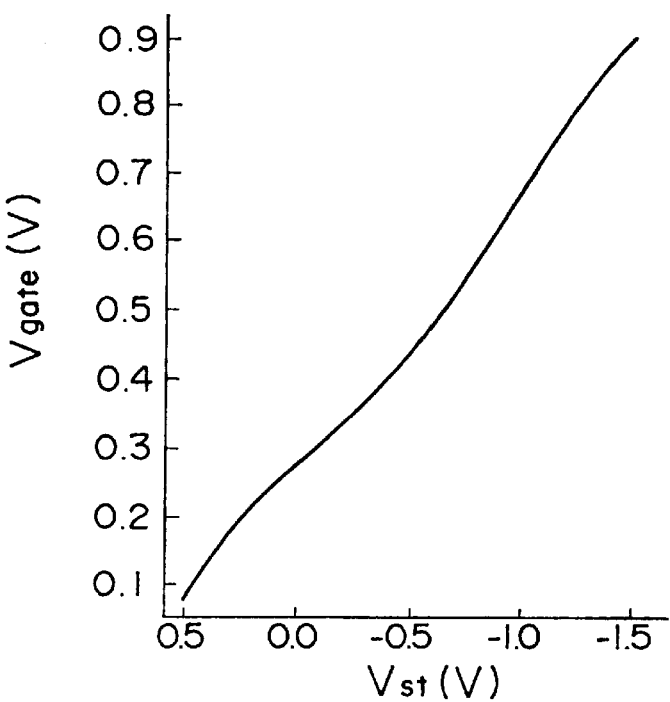
FIG. 19B is a diagram showing a curve representing a relation between the electric potential $V_{gate}$ and the electric potential $V_{st}$ to give a read-out current $I_{sub}$ of $1 \times 10^{-6}$ A under a dose-amount condition D2 and the bias condition of the case B1 obtained as a result of the computer simulation.
Figure 22A:
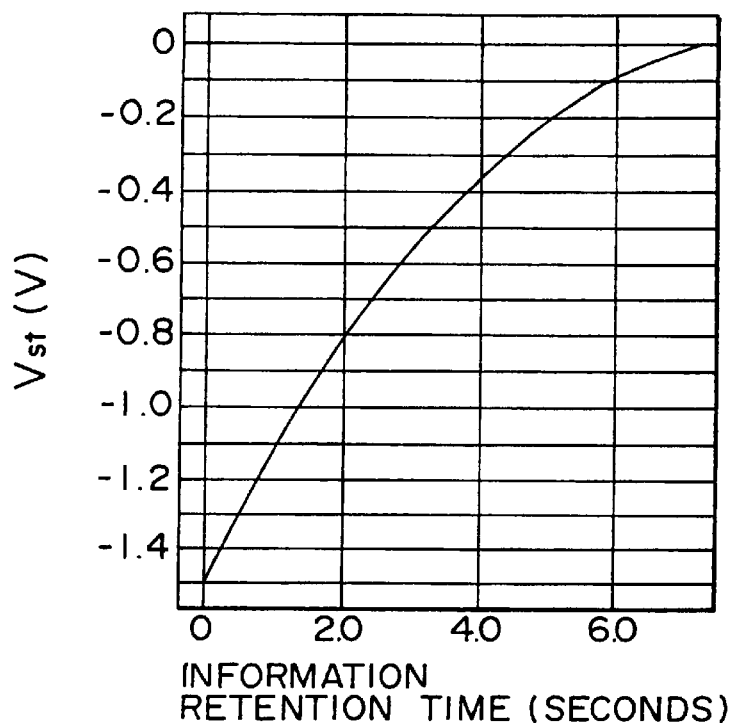
FIG. 22A is a diagram showing a curve representing a relation between the information retention time and the electric potential $V_{st}$ of the second semiconducting region $SC_3$ obtained as a result of the computer simulation under the dose condition of the case D1 and the bias condition of the case B1.
Figure 22B:
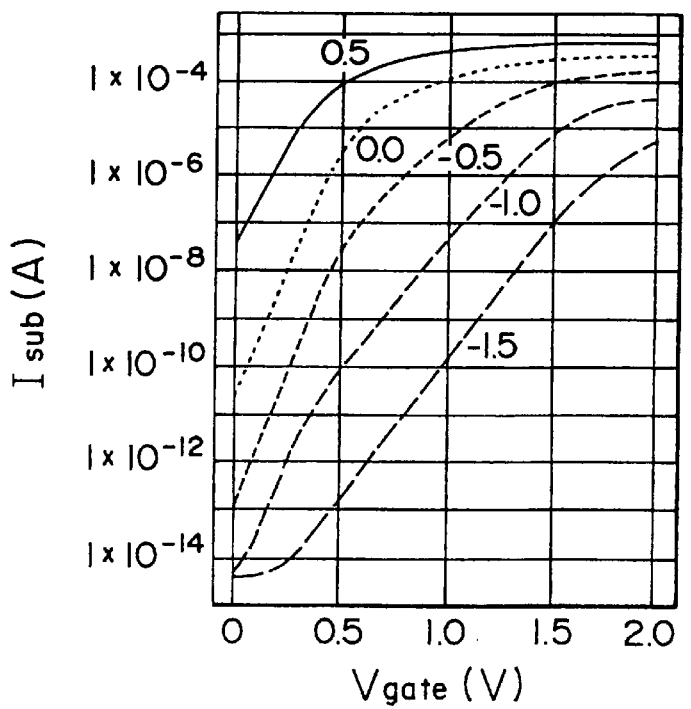
FIG. 22B is a diagram showing curves representing relations among the electric potential $V_{gate}$ of the conductive gate, the electric potential $V_{st}$ and the read-out current $I_{sub}$ obtained as a result of the computer simulation under the dose condition of the case D1 and the bias condition of the case B1.

FIG. 19A is a diagram showing a curve representing a relation between the electric potential $V_{gate}$ of the conductive gate G and the electric potential $V_{st}$ of the second semiconducting region $SC_3$ to obtain a read-out current $I_{sub}$ of $1 \times 10^{-7}$ A under a dose condition of a case D1 shown in Table 4 and the bias condition of a case B1 shown in Table 5. On the other hand, FIG. 19B is a diagram showing a curve representing a relation between the electric potential $V_{gate}$ and the electric potential $V_{st}$ to obtain a read-out current $I_{sub}$ of $1 \times 10^{-6}$ A under a dose condition of a case D2 and the bias condition of the case B1. Finally, FIG. 20 is a diagram showing a curve representing a relation between the electric potential $V_{gate}$ and the electric potential $V_{st}$ to obtain a read-out current $I_{sub}$ of $1 \times 10^{-5}$ A under a dose-amount condition of a case D3 and the bias condition of the case B1.

It is obvious from FIG. 20 that, under the dose condition of the case D3 wherein the ratio of the impurity concentration $SC_3$ to the impurity concentration $CH_3$ is 1.0, when the electric potential $V_{st}$ is changed from −1.5 V to 0 V, the increase in electric potential $V_{gate}$ is only 0.11 V. Under the dose condition of the case D2 wherein the ratio of the impurity concentration $SC_3$ to the impurity concentration $CH_3$ is 1.5, on the other hand, when the electric potential $V_{st}$ is changed from −1.5 V to 0 V, the increase in electric potential $V_{gate}$ is 0.62 V as is obvious from FIG. 19B. In addition, under the dose condition of the case D1 wherein the ratio of the impurity concentration $SC_3$ to the impurity concentration $CH_3$ is 2.9, when the electric potential $V_{st}$ is changed from −1.5 V to 0 V, the increase in electric potential $V_{gate}$ is 1.27 V, an even greater value, as is obvious from FIG. 19A. That is to say, it is obvious that, by optimizing the ratio of the impurity concentration $SC_3$ to the impurity concentration $CH_3$ (by increasing the ratio of the impurity concentration $SC_3$ to the impurity concentration $CH_3$ in the case of the fifth embodiment), an operational margin of an operation to read out information from a semiconductor memory cell can be increased as a result of turning on and off the current controlling junction-field-effect transistor $TR_3$ which, at the increased ratio, includes gate regions constituted by the first conductive region $SC_2$ and a portion of the second semiconducting region $SC_3$ facing the first conductive region $SC_2$, and the channel forming region $CH_3$ sandwiched by the first conductive region $SC_2$ and the second semiconducting region $SC_3$. It should be noted that, in some cases, it is necessary to optimize the distance between the mutually facing gate regions facing each other (that is, the thickness of the channel forming region $CH_3$) and the depth of the channel forming region $CH_3$ of the current controlling junction-field-effect transistor $TR_3$. Under the dose condition of the case D3 wherein the ratio of the impurity concentration $SC_3$ to the impurity concentration $CH_3$ is 1.0, on the other hand, the semiconductor memory cell is in a state wherein the current controlling junction-field-effect transistor $TR_3$ is not actually implemented.

A result of an analysis of an actual cross-sectional structure and impurity profile under a dose condition of the case D1 is shown in FIG. 21. For this case the impurities for JFET channel control are obliquely implanted from the left side of common polysilicon gate and the right side of common polysilicon gate. The peak of impurity profile implanted from the left side of common polysilicon gate is right down side of storage region with broadening profiling toward right down, and the peak of impurity profile implanted from the right side of common polysilicon gate is the left down side of the drain region of write-in transistor $TR_2$ with broadening profiling toward left down. For this case the broadened profiles are overlapped resulting in the peak profile at the center of JFET channel. The analysis has been carried out by setting the gate length L of the conductive gate G made of polycrystalline silicon at 0.28 micrometers, the gate width W (the width of the channel forming region) set at 10 micrometers and the thickness of the gate-oxide film serving as the barrier layer at 7 nm. As for the other dose conditions, the gate length L of the conductive gate G, the gate width W (the width of the channel forming region) and the thickness of the gate-oxide film are set at the same values. It should be noted that the distance between the mutually facing gate regions facing each other (that is, the thickness of the channel forming region $CH_3$) of the current controlling junction-field-effect transistor $TR_3$ is set at 0.1 micrometers.

Relations between the information retention time and the electric potential $V_{st}$ of the second semiconducting region $SC_3$ obtained as a result of the computer simulation under the dose conditions of the cases and the bias conditions described above are shown in FIGS. 22A to 30A. In addition, data representing relations among the electric potential $V_{gate}$ of the conductive gate G, the electric potential $V_{st}$ and the read-out current $I_{sub}$ obtained as a result of the computer simulation under the dose conditions and the bias conditions of the cases described above is shown in FIGS. 22B to 30B. It should be noted that a number appended to each curve drawn in FIGS. 22B to 30B is the value of $V_{st}$. Table 6 shows a relation between FIGS. 22A to 30A, the dose conditions as well as the bias conditions and the information retention time for the room temperature condition. It is worth noting that the information retention time shown in Table 6 is found by varying the electric potential $V_{st}$ from 0 V to −1.5 V by a decrease of 0.1 V at one time, then finding a change in hole electric charge observed in the second semiconducting region $SC_3$ under the associated bias condition and an average current flowing through the second semiconducting region $SC_3$ for each 0.1 V decrease, then dividing the change in hole electric charge by the average current to give a time for the 0.1 V decrease and, finally, summing up the times over the range 0 V to −1.5 V of the electric potential $V_{st}$.

TABLE 6

Figure 23A:
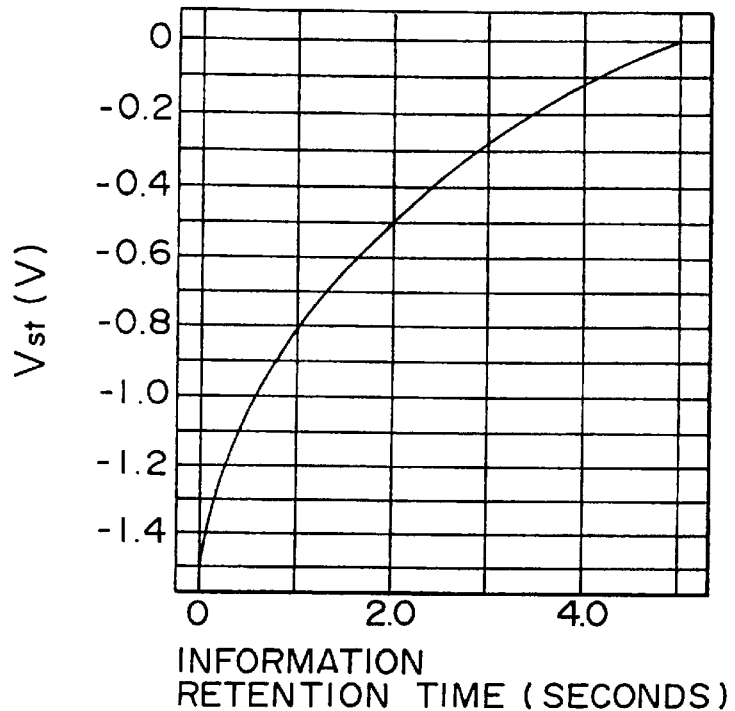
FIG. 23A is a diagram showing a curve representing a relation between the information retention time and the electric potential $V_{st}$ obtained as a result of the computer simulation under the dose condition of the case D2 and the bias condition of the case B1.
Figure 23B:
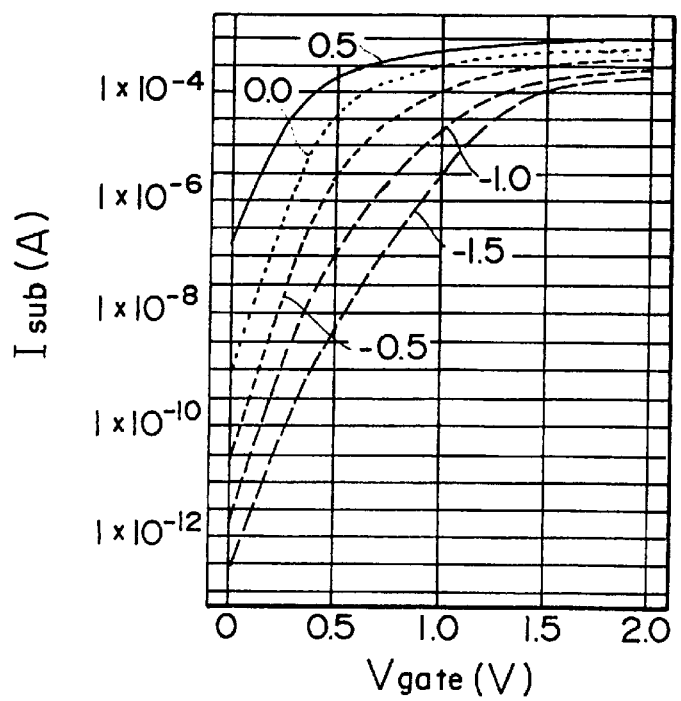
FIG. 23B is a diagram showing curves representing relations among the electric potential $V_{gate}$, the electric potential $V_{st}$ and the read-out current $I_{sub}$ obtained as a result of the computer simulation under the dose-amount condition of the case D2 and the bias condition of the case B1.
Figure 24A:
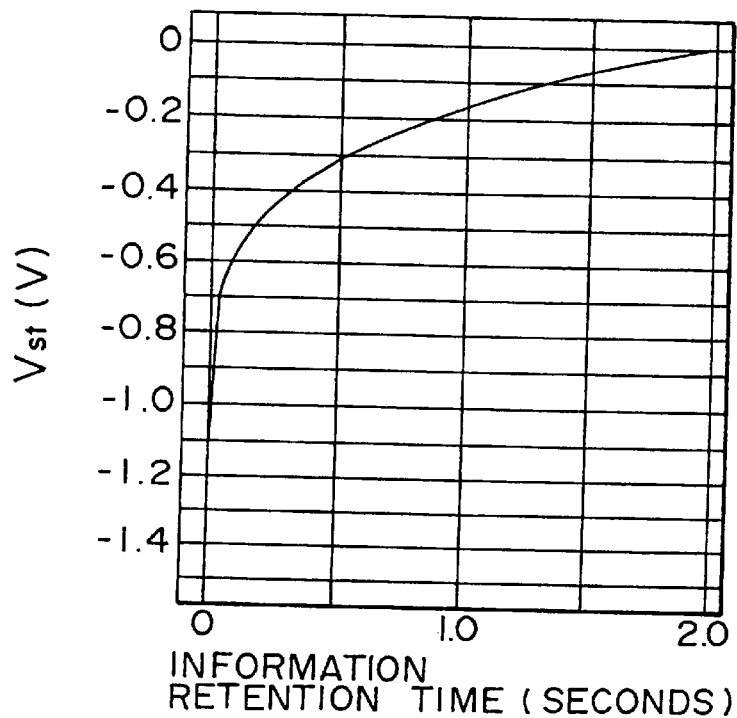
FIG. 24A is a diagram showing a curve representing a relation between the information retention time and the electric potential $V_{st}$ obtained as a result of the computer simulation under the dose-amount condition of the case D3 and the bias condition of the case B1.
Figure 24B:
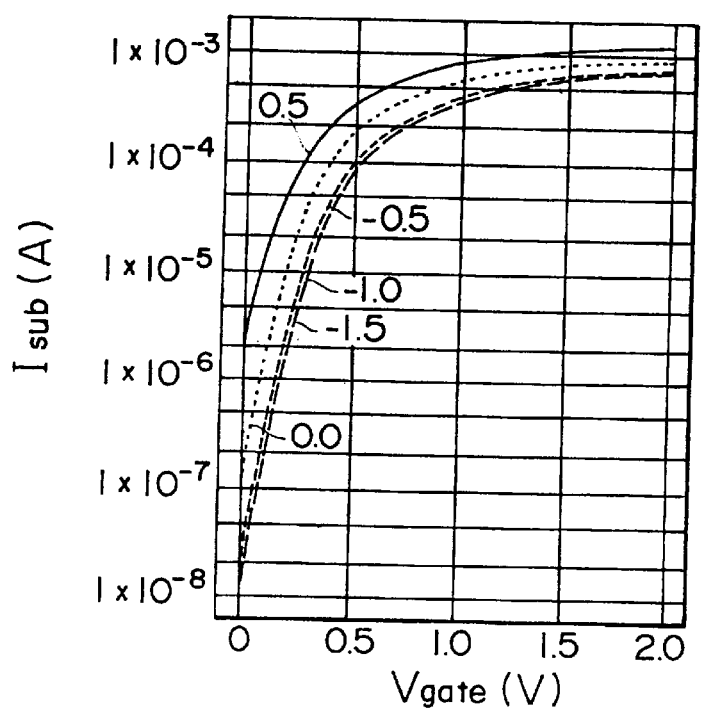
FIG. 24B is a diagram showing curves representing relations among the electric potential $V_{gate}$, the electric potential $V_{st}$ and the read-out current $I_{sub}$ obtained as a result of the computer simulation under the dose condition of the case D3 and the bias condition of the case B1.
Figure 25A:
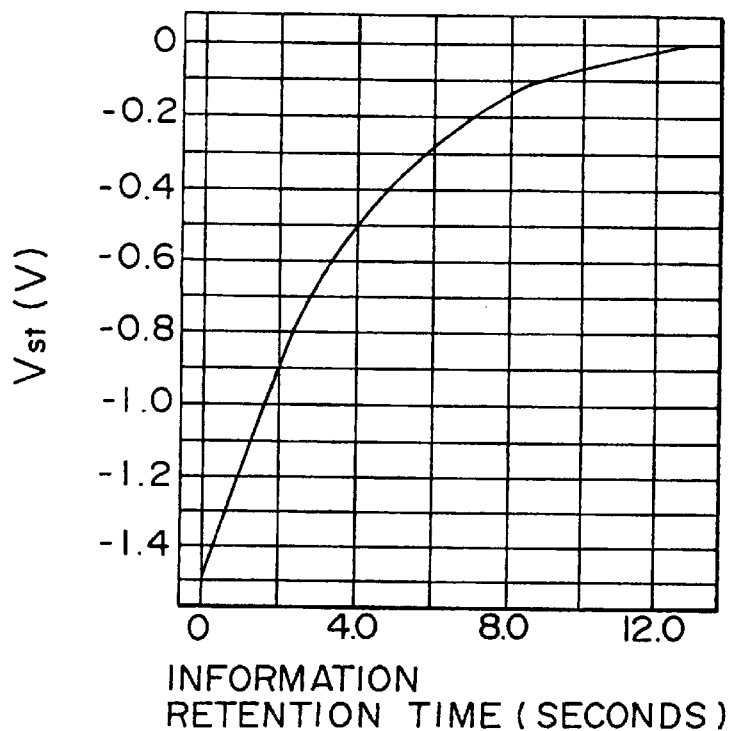
FIG. 25A is a diagram showing a curve representing a relation between the information retention time and the electric potential $V_{st}$ obtained as a result of the computer simulation under the dose condition of the case D1 and the bias condition of the case B2.
Figure 25B:
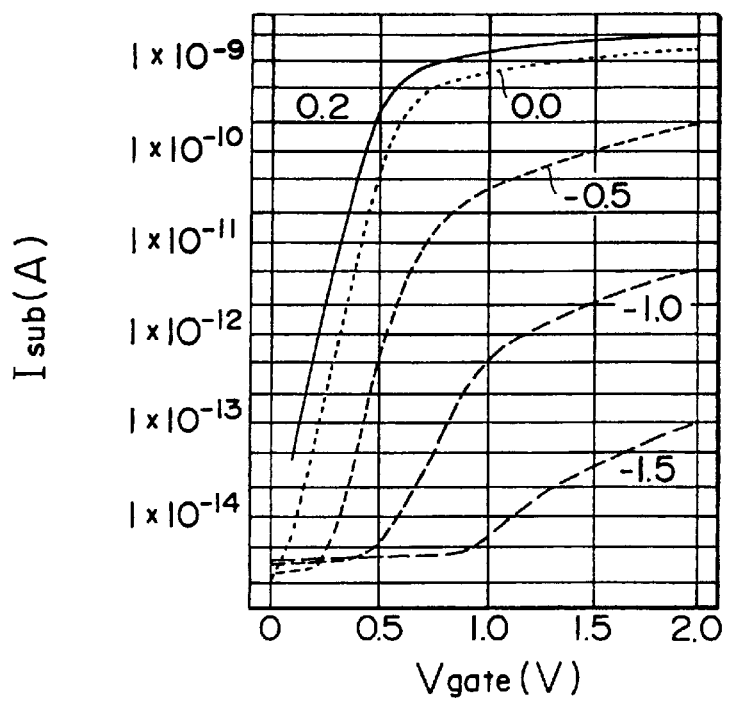
FIG. 25B is a diagram showing curves representing relations among the electric potential $V_{gate}$, the electric potential $V_{st}$ and the read-out current $I_{sub}$ obtained as a result of the computer simulation under the dose condition of the case D1 and the bias condition of the case B2.
Figure 26A:
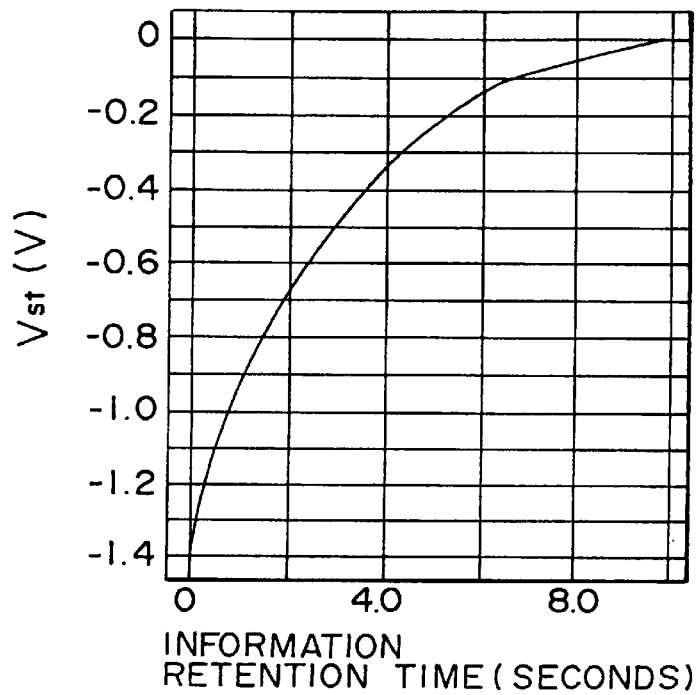
FIG. 26A is a diagram showing a curve representing a relation between the information retention time and the electric potential $V_{st}$ obtained as a result of the computer simulation under the dose condition of the case D2 and the bias condition of the case B2.
Figure 26B:
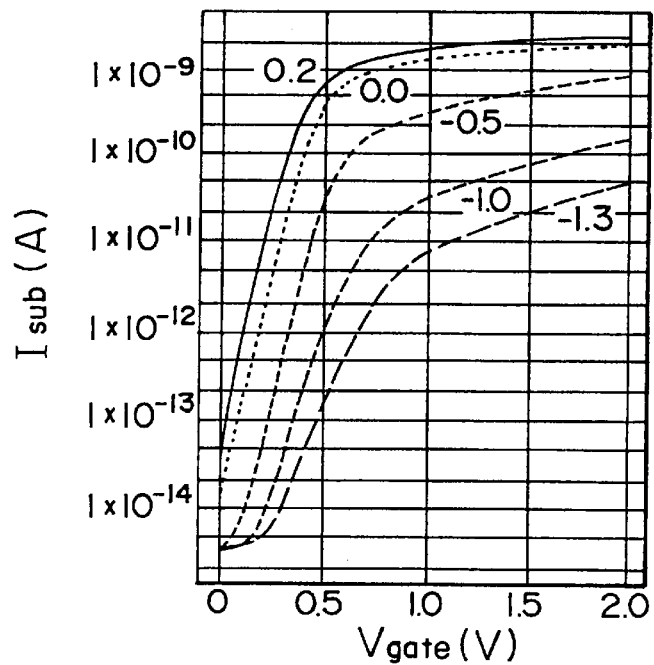
FIG. 26B is a diagram showing curves representing relations among the electric potential $V_{gate}$, the electric potential $V_{st}$ and the read-out current $I_{sub}$ obtained as a result of the computer simulation under the dose condition of the case D2 and the bias condition of the case B2.
Figure 27A:
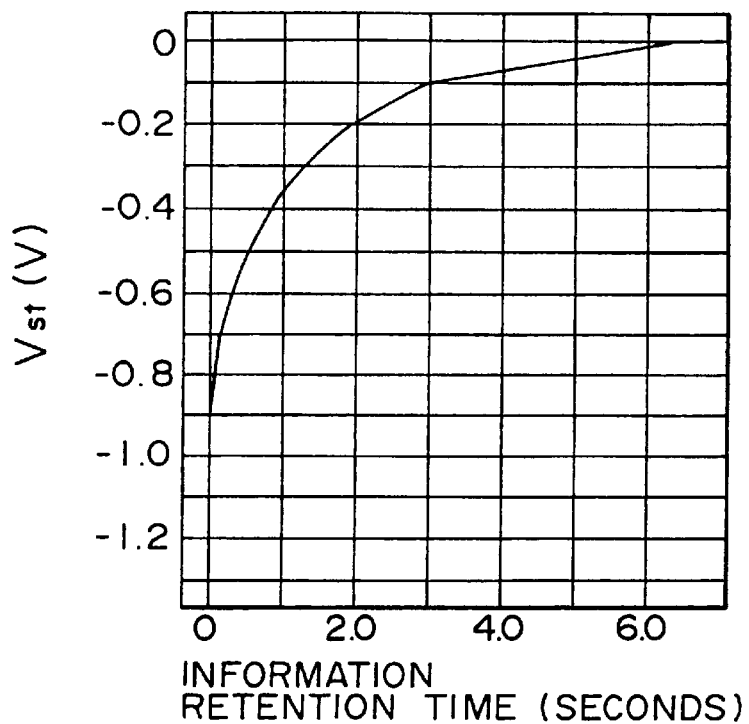
FIG. 27A is a diagram showing a curve representing a relation between the information retention time and the electric potential $V_{st}$ obtained as a result of the computer simulation under the dose condition of the case D3 and the bias condition of the case B2.
Figure 27B:
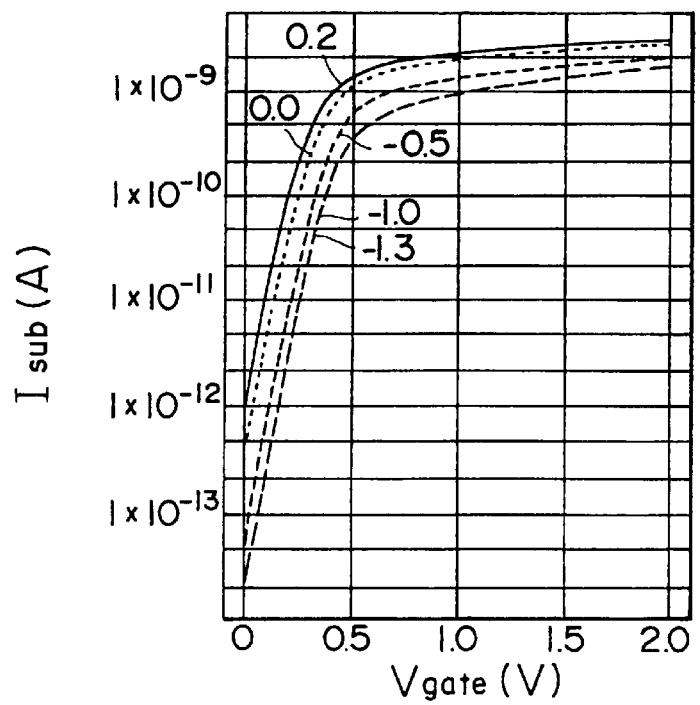
FIG. 27B is a diagram showing curves representing relations among the electric potential $V_{gate}$, the electric potential $V_{st}$ and the read-out current $I_{sub}$ obtained as a result of the computer simulation under the dose condition of the case D3 and the bias condition of the case B2.
Figure 28A:
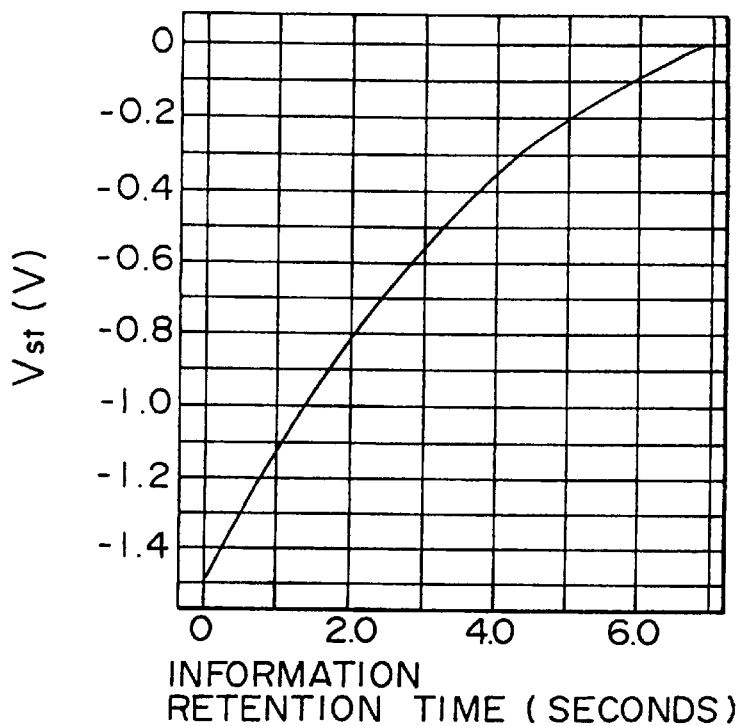
FIG. 28A is a diagram showing a curve representing a relation between the information retention time and the electric potential $V_{st}$ obtained as a result of the computer simulation under the dose condition of the case D1 and the bias condition of the case B3.
Figure 28B:
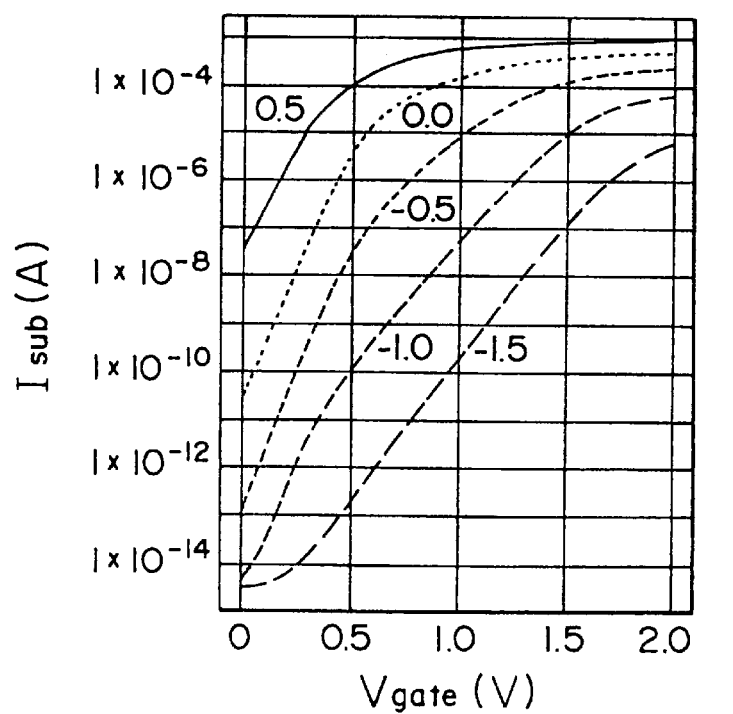
FIG. 28B is a diagram showing curves representing relations among the electric potential $V_{gate}$, the electric potential $V_{st}$ and the read-out current $I_{sub}$ obtained as a result of the computer simulation under the dose condition of the case D1 and the bias condition of the case B3.
Figure 29A:
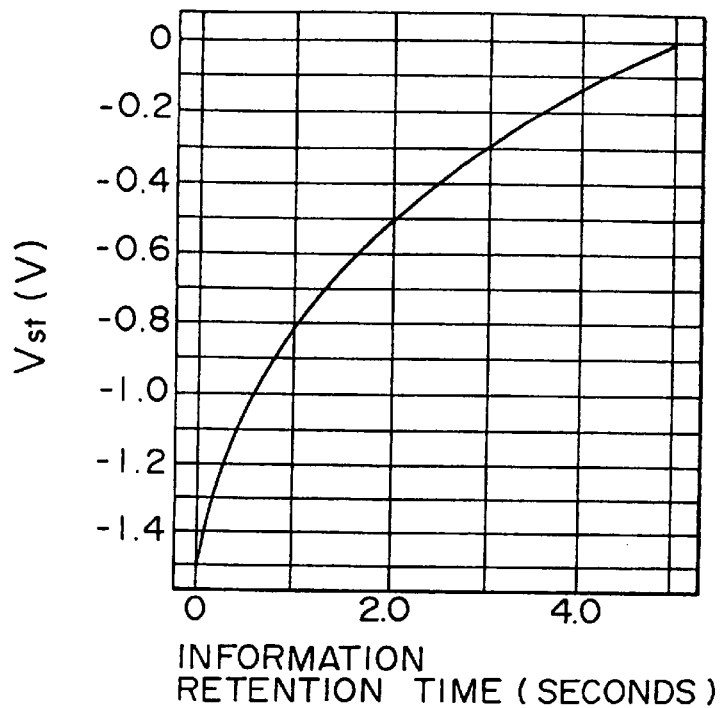
FIG. 29A is a diagram showing a curve representing a relation between the information retention time and the electric potential $V_{st}$ obtained as a result of the computer simulation under the dose condition of the case D2 and the bias condition of the case B3.
Figure 29B:
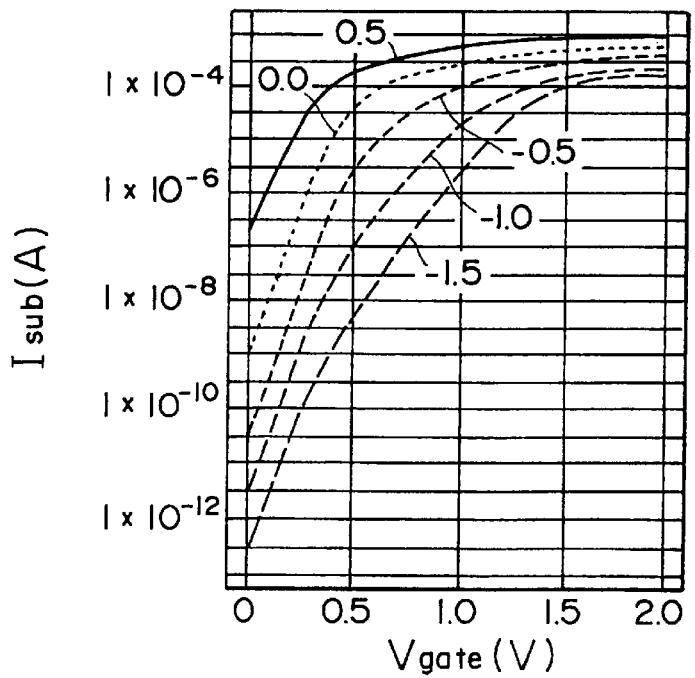
FIG. 29B is a diagram showing curves representing relations among the electric potential $V_{gate}$, the electric potential $V_{st}$ and the read-out current $I_{sub}$ obtained as a result of the computer simulation under the dose condition of the case D2 and the bias condition of the case B3.
Figure 30A:
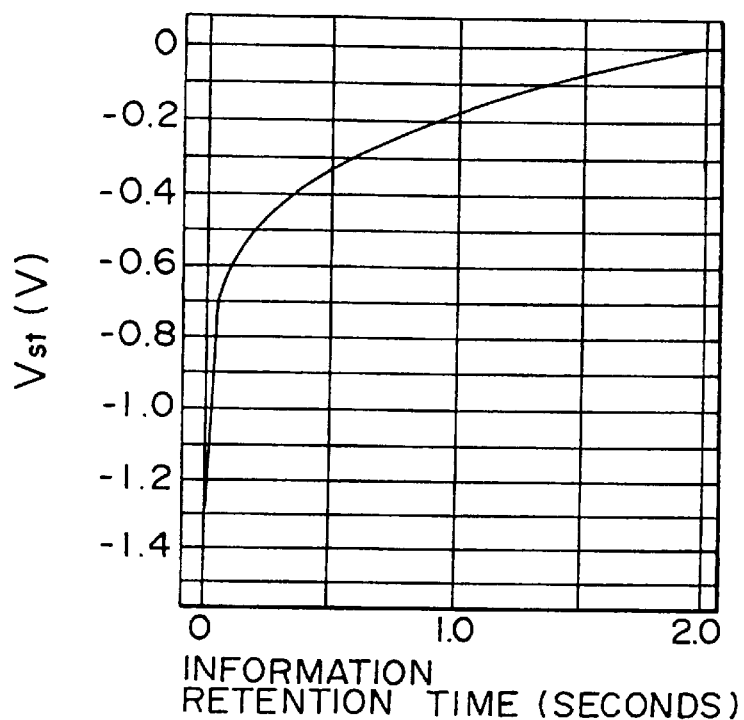
FIG. 30A is a diagram showing a curve representing a relation between the information retention time and the electric potential $V_{st}$ obtained as a result of the computer simulation under the dose condition of the case D3 and the bias condition of the case B3.
Figure 30B:
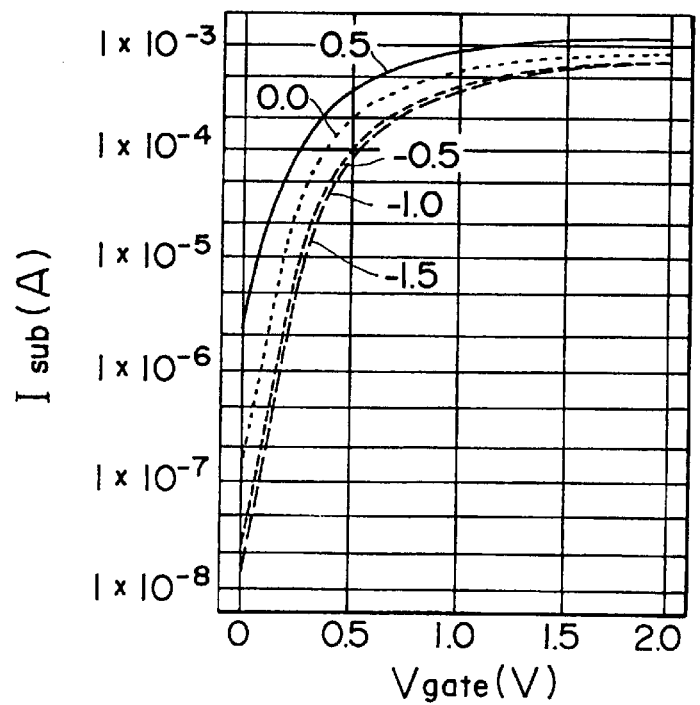
FIG. 30B is a diagram showing curves representing relations among the electric potential $V_{gate}$, the electric potential $V_{st}$ and the read-out current $I_{sub}$ obtained as a result of the computer simulation under the dose condition of the case D3 and the bias condition of the case B3.

|  | Case notation of Dose | Case notation of bias | Information retention time (second) |
|---|---|---|---|
| FIG. 22 | D1 | B1 | 2.01 |
| FIG. 23 | D2 | B1 | 1.02 |
| FIG. 24 | D3 | B1 | 0.022 |
| FIG. 25 | D1 | B2 | 2.42 |
| FIG. 26 | D2 | B2 | 1.45 |
| FIG. 27 | D3 | B2 | 0.090 |
| FIG. 28 | D1 | B3 | 2.02 |
| FIG. 29 | D2 | B3 | 1.03 |
| FIG. 30 | D3 | B3 | 0.026 |

It is obvious from FIGS. 22A to 30B that, in the case in which the dose concentration $SC_3$ to the impurity concentration $CH_3$ is high, a margin of the read-out current $I_{sub}$ can be gained by the turning-on and off operations of the current controlling junction-field-effect transistor $TR_3$. As a result, it is possible to obtain an information retention time in the range 2.01 to 2.42 seconds. Under the dose condition of the case D3 wherein the ratio of the impurity concentration $SC_3$ to the impurity concentration $CH_3$ is 1.0, on the other hand, the semiconductor memory cell is in a state wherein the current controlling junction-field-effect transistor $TR_3$ is not actually implemented as described above, making it impossible to gain a margin of the read-out current $I_{sub}$. As a result, only an information retention time in the range 22 to 90 msec can be obtained.

Embodiment 6

Much like the fifth embodiment, in a sixth embodiment, the operation to read information from the semiconductor memory cell according to the second aspect of the present invention shown in FIG. 11A is examined by computer simulation. The sixth embodiment is different from the fifth embodiment in that, in the case of the former, the conditions of the ion implantation based on the oblique-ion-implantation process for forming the second semiconducting region $SC_3$ of the second conductivity type (p-type) which corresponds to Step 30 explained earlier are differently set below. It should be noted that the implantation of ions is done twice at different ion-incidence angles.

Case D4

First ion implantation
    Ion type: Boron
    Acceleration energy: 10 keV
    Dose: $3.4 \times 10^{13}/cm^2$
    Ion-incidence angle: 60 degrees
Second ion implantation
    Ion type: Boron
    Acceleration energy: 30 keV
    Dose: $2.1 \times 10^{13}/cm^2$
    Ion-incidence angle: 10 degrees Case D5

First ion implantation
    Ion type: Boron
    Acceleration energy: 10 keV

Dose: $6.8\times10^{13}/cm^2$

Ion-incidence angle: 60 degrees

Second ion implantation

Ion type: Boron

Acceleration energy: 30 keV

Dose: $4.2\times10^{13}/cm^2$

Ion-incidence angle: 10 degrees

As explained before, ions of an impurity of the first conductivity type (n-type) are implanted by using the oblique-ion-implantation technique between Step 30 and Step 40 described earlier in order to control the concentration of an impurity in the channel forming region $CH_3$ of the current controlling junction-field-effect transistor (JFET) $TR_3$ of the first conductivity type (n-type).

Conditions of the ion implantation for forming an region $SC_8$ of a first conductivity type from the side of the first conductive region $SC_2$ are listed as follows:

Ion type: Phosphor

Acceleration energy: 200 keV

Dose: $1.0\times10^{13}/cm^2$

Ion-incidence angle: 60 degrees

Conditions of the ion implantation for forming an region $SC_7$ of a first conductivity type from the side of the second semiconducting region $SC_3$ are listed as follows (the same as the case D3):

Ion type: Phosphor

Acceleration energy: 170 keV

Dose: $3\times10^{13}/cm^2$

Ion-incidence angle: 60 degrees

It should be noted that the computer simulation has been carried out by setting the gate length L of the conductive gate G made of polycrystalline silicon at 0.28 microns, the length W in depth (the width of the channel forming region) set at 10 microns and the thickness of the gate-oxide film serving as the barrier layer at 7 nm. The distance between the mutually facing gate regions facing each other (that is, the thickness of the channel forming region $CH_3$) of the current controlling junction field-effect transistor $TR_3$ is set at 0.1 microns.

Table 7 also shows concentrations of impurities expressed in terms of /cm$^3$ in the channel forming region $CH_3$ and the gate regions of the resulting current controlling junction-field-effect transistor $TR_3$ on columns denoted by [Impurity concentration $CH_3$] and [Impurity concentration $SC_3$] respectively. It should be noted that the gate regions are implemented by the first conductive region $SC_2$ and a portion of the second semiconducting region $SC_3$ that faces the first conductive region $SC_2$ as described earlier.

TABLE 7

| Case | Impurity concentration $CH_3$ | Impurity concentration $SC_3$ | Ratio |
|---|---|---|---|
| D4 | $1.2 \times 10^{18}$ | $1.1 \times 10^{18}$ | 0.92 |
| D5 | $1.2 \times 10^{18}$ | $2.8 \times 10^{18}$ | 2.3 |

Figure 31A:
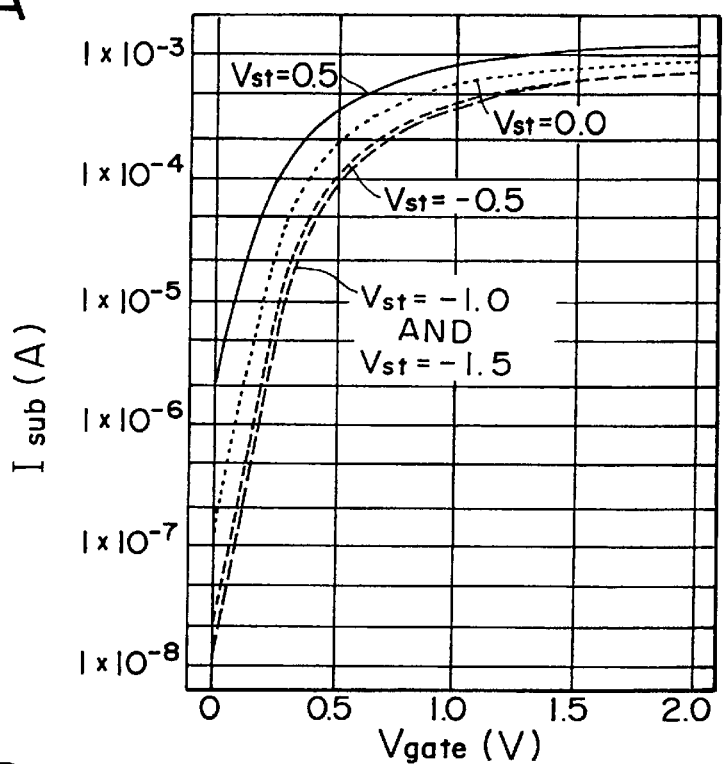
FIGS. 31A and 31B are diagrams each showing relations among the electric potential $V_{gate}$ of the conductive gate, the electric potential $V_{st}$ and the read-out current $I_{sub}$ obtained as a result of computer simulation provided by a sixth embodiment carried out under dose conditions of cases D4 and D5 shown in Table 7 and a bias condition wherein $V_d = -1.5$ V, $V_{sub} = 0.5$ V and $V_{source} = 0$ V.
Figure 31B:
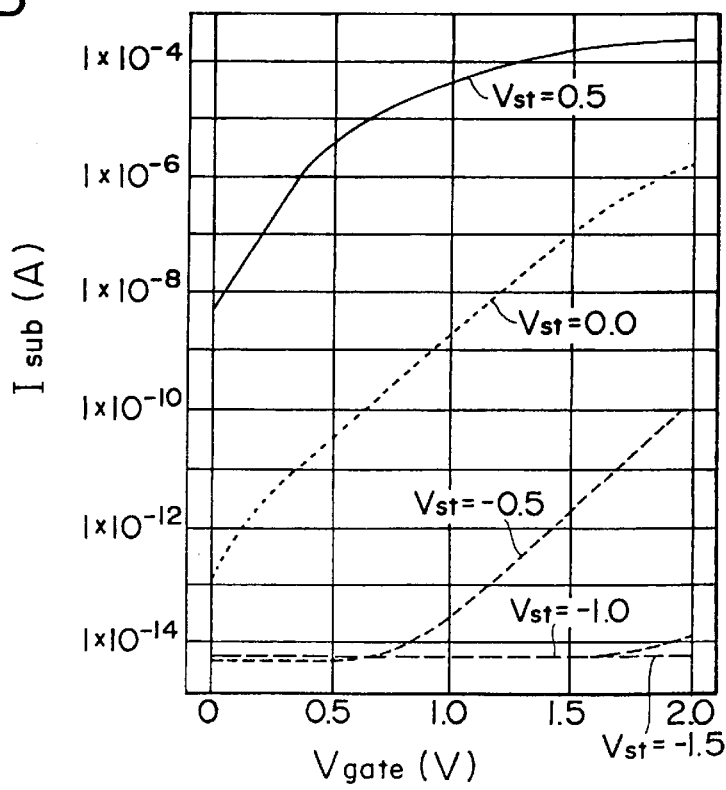
Figure 32:
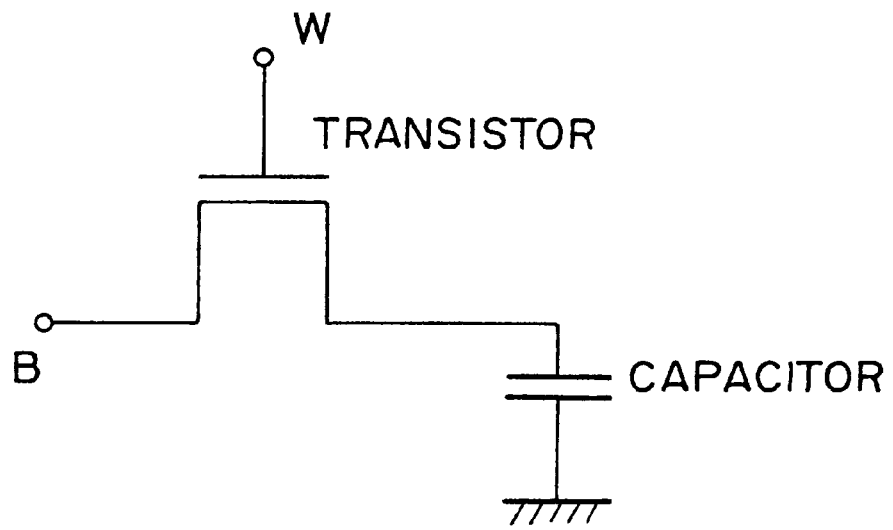
FIG. 32 is a conceptual diagram showing a related art one-transistor semiconductor memory cell.
Figure 33:
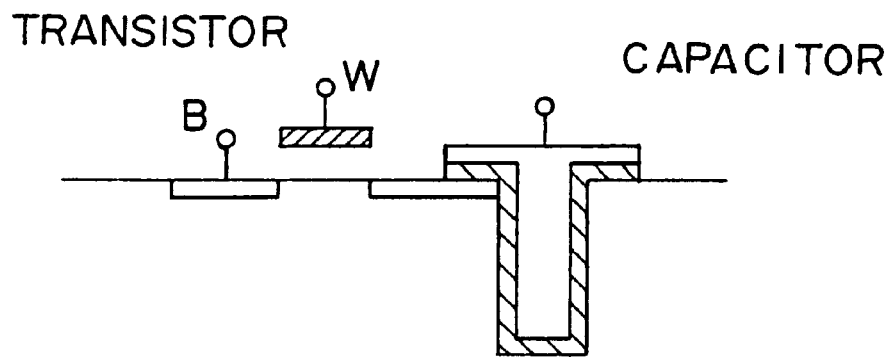
FIG. 33 is a diagram showing a cross section of a semiconductor memory cell having a related art trench capacitor cell structure.

FIGS. 31A and 31B are diagrams each showing relations among the electric potential $V_{gate}$ of the conductive gate G, the electric potential $V_{st}$ of the second semiconducting region $SC_3$ and the read-out current $I_{sub}$ obtained as a result of the computer simulation carried out under the dose conditions of the cases D4 and D5 shown in Table 7 and the bias conditions wherein $V_d=-1.5$ V, $V_{sub}=0.5$ V and $V_{source}=0$ V. For example, for $V_{gate}=1.0$ V, when the electric potential $V_{st}$ is varied from 0 V to $-0.5$ V, the ratio of the read-out current $I_{sub}$ at $V_{st}=0$ V to the read-out current $I_{sub}$ at $V_{st}=-0.5$ V ($I_{sub}(V_{st}=0V)/I_{sub}(V_{st}=-0.5V)$) is 2 for the case D4 and $10^5$ for the case D5. As described above, it is obvious that, by optimizing the ratio of the impurity concentration $SC_3$ to the impurity concentration $CH_3$ (by increasing the ratio of the impurity concentration $SC_3$ to the impurity concentration $CH_3$ in the case of the sixth embodiment), an operational margin of an operation to read out information from a semiconductor memory cell can be increased as a result of turning on and off the current controlling junction-field-effect transistor $TR_3$ which, at the increased ratio, includes gate regions constituted by the first conductive region $SC_2$ and a portion of the second semiconducting region $SC_3$ facing the first conductive region $SC_2$, and the channel forming region $CH_3$ sandwiched by the first conductive region $SC_2$ and the second semiconducting region $SC_3$. It should be noted that, in some cases, it is necessary to optimize the distance between the mutually facing gate regions facing each other (that is, the thickness of the channel forming region $CH_3$) and the depth of the channel forming region $CH_3$ of the current controlling junction-field-effect transistor $TR_3$. Under the dose condition of the case D4 wherein the ratio of the impurity concentration $SC_3$ to the impurity concentration $CH_3$ is 0.92, on the other hand, the semiconductor memory cell is in a state wherein the current controlling junction-field-effect transistor $TR_3$ is not actually implemented.

Embodiment 7

Figure 2B:
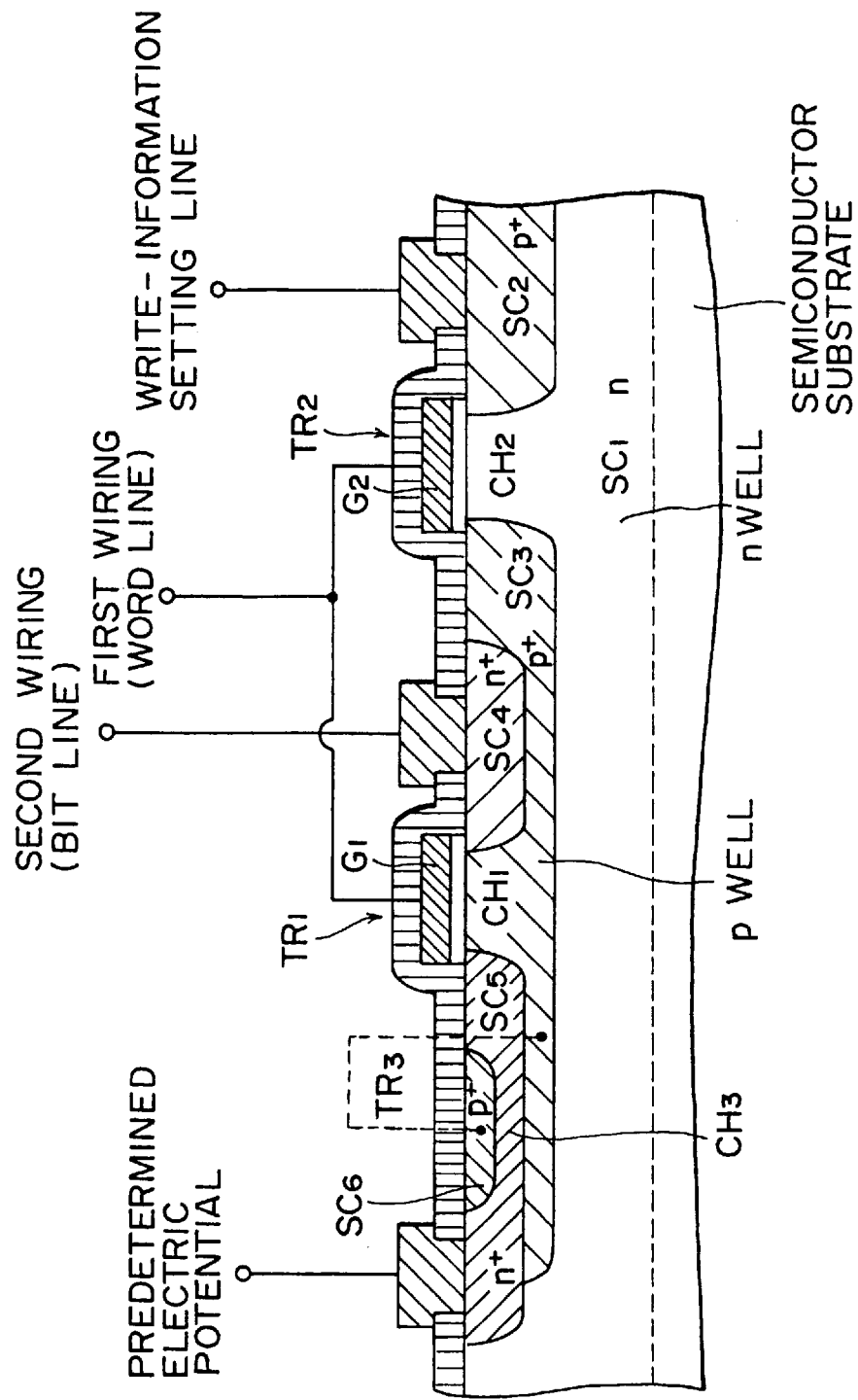
FIG. 2B is a diagram typically showing a partial cross section of the semiconductor memory cell according to the modified embodiment of the first embodiment of the present invention.

Embodiment 7 is modified from Embodiment 1, in which, as shown in FIGS. 1B and 2B, (1) the first conductive region $SC_2$ is connected to a write-information setting line, (2) the third conductive region $SC_6$ is connected or contacted to the second semiconducting region $SC_3$, and the rest are the same as the case of Embodiment 1.

Figure 2C:
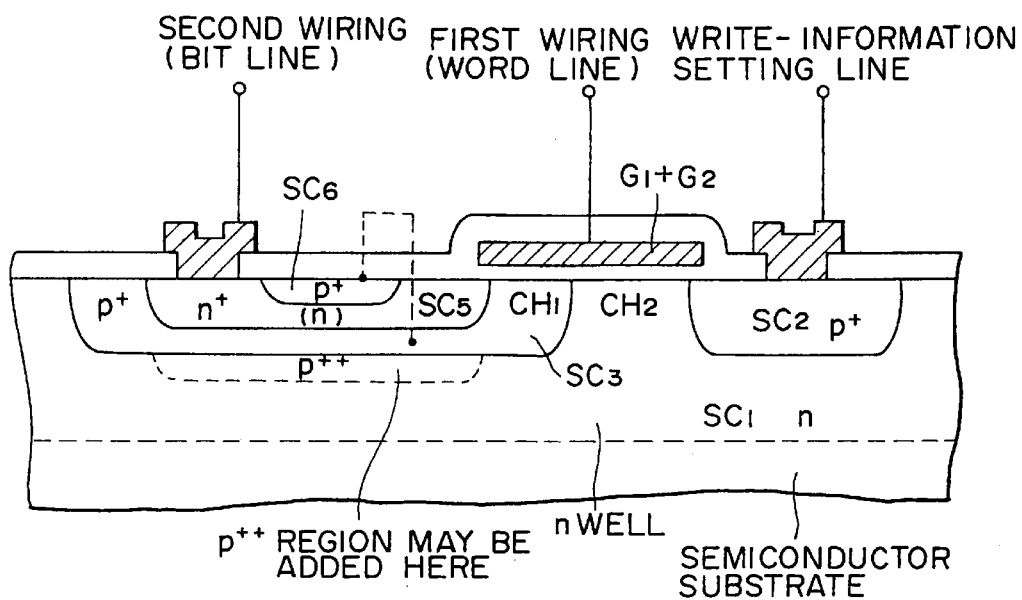
FIG. 2C is a diagram typically showing a partial cross section of the semiconductor memory cell according to a merged embodiment of the modified first embodiment of the present invention.
Figure 2D:
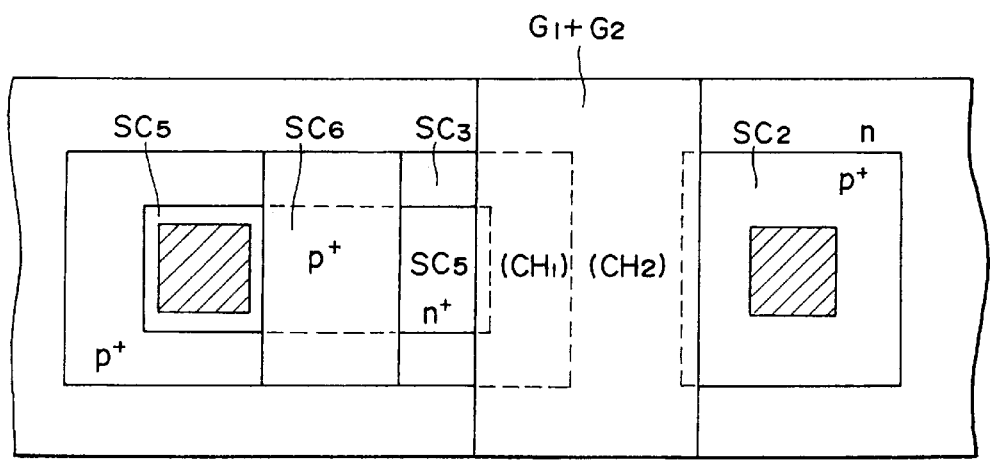
FIG. 2D is a diagram typically showing a partial top view of the semiconductor memory cell according to the merged embodiment of the modified first embodiment of the present invention.

For example, the arrangement of the third conductive region $SC_6$ and the second semiconducting region $SC_3$ is treated in the same way as Embodiment 8 as shown in FIG. 2D.

Embodiment 8

In Embodiment 8, the second conductive region $SC_4$ in FIG. 2B is merged to the first semiconducting region SC1, and gates $G_1$ and $G_2$ are made common. The third semiconducting region $SC_5$ is isolated from the first semiconducting region by the second semiconducting region as shown in FIGS. 2C and 2D. The bit line is connected to the third semiconducting region $SC_5$ at the opposite part of the common gate with reference to the third conductive region. Thus a small cell area and small bit line leakage current is attained.

For this case another junction-field-effect transistor may be added, which is realized by:

gate regions constituted by the first conductive region $SC_2$ and a portion of the second semiconducting region $SC_3$ facing the first conductive region $SC_2$;

one source/drain region constituted by the surface region of the first semiconducting region $SC_1$ sandwiched by the first conductive region $SC_2$ and the second semiconducting region $SC_3$ and used as one of the source/drain regions of the read-out transistor $TR_1$ as well as used as the channel forming region $CH_2$ of the switching transistor $TR_2$;

a channel forming region CH₃ constituted by a portion of the first semiconducting region SC₁ beneath the above source/drain region of the current controlling junction-field-effect transistor sandwiched by the first conductive region SC₂ and the second semiconducting region SC₃; and another source/drain region constituted by a portion of the first semiconducting region SC₁ beneath the channel forming region of the current controlling junction-field-effect transistor sandwiched by the first conductive region SC₂ and the second semiconducting region SC₃.

Embodiment 9

Figure 2E:
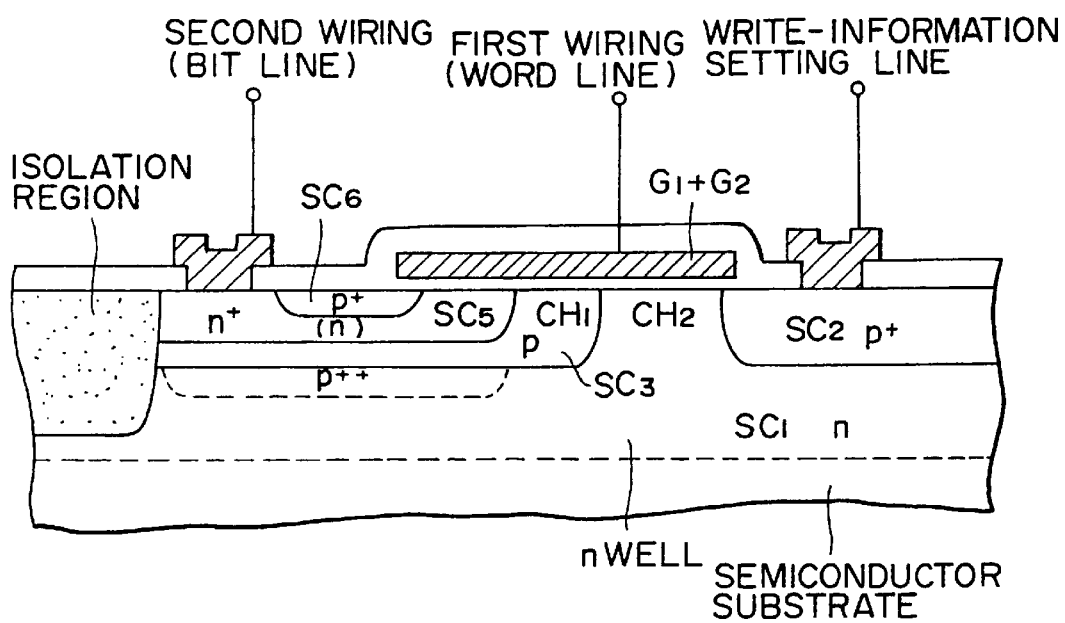
FIG. 2E is a diagram typically showing a partial cross section of the semiconductor memory cell according to a further merged embodiment of the modified first embodiment of the present invention.
Figure 2F:
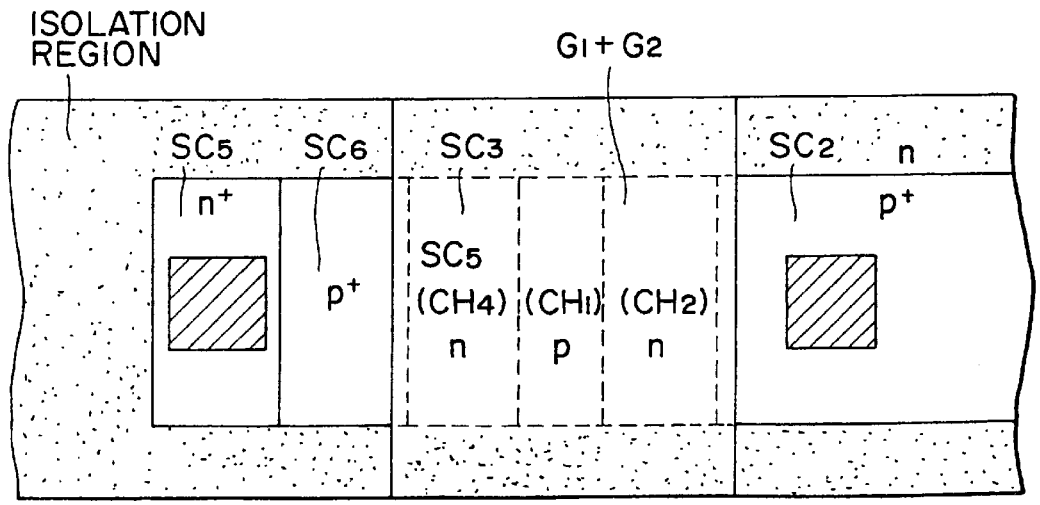
FIG. 2F is a diagram typically showing a partial top view of the semiconductor memory cell according to the further merged embodiment of the modified first embodiment of the present invention.

In Embodiment 9, the conductive gate (G1+G2) further extends on the barrier layer over a part of the third semiconducting region SC₅ which is sandwiched by the second semiconducting region SC₃ and the third conductive region SC₆. The conductive gate bridges between the second semiconducting region SC₃ and the third conductive region SC₆ as shown in FIGS. 2E and 2F.

The third conductive region is not necessarily extended nor connected to the second semiconducting region SC₃. The conductive gate bias can induce a channel in the surface of the third semiconducting region SC₅ sandwiched between the regions SC₃ and SC₆, and thus the electric potential of the second semiconducting region SC₃ can be transferred to the third conductive region SC₆. This arrangement further reduces the cell size.

For this case another junction-field-effect transistor may be added, which is realized by:

gate regions constituted by the first conductive region SC₂ and a portion of the second semiconducting region SC₃ facing the first conductive region SC₂;

one source/drain region constituted by the surface region of the first semiconducting region SC₁ sandwiched by the first conductive region SC₂ and the second semiconducting region SC₃ and used as one of the source/drain regions of the read-out transistor TR₁ as well as used as the channel forming region CH₂ of the switching transistor TR₂;

a channel forming region CH₃ constituted by a portion of the first semiconducting region SC₁ beneath the above source/drain region of the current controlling junction-field-effect transistor sandwiched by the first conductive region SC₂ and the second semiconducting region SC₃; and another source/drain region constituted by a portion of the first semiconducting region SC₁ beneath the channel forming region of the current controlling junction-field-effect transistor sandwiched by the first conductive region SC₂ and the second semiconducting region SC₃.

It should be noted that, while the present invention has been described with reference to the first to eighth illustrative embodiments, the description is not intended to be construed in a limiting sense. That is to say, it is to be understood that the subject matter encompassed by the present invention is not limited to the eight embodiments. The structures of the semiconductor memory cells and the values of quantities such as voltages and electric potentials explained through the embodiments of the present invention are no more than typical and thus can be changed appropriately. In addition, for example, in the semiconductor memory cells provided by the embodiments of the present invention, the read-out transistor TR₁ and the current controlling junction-field-effect transistor TR₃ can each be implemented by a p-type transistor while the switching transistor TR₂ can be implemented by an n-type transistor. The layout of components composing each of the transistors is also typical and thus can be modified appropriately. In addition, the introduction of impurities to a variety of regions does not have to be carried out by using the ion-implantation process. Instead, impurities can also be implanted by a diffusion process as well.

It should be noted that the present invention can also be applied only to a semiconductor memory cell made of a silicon semiconductor but also to a semiconductor memory cell made of a compound semiconductor such as a material of the GaAs group.

What is claimed is:

1. A semiconductor memory cell including a read-out transistor of a first conductivity type, a switching transistor of a second conductivity type, and a current controlling junction-field-effect transistor of the first conductivity type, said semiconductor memory cell comprising:

(a) a first semiconducting region of a first conductivity type;

(b) a first conductive region formed in a surface region of said first semiconducting region in contact with said first semiconducting region to form a rectifying junction in conjunction with said first semiconducting region;

(c) a second semiconducting region of a second conductivity type formed in a surface region of said first semiconducting region separated away from said first conductive region;

(d) a second conductive region formed in a surface region of said second semiconducting region in contact with said second semiconducting region to form a rectifying junction in conjunction with said second semiconducting region;

(e) a third semiconducting region of a first conductivity type formed in a surface region of said second semiconducting region separated away from said second conductive region in contact with said second semiconducting region to form a rectifying junction in conjunction with said second semiconducting region and extended to a surface region of said first semiconducting region; and (f) a third conductive region formed in a surface region of said third semiconducting region in contact with said third semiconducting region to form a rectifying junction in conjunction with said third semiconducting region, wherein:

(A-1) source/drain regions of said read-out transistor are constituted by said second conductive region and said third semiconducting region;

(A-2) a channel forming region of said read-out transistor is constituted by a surface region of said second semiconducting region sandwiched by said second conductive region and said third semiconducting region;

(A-3) a conductive gate of said read-out transistor is formed on a barrier layer provided on said surface region of said second semiconducting region sandwiched by said second conductive region and said third semiconducting region;

(B-1) source/drain regions of said switching transistor are constituted by said first conductive region and said second semiconducting region;

(B-2) a channel forming region of said switching transistor is constituted by a surface region of said first semiconducting region sandwiched by said first conductive region and said second semiconducting region;

(B-3) a conductive gate of said switching transistor is formed on a barrier layer provided on said surface region of said first semiconducting region sandwiched by said first conductive region and said second semiconducting region;

(C-1) gate regions of said current controlling junction-field-effect transistor are constituted by said third conductive region and a portion of said second semiconducting region facing said third conductive region;

(C-2) a channel region of said current controlling junction-field-effect transistor is constituted by a portion of said third semiconducting region sandwiched by said third conductive region and said second semiconducting region;

(C-3) one source/drain region of said current controlling junction-field-effect transistor is extended from one end of said channel region of said current controlling junction-field-effect transistor, being constituted by a portion of said third semiconducting region composing said source/drain region of said read-out transistor, and another source/drain region of said current controlling junction-field-effect transistor is extended from the other end of said channel region of said current controlling junction-field-effect transistor, being constituted by a portion of said third semiconducting region extended to a surface region of said first semiconducting region;

(D) said conductive gate of said read-out transistor and said conductive gate of said switching transistor are connected to a first wiring for selecting semiconductor memory cells;

(E) said first conductive region and said third conductive region are connected to a write-information setting line;

(F) said second conductive region is connected to a second wiring for selecting semiconductor memory cells; and (G) said other source/drain region of said current controlling junction-field-effect transistor is connected to a predetermined electric potential.

2. A semiconductor memory cell including a read-out transistor of a first conductivity type, a switching transistor of a second conductivity type, and a current controlling junction-field-effect transistor of the first conductivity type, said semiconductor memory cell comprising:

(a) a first semiconducting region of a first conductivity type;

(b) a first conductive region formed in a surface region of said first semiconducting region in contact with said first semiconducting region to form a rectifying junction in conjunction with said first semiconducting region;

(c) a second semiconducting region of a second conductivity type formed in a surface region of said first semiconducting region separated away from said first conductive region;

(d) a second conductive region formed in a surface region of said second semiconducting region in contact with said second semiconducting region to form a rectifying junction in conjunction with said second semiconducting region;

(e) a third semiconducting region of a first conductivity type formed in a surface region of said second semiconducting region separated away from said second conductive region in contact with said second semiconducting region to form a rectifying junction in conjunction with said second semiconducting region and extended to a surface region of said first semiconducting region; and (f) a third conductive region formed in a surface region of said third semiconducting region in contact with said third semiconducting region to form a rectifying junction in conjunction with said third semiconducting region, wherein:

(A-1) source/drain regions of said read-out transistor are constituted by said second conductive region and said third semiconducting region;

(A-2) a channel forming region of said read-out transistor is constituted by a surface region of said second semiconducting region sandwiched by said second conductive region and said third semiconducting region;

(A-3) a conductive gate of said read-out transistor is formed on a barrier layer provided on said surface region of said second semiconducting region sandwiched by said second conductive region and said third semiconducting region;

(B-1) source/drain regions of said switching transistor are constituted by said first conductive region and said second semiconducting region;

(B-2) a channel forming region of said switching transistor is constituted by a surface region of said first semiconducting region sandwiched by said first conductive region and said second semiconducting region;

(B-3) a conductive gate of said switching transistor is formed on a barrier layer provided on said surface region of said first semiconducting region sandwiched by said first conductive region and said second semiconducting region;

(C-1) gate regions of said current controlling junction-field-effect transistor are constituted by said third conductive region and a portion of said second semiconducting region facing said third conductive region;

(C-2) a channel region of said current controlling junction-field-effect transistor is constituted by a portion of said third semiconducting region sandwiched by said third conductive region and said second semiconducting region;

(C-3) one source/drain region of said current controlling junction-field-effect transistor is extended from one end of said channel region of said current controlling junction-field-effect transistor, being constituted by a portion of said third semiconducting region composing said source/drain region of said read-out transistor, and another source/drain region of said current controlling junction-field-effect transistor is extended from the other end of said channel region of said current controlling junction-field-effect transistor, being constituted by a portion of said third semiconducting region extended to a surface region of said first semiconducting region;

(D) said conductive gate of said read-out transistor and said conductive gate of said switching transistor are connected to a first wiring for selecting semiconductor memory cells;

(E) said first conductive region is connected to a write-information setting line;

(F) said third conductive region is connected or contacted to said second semiconducting region;

(G) said second conductive region is connected a second wiring for selecting semiconductor memory cells; and (H) said other source/drain region of said current controlling junction-field-effect transistor is connected to a predetermined electric potential.

3. A semiconductor memory cell including a read-out transistor of a first conductivity type, a switching transistor of a second conductivity type, and a current controlling junction-field-effect transistor of the first conductivity type, said semiconductor memory cell comprising:

(a) a first semiconducting region of a first conductivity type;

(b) a first conductive region formed in a surface region of said first semiconducting region in contact with said first semiconducting region to form a rectifying junction in conjunction with said first semiconducting region;

(c) a second semiconducting region of a second conductivity type formed in a surface region of said first semiconducting region separated away from said first conductive region;

(d) a third semiconducting region of a first semiconducting region separated away from said first conductive region in contact with said second semiconducting region to form a rectifying junction in conjunction with said second semiconducting region;

(e) a third conductive region formed in a surface region of said third semiconducting region in contact with said third semiconducting region to form a rectifying junction in conjunction with said third semiconducting region, and extended to a surface region of said second semiconducting region; and (f) a conductive gate shared by said first read-out transistor of said first conductivity type and said switching transistor of said second conductivity type and provided on a barrier layer, said conductive gate serving as bridges between said first semiconducting region and said third semiconducting region as well as between said first conductive region and said second semiconducting region, wherein:

(A-1) source/drain regions of said read-out transistor are constituted by said third semiconducting region and a surface region of said first semiconducting region sandwiched by said first conductive region and said second semiconducting region;

(A-2) a channel forming region of said read-out transistor is constituted by a surface region of said second semiconducting region sandwiched by said third semiconducting region and said surface region of said first semiconducting region which is sandwiched by said first conductive region and said second semiconducting region;

(B-1) source/drain regions of said switching transistor are constituted by said first conductive region and said second semiconducting region;

(B-2) a channel forming region of said switching transistor is constituted by said surface region of said first semiconducting region sandwiched by said first conductive region and said second semiconducting region and used as one of said source/drain regions of said read-out transistor;

(C-1) gate regions of said current controlling junction-field-effect transistor are constituted by said third conductive region and a portion of said second semiconducting region facing said third conductive region;

(C-2) a channel region of said current controlling junction-field-effect transistor is constituted by a portion of said third semiconducting region sandwiched by said third conductive region and said second semiconducting region;

(C-3) one source/drain region of said current controlling junction-field-effect transistor is extended from one end of said channel region of said current controlling junction-field-effect transistor, being constituted by a portion of said third semiconducting region composing said source/drain region of said read-out transistor, and another source/drain region of said current controlling junction-field-effect transistor is extended from the other end of said channel region of said current controlling junction-field-effect transistor;

(D) said conductive gate of said read-out transistor and said conductive gate of said switching transistor are connected to a first wiring for selecting semiconductor memory cells;

(E) said first conductive region is connected to a write-information setting line; and (F) said other source/drain region of said current controlling junction-field-effect transistor is connected to a second wiring.

4. A semiconductor memory cell including a read-out transistor of a first conductivity type, a switching transistor of a second conductivity type, and a current controlling junction-field-effect transistor of the first conductivity type, said semiconductor memory cell comprising:

(a) a first semiconducting region of a first conductivity type;

(b) a first conductive region formed in a surface region of said first semiconducting region in contact with said first semiconducting region to form a rectifying junction in conjunction with said first semiconducting region;

(c) a second semiconducting region of a second conductivity type formed in a surface region of said first semiconducting region separated away from said first conductive region;

(d) a third semiconducting region of a first conductivity type formed in a surface region of said second semiconducting region separated away from said first conductive region in contact with said second semiconducting region to form a rectifying junction in conjunction with said second semiconducting region;

(e) a third conductive region formed in a surface region of said third semiconducting region in contact with said third semiconducting region to form a rectifying junction in conjunction with said third semiconducting region; and (f) a conductive gate shared by said first read-out transistor of said first conductivity type and said switching transistor of said second conductivity type and provided on a barrier layer, said conductive gate serving as bridges between said first semiconducting region and said third semiconducting region as well as between said first conductive region and said second semiconducting region, said conductive gate further extending over a part of said third semiconducting region on said barrier layer and bridging between said second semiconducting region and said third conductive region, wherein:
- (A-1) source/drain regions of said read-out transistor are constituted by said third semiconducting region and a surface region of said first semiconducting region sandwiched by said first conductive region and said second semiconducting region;
- (A-2) a channel forming region of said read-out transistor is constituted by a surface region of said second semiconducting region sandwiched by said third semiconducting region and said surface region of said first semiconducting region which is sandwiched by said first conductive region and said second semiconducting region;
- (B-1) source/drain regions of said switching transistor are constituted by said first conductive region and said second semiconducting region;
- (B-2) a channel forming region of said switching transistor is constituted by said surface region of said first semiconducting region sandwiched by said first conductive region and said second semiconducting region and used as one of said source/drain regions of said read-out transistor;
- (C-1) gate regions of said current controlling junction-field-effect transistor are constituted by said third conductive region and a portion of said second semiconducting region facing said third conductive region;
- (C-2) a channel region of said current controlling junction-field-effect transistor is constituted by a portion of said third semiconducting region sandwiched by said third conductive region and said second semiconducting region;
- (C-3) one source/drain region of said current controlling junction-field-effect transistor is extended from one end of said channel region of said current controlling junction-field-effect transistor, being constituted by a portion of said third semiconducting region composing said source/drain region of said read-out transistor, and another source/drain region of said current controlling junction-field-effect transistor is extended from the other end of said channel region of said current controlling junction-field-effect transistor;
- (D) said conductive gate of said read-out transistor and said conductive gate of said switching transistor are connected to a first wiring for selecting semiconductor memory cells;
- (E) said first conductive region is connected to a write-information setting line; and
- (F) said other source/drain region of said current controlling junction-field-effect transistor is connected to a second wiring.

5. A semiconductor memory cell including a read-out transistor of a first conductivity type, a switching transistor of a second conductivity type and a current controlling junction-field-effect transistor of a first conductivity type, said semiconductor memory cell comprising:
- (a) a first semiconducting region of a first conductivity type;
- (b) a first conductive region formed in a surface region of said first semiconducting region in contact with said first semiconducting region to form a rectifying junction in conjunction with said first semiconducting region;
- (c) a second semiconducting region of a second conductivity type formed in a surface region of said first semiconducting region separated away from said first conductive region;
- (d) a second conductive region formed in a surface region of said second semiconducting region in contact with said second semiconducting region to form a rectifying junction in conjunction with said second semiconducting region; and
- (e) a conductive gate shared by said first read-out transistor of said first conductivity type and said switching transistor of said second conductivity type and provided on a barrier layer, said conductive gate serving as bridges between said first semiconducting region and said second conductive region as well as between said first conductive region and said second semiconducting region, wherein:
- (A-1) source/drain regions of said read-out transistor are constituted by said second conductive region and a surface region of said first semiconducting region sandwiched by said first conductive region and said second semiconducting region;
- (A-2) a channel forming region of said read-out transistor is constituted by a surface region of said second semiconducting region sandwiched by said second conductive region and said surface region of said first semiconducting region which is sandwiched by said first conductive region and said second semiconducting region;
- (B-1) source/drain regions of said switching transistor are constituted by said first conductive region and said second semiconducting region;
- (B-2) a channel region of said switching transistor is constituted by said surface region of said first semiconducting region sandwiched by said first conductive region and said second semiconducting region and used as one of said source/drain regions of said read-out transistor;
- (C-1) gate regions of said current controlling junction-field-effect transistor are constituted by said first conductive region and a portion of said second semiconducting region facing said first conductive region;
- (C-2) one source/drain region of said current controlling junction-field-effect transistor is constituted by said surface region of said first semiconducting region sandwiched by said first conductive region and said second semiconducting region and used as one of said source/drain regions of said read-out transistor as well as used as said channel region of said switching transistor;
- (C-3) a channel region of said current controlling junction-field-effect transistor is constituted by a portion of said first semiconducting region beneath said source/drain region of said current controlling junction-field-effect transistor sandwiched by said first conductive region and said second semiconducting region;
- (C-4) another source/drain region of said current controlling junction-field-effect transistor is constituted by a portion of said first semiconducting region beneath said channel region of said current controlling junction-field-effect transistor sandwiched by said first conductive region and said second semiconducting region;
- (D) said conductive gate is connected to a first wiring for selecting semiconductor memory cells;
- (E) said first conductive region is connected to a write-information setting line;

(F) said second conductive region is connected to a second wiring for selecting semiconductor memory cells; and (G) said other source/drain region of said current controlling junction-field-effect transistor is connected to a predetermined electric potential.

6. A semiconductor memory cell according to any one of claims 1 to 5, wherein a highly doped layer of a first conductivity type is formed beneath said first semiconducting region.

7. A semiconductor memory cell according to any one of claims 1 to 5, wherein said cell is formed in a well structure of a first conductivity type.

8. A semiconductor memory cell according to any one of claims 1 to 5, wherein said cell is formed on an insulating material.

9. A semiconductor memory cell according to any one of claims 1 to 5, wherein (a) said conductive gate is connected to a first wiring for selecting semiconductor memory cells;

(b) said first conductive region is connected to a first predetermined electric potential;

(c) said second conductive region is connected a second predetermined electric potential; and (d) said other source/drain region of said current controlling junction-field-effect transistor is connected to a second wiring for selecting semiconductor memory cells.

10. A semiconductor memory cell according to claim 9, wherein a highly doped layer of a first conductivity type is formed beneath said first semiconducting region.

11. A semiconductor memory cell according to claim 9, wherein said cell is formed in a well structure of a first conductivity type.

12. A semiconductor memory cell according to claim 9, wherein said cell is formed on an insulating material.

* * * * *